(12) United States Patent
Yamazaki et al.

(10) Patent No.: US 7,816,234 B2
(45) Date of Patent: Oct. 19, 2010

(54) METHOD FOR MANUFACTURING SEMICONDUCTOR DEVICE

(75) Inventors: Shunpei Yamazaki, Tokyo (JP); Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 169 days.

(21) Appl. No.: 12/262,753

(22) Filed: Oct. 31, 2008

(65) Prior Publication Data

US 2009/0117704 A1 May 7, 2009

(30) Foreign Application Priority Data

Nov. 5, 2007 (JP) ............................. 2007-286977

(51) Int. Cl.
  *H01L 21/302* (2006.01)
  *H01L 21/322* (2006.01)
(52) U.S. Cl. ..................... 438/459; 438/479; 438/166; 257/E21.415; 257/E21.122
(58) Field of Classification Search ................ 438/166, 438/479, 459, FOR. 201, FOR. 485; 257/E21.415, 257/E21.122; 148/DIG. 12
See application file for complete search history.

(56) References Cited

U.S. PATENT DOCUMENTS

| | | | |
|---|---|---|---|
| 4,584,025 A * | 4/1986 | Takaoka et al. ............. 438/311 |
| 5,374,564 A | 12/1994 | Bruel | |
| 5,395,481 A * | 3/1995 | McCarthy ................... 438/479 |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,372,609 B1 | 4/2002 | Aga et al. | |
| 6,380,046 B1 * | 4/2002 | Yamazaki ................... 438/409 |
| 6,388,652 B1 | 5/2002 | Yamazaki et al. | |
| 6,534,380 B1 | 3/2003 | Yamauchi et al. | |
| 6,686,623 B2 | 2/2004 | Yamazaki | |
| 6,818,529 B2 | 11/2004 | Bachrach et al. | |
| 7,119,365 B2 | 10/2006 | Takafuji et al. | |
| RE39,484 E | 2/2007 | Bruel | |
| 2007/0063281 A1 | 3/2007 | Takafuji et al. | |
| 2008/0286952 A1 | 11/2008 | Miyairi et al. | |
| 2009/0098710 A1 | 4/2009 | Yamazaki | |
| 2009/0111244 A1 | 4/2009 | Yamazaki et al. | |

(Continued)

FOREIGN PATENT DOCUMENTS

JP            05-211128          8/1993

(Continued)

*Primary Examiner*—George Fourson
(74) *Attorney, Agent, or Firm*—Fish & Richardson P.C.

(57) ABSTRACT

As a base substrate, a substrate having an insulating surface such as a glass substrate is used. Then, a single crystal semiconductor layer is formed over the base substrate with the use of a large-sized semiconductor substrate. Note that, it is preferable that the base substrate be provided with a plurality of single crystal semiconductor layers. After that, the single crystal semiconductor layers are cut to divide the single crystal semiconductor layers into a plurality of single crystal semiconductor regions by patterning. Next, the single crystal semiconductor regions are irradiated with laser light or heat treatment is performed on the single crystal semiconductor regions in order to improve the planarity of surfaces and reduce defects. Peripheral portions of the single crystal semiconductor regions are not used as semiconductor elements, and central portions of the single crystal semiconductor regions are used as the semiconductor elements.

20 Claims, 27 Drawing Sheets

U.S. PATENT DOCUMENTS

2009/0115028 A1* 5/2009 Shimomura et al. ......... 257/623
2009/0117692 A1* 5/2009 Koyama et al. ............. 438/164

FOREIGN PATENT DOCUMENTS

| | | |
|---|---|---|
| JP | 11-097379 | 4/1999 |
| JP | 11-163363 | 6/1999 |
| JP | 2000-012864 | 1/2000 |
| JP | 2000-150905 | 5/2000 |
| JP | 2004-087606 | 3/2004 |
| JP | 2005-252244 | 9/2005 |
| JP | 2009135472 A * | 6/2009 |

* cited by examiner

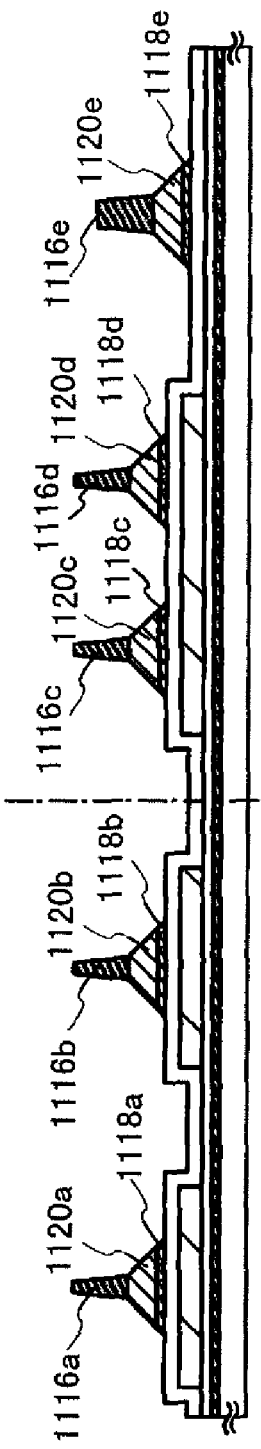
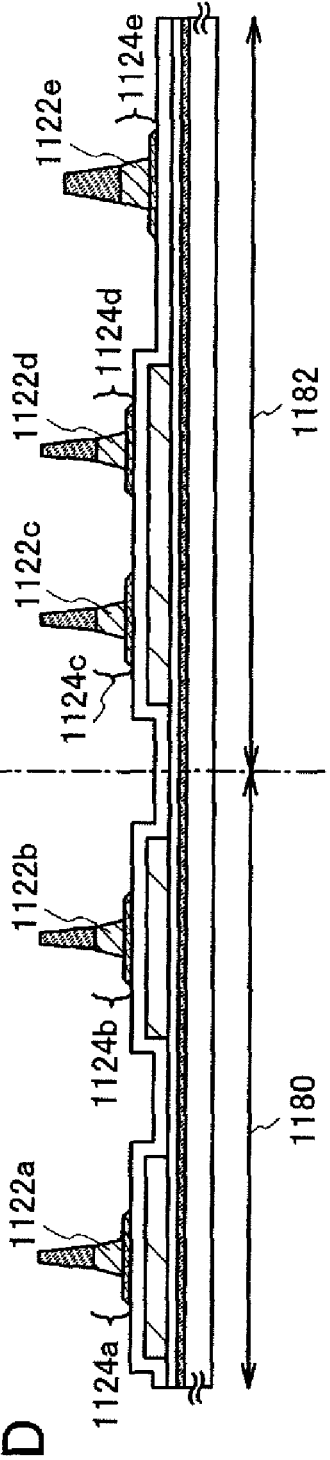

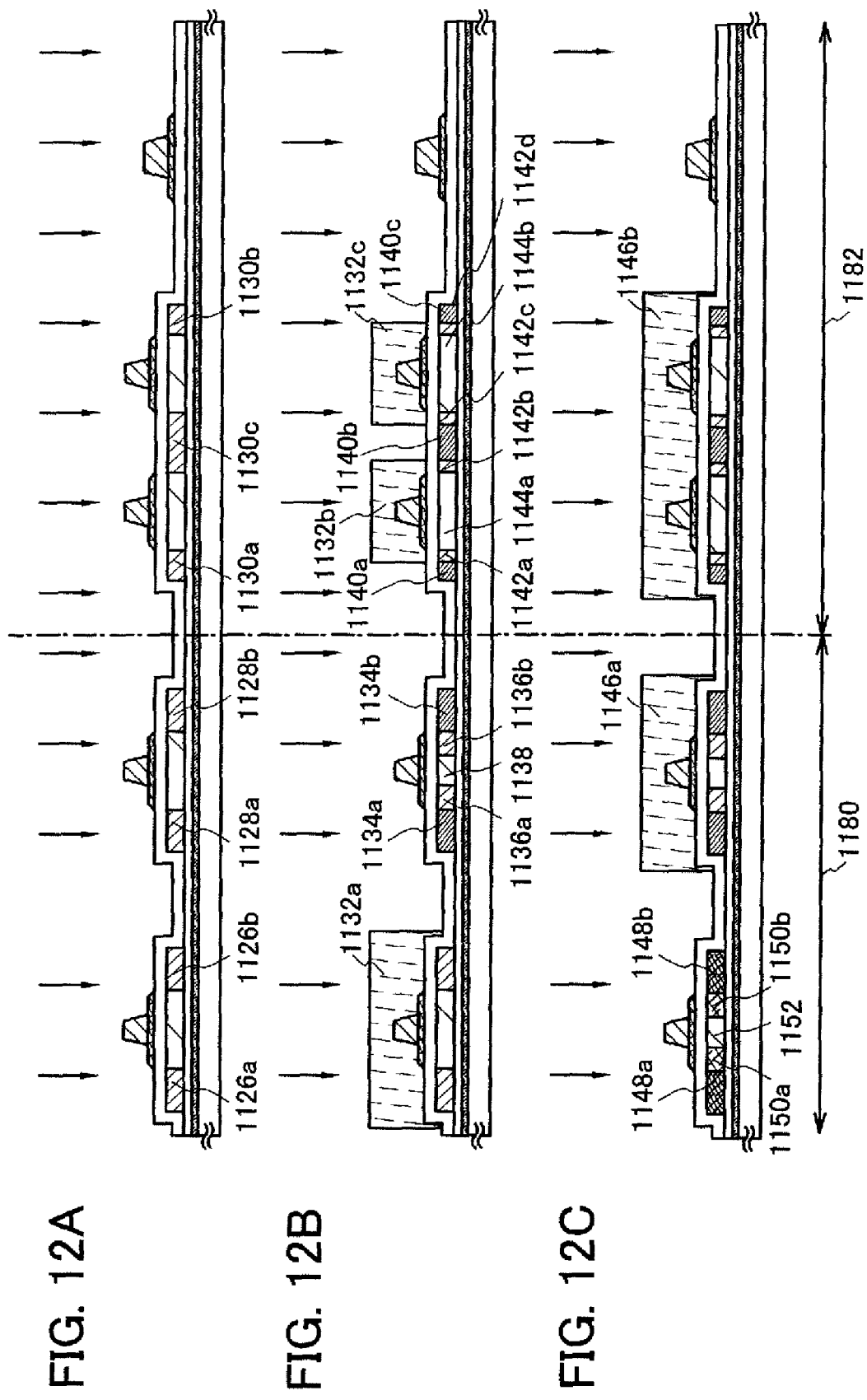

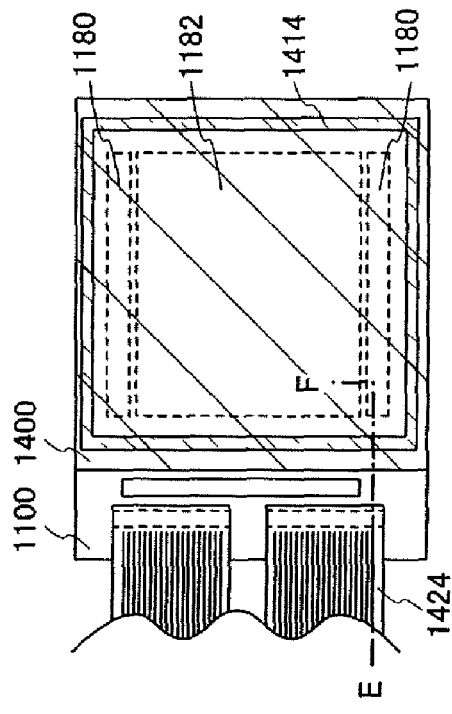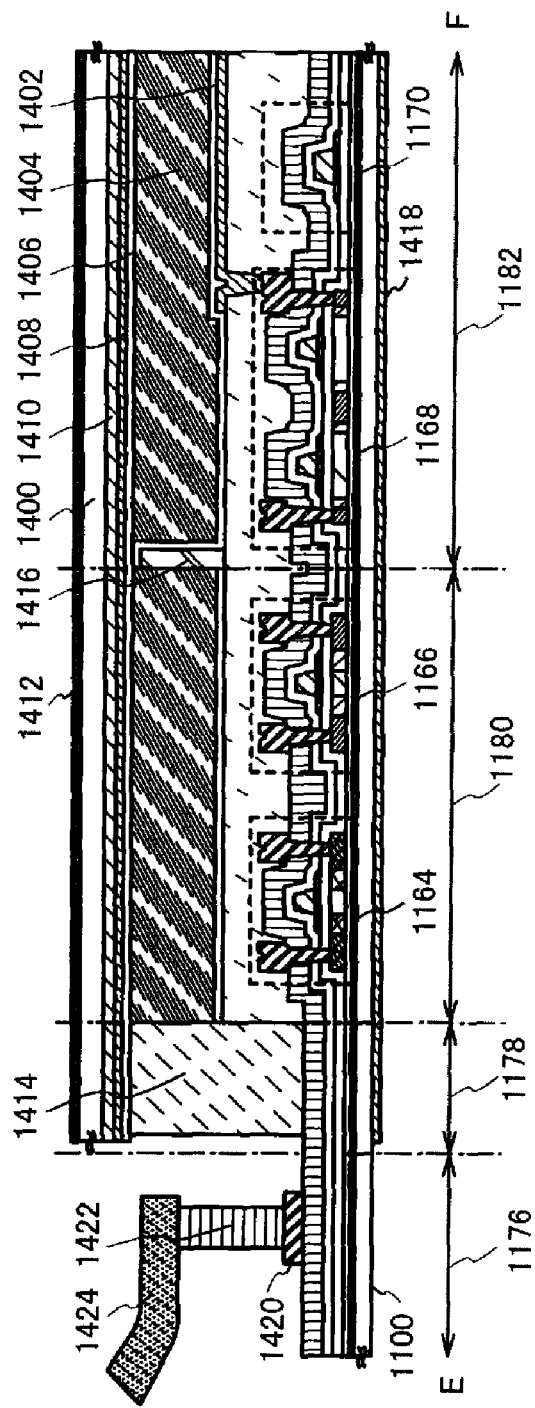
FIG. 14A
FIG. 14B

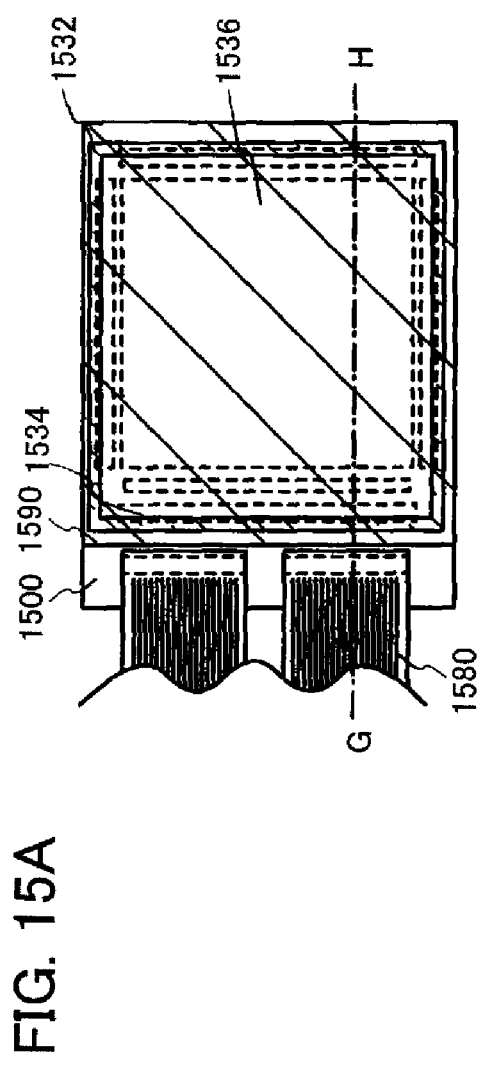
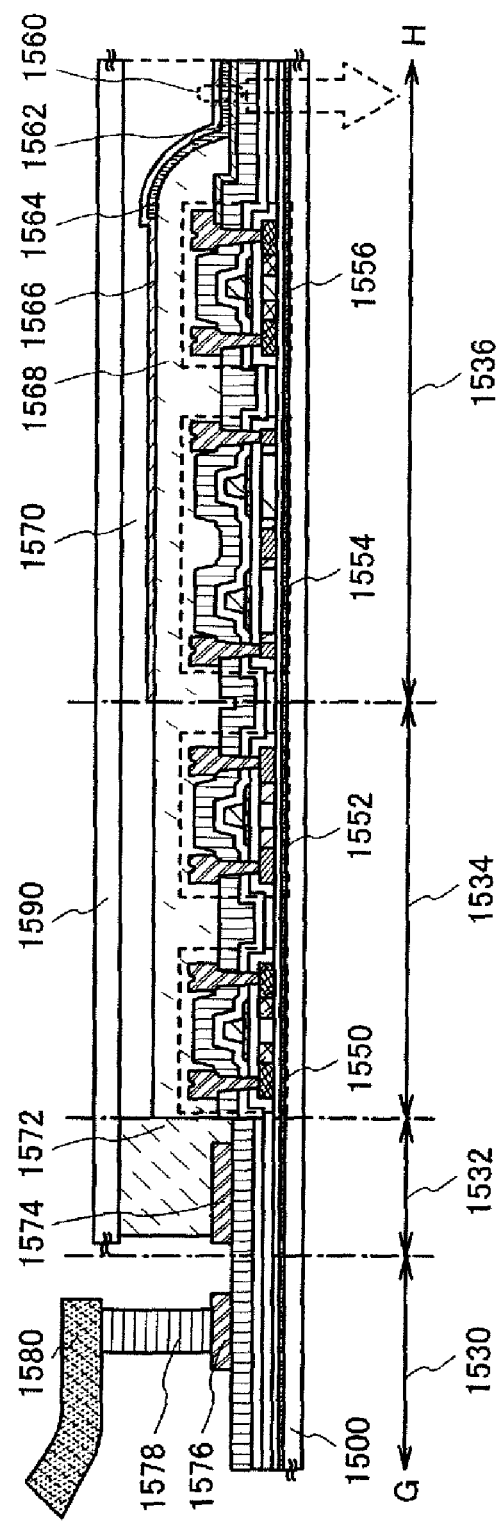
FIG. 15A
FIG. 15B

| Acceleration Voltage | Hydrogen Element Ratio (X:Y) | Hydrogen Ion Species Ratio (X:Y/3) |
|---|---|---|
| 80kV | 01:44.1 | 01:14.7 |
| 60kV | 01:42.5 | 01:14.2 |
| 40kV | 01:43.5 | 01:14.5 |

METHOD FOR MANUFACTURING SEMICONDUCTOR DEVICE

BACKGROUND OF THE INVENTION

1. Field of the Invention

The present invention relates to a semiconductor device having an SOI (silicon on insulator) structure and a manufacturing method thereof. In this specification, a semiconductor device means any device capable of functioning with the use of semiconductor characteristics.

2. Description of the Related Art

In recent years, LSI technology has been drastically progressed, and an SOI structure by which speeding up and low power consumption are realized has been attracted attention. In this technology, an active region (a channel formation region) of a field effect transistor (FET), which has been conventionally formed of a bulk single crystal silicon, is formed of a single crystal silicon thin film. It is known that a MOS field-effect transistor manufactured using an SOI structure has lower parasitic capacitance than that manufactured using a conventional bulk single crystal silicon substrate, which is an advantage in increasing speed.

As a substrate having an SOI structure (hereinafter also referred to as an "SOI substrate"), an SIMOX substrate, a bonded substrate, and the like are known. For example, an SIMOX substrate obtains an SOI structure as follows: oxygen ions are implanted into a single crystal silicon substrate, and heat treatment is performed at 1300° C. or higher to form a buried oxide (BOX) layer, so that a single crystal silicon thin film is formed over a surface of the SIMOX substrate. As for the SIMOX substrate, since oxygen ion implantation can be controlled precisely, a single crystal silicon thin film having a uniform thickness can be formed with good controllability. However, since it is necessary to take a long time for the oxygen ion implantation, there are problems in the time and the cost. Further, there is another problem in that the single crystal silicon thin film gets damaged easily during the oxygen ion implantation.

A bonded substrate obtains an SOI structure as follows: two single crystal silicon substrates (a base substrate and a bond substrate) are bonded to each other with an oxide film interposed therebetween, and one of the two single crystal silicon substrates (the bond substrate) is ground and polished on its rear side (which is not a surface to be bonded) to be thinned, so that a single crystal silicon thin film is formed. It is difficult to form a uniform and thin single crystal silicon thin film by grinding and polishing. Thus, as a thin film technology, Smart-Cut (registered trademark) employing hydrogen ion implantation (e.g., Reference 1: Japanese Published Patent Application No. H5-211128) is also proposed.

SUMMARY OF THE INVENTION

A large-area SOI substrate is required to improve the productivity of a semiconductor device using an SOI substrate and to provide large-sized semiconductor devices. However, it has been difficult to provide a large-area SOI substrate since a single crystal silicon wafer is used as a base substrate in the conventional SOI substrate. In view of the problem, an object of the present invention is to provide a large-area semiconductor substrate (SOI substrate). Another object of the present invention is to solve problems caused when an area of a semiconductor substrate is increased. Another object of the present invention is to improve the reliability of a semiconductor device using the above-described semiconductor substrate.

In the present invention, a single crystal semiconductor layer, which is larger than a diagonal dimension of a screen of a display device to be manufactured, is provided over a base substrate with an insulating layer interposed therebetween, and an element such as a transistor, which is included in a display device, is formed of the single crystal semiconductor layer. The insulating layer, which is bonded to the base substrate, is left at a region where the elements are formed together with the single crystal semiconductor layer. That is, the following is the gist of the present invention: a single crystal semiconductor layer is provided over a base substrate with an insulating layer interposed therebetween and the insulating layer is left with the use of an internal region of the single crystal semiconductor layer, so that a display device is manufactured.

In the present invention, a substrate having an insulating surface such as a glass substrate is used as a base substrate in order to increase an area of an SOI substrate (hereinafter also simply referred to as a "semiconductor substrate"). In addition, a semiconductor substrate having a structure in which a single crystal semiconductor layer is provided over the base substrate. Note that the base substrate is preferably provided with a plurality of single crystal semiconductor layers. Here, the single crystal semiconductor layer has a relatively large size. Specifically, a rectangular single crystal semiconductor substrate of which the length of a diagonal line is 6 inches (150 mm) or longer (preferably, 10 inches (250 mm) or longer) is used for forming the above-described single crystal semiconductor layer. That is, the single crystal semiconductor layer also has a rectangular shape of which the length of a diagonal line is 6 inches (150 mm) or longer (preferably, 10 inches (250 mm) or longer). The rectangular single crystal semiconductor substrate can be formed by processing a circular single crystal semiconductor substrate which has a diameter of 8 inches (200 mm) or longer (preferably, 12 inches (300 mm) or longer).

Immediately after the single crystal semiconductor layer is formed over the base substrate, surface unevenness of the single crystal semiconductor layer is large, and there are lots of defects in the single crystal semiconductor layer. While, as an example of a method for solving these problems, grinding and polishing (e.g., chemical mechanical polishing (CMP)) is given, the grinding and polishing method is not suitable for the large-area substrate. Thus, in the present invention, a single crystal semiconductor layer is irradiated with laser light in order to improve the planarity of a surface of the single crystal semiconductor layer and to reduce defects in the single crystal semiconductor layer. Alternatively, heat treatment may be performed using a rapid thermal annealing (RTA) method, instead of laser light irradiation treatment. The laser light irradiation treatment and the heat treatment can be combined.

As described above, in the case where the heat treatment and the laser light irradiation treatment are performed on the single crystal semiconductor layer, there is a problem in that defects at a bonding interface is increased due to thermal stress which is generated by difference in a thermal expansion coefficient between the base substrate and the single crystal semiconductor layer. In addition, there is another problem in that a film is peeled off due to thermal stress. When a larger-sized single crystal semiconductor layer is formed as in the present invention, these problems become more serious. Thus, in the present invention, before the laser light irradiation treatment or the heat treatment, the single crystal semiconductor layer is patterned. More specifically, the single crystal semiconductor layer is cut to divide the single crystal semiconductor layer into a plurality of single crystal semiconductor regions that has an area larger than or equal to a certain area and smaller than or equal to a certain area by patterning. In this case, an insulating layer, which is formed as a base layer of the single crystal semiconductor layer, is preferably left without being patterned.

By irradiating the single crystal semiconductor regions with laser light, semiconductor characteristics (e.g., the planarity) are deteriorated at peripheries (end portions) of the single crystal semiconductor regions. Thus, a semiconductor element (e.g., a transistor) is preferably formed without using a portion of which the semiconductor characteristics are deteriorated. Specifically, with respect to a side length La of the semiconductor region, regions corresponding to both end portions each having a length Lb are removed, and a semiconductor element is manufactured using a region that is left. Here, it is preferable that Lb be greater than or equal to 10% and less than or equal to 20% of La.

One aspect of a method for manufacturing a semiconductor device according to the present invention includes the steps of irradiating a main surface of a single crystal semiconductor substrate with ions in order to form a damaged region in the single crystal semiconductor substrate, forming a first insulating layer over the main surface of the single crystal semiconductor substrate, forming a second insulating layer serving as a bonding layer over a surface of the first insulating layer, bonding the second insulating layer to a substrate having an insulating surface, separating the single crystal semiconductor substrate at the damaged region in order to form a single crystal semiconductor layer over the substrate having the insulating surface, patterning the single crystal semiconductor layer to be separated into a plurality of single crystal semiconductor regions, and performing laser light irradiation treatment or heat treatment on the plurality of single crystal semiconductor regions.

Another aspect of a method for manufacturing a semiconductor device according to the present invention includes the steps of irradiating main surfaces of a plurality of single crystal semiconductor substrates with ions in order to form damaged regions in the plurality of single crystal semiconductor substrates, forming first insulating layers over the main surfaces of the plurality of single crystal semiconductor substrates, forming second insulating layers serving as bonding layers over surfaces of the first insulating layers, bonding the second insulating layers to a substrate having an insulating surface, separating the plurality of single crystal semiconductor substrates at the damaged regions in order to form a plurality of single crystal semiconductor layers over the substrate having the insulating surface, patterning each of the plurality of single crystal semiconductor layers to be separated into a plurality of single crystal semiconductor regions, and performing laser light irradiation treatment or heat treatment on the plurality of single crystal semiconductor regions.

In the above, it is preferable that the first insulating layer contains any one of silicon oxide, silicon nitride, silicon oxynitride, or silicon nitride oxide. Further, the first insulating layer may have a stacked-layer structure. For example, the first insulating layer has a stacked-layer structure of silicon oxide or silicon oxynitride and silicon nitride or silicon nitride oxide, which are stacked in this order over the main surface side of the single crystal semiconductor substrate.

In the above, it is preferable that the single crystal semiconductor layer is patterned so as to leave the first insulating layer. Further, each of areas of the plurality of single crystal semiconductor regions has an area sufficient to manufacture approximately 1 to $10^4$ pieces of semiconductor elements (e.g., transistors). Specifically, for example, the area may be larger than or equal to 1 $mm^2$ and smaller than or equal to 10000 $mm^2$ (preferably, larger than or equal to 25 $mm^2$ and smaller than or equal to 2500 $mm^2$; more preferably, larger than or equal to 100 $mm^2$ and smaller than or equal to 150 $mm^2$). Furthermore, 10% to 20% of an entire side length of each of rectangular single crystal semiconductor regions is removed from both end portions, and semiconductor elements are manufactured using regions which are left (i.e., central portions).

In the above, the second insulating layer can be formed, for example, using an organosilane gas by a chemical vapor deposition method. Further, it is preferable that a rectangular single crystal semiconductor substrate, which is processed from a circular single crystal semiconductor substrate with a diameter of 300 mm (12 inches) or longer into a rectangular shape, is used as the single crystal semiconductor substrate. More specifically, the length of a diagonal line is approximately 250 mm or longer.

Through the above-described methods for manufacturing a semiconductor device, various semiconductor devices can be manufactured. Further, various electronic devices can be provided using the semiconductor device.

In the above description, the term "single crystal semiconductor" means a semiconductor which is formed so as to have a regular crystal structure and of which crystal axes of all portions are oriented in the same direction. That is, it is not a matter of how many defects there are.

According to the present invention, a semiconductor substrate can have a large area. That is, a large-sized semiconductor device can be provided. In addition, by increasing the size of the semiconductor substrate, the productivity of the semiconductor device can be improved. Further, by irradiating a single crystal semiconductor layer with laser light, the planarity of a surface of the single crystal semiconductor layer is improved and defects are reduced. In the case where heat treatment is performed, fine defects that cannot be repaired by laser light irradiation can be repaired.

In addition, the single crystal semiconductor layer is patterned before laser light irradiation treatment or heat treatment, whereby problems of the increase in defects due to thermal stress and the film peeling due to thermal stress can be solved. In the patterning, an insulating layer, which is formed as a base layer of the single crystal semiconductor layer, is left, and thus contaminants (impurity elements and the like) can be prevented from penetrating the semiconductor layer from the base substrate, and whereby the reliability of the semiconductor device can be improved. A region of which semiconductor characteristics are deteriorated by laser light irradiation treatment and heat treatment is not used, whereby characteristics of a semiconductor element can be improved and an excellent semiconductor device can be provided.

BRIEF DESCRIPTION OF THE DRAWINGS

FIGS. 11A to 11D illustrate a manufacturing process of a semiconductor device;

FIGS. 12A to 12C illustrate a manufacturing process of a semiconductor device;

FIGS. 14A and 14B are a plan view and a cross-sectional view of a semiconductor device, respectively;

FIGS. 15A and 15B are a plan view and a cross-sectional view of a semiconductor device, respectively;

FIG. 27 is a list illustrating fitting parameter ratios (hydrogen element ratios and hydrogen ion species ratios).

DETAILED DESCRIPTION OF THE INVENTION

Embodiment Mode

Figure 1B:
FIGS. 1A to 1G illustrate a method for manufacturing a semiconductor substrate.

The present invention is hereinafter described. The present invention can be implemented in a variety of different modes, and it is to be easily understood by those skilled in the art that various changes and modifications can be made without any departure from the spirit and scope of the present invention. Therefore, the present invention should not be construed as being limited to the description of the embodiment modes and embodiments. Further, the same reference numeral in different drawings represents the same component, and repeated description of a material, a shape, a manufacturing method, or the like is omitted.

Embodiment Mode 1

This embodiment mode describes an example of a method for manufacturing a semiconductor device of the present invention.

First, a method for manufacturing a semiconductor substrate (an SOI substrate) used for a semiconductor device is described with reference to FIGS. 1A to 1G, FIG. 2, and FIGS. 3A to 3C.

Figure 1A:
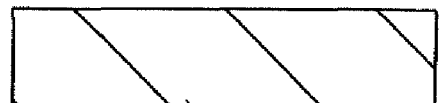

First, a base substrate 100 is prepared (see FIG. 1A). As the base substrate 100, a light-transmitting glass substrate used for liquid crystal display devices or the like can be used. As a glass substrate, a substrate having a distortion point of higher than or equal to 580° C. and lower than or equal to 680° C. (preferably, higher than or equal to 600° C. and lower than or equal to 680° C.) may be used; however, the present invention is not limited to the glass substrate. As a material of a glass substrate, for example, a glass material such as aluminosilicate glass, aluminoborosilicate glass, or barium borosilicate glass is used.

As the base substrate 100, as well as the glass substrate, an insulating substrate which is formed of an insulating material such as a ceramic substrate, a quartz substrate, or a sapphire substrate; a conductive substrate which is formed of a conductive material such as metal or stainless steel; or the like can be used.

An insulating layer may be formed over a surface of the base substrate 100. As a material of the insulating layer, an insulating material containing silicon or germanium such as silicon oxide, silicon nitride, silicon oxynitride, silicon nitride oxide, germanium oxide, germanium nitride, germanium oxynitride, or germanium nitride oxide as its composition can be used. In addition, metal oxide such as aluminum oxide, tantalum oxide, or hafnium oxide; metal nitride such as aluminum nitride; metal oxynitride such as aluminum oxynitride; or metal nitride oxide such as aluminum nitride oxide can also be used.

In this specification, the term "oxynitride" means a substance which has a larger number of oxygen atoms than that of nitrogen atoms. For example, the term "silicon oxynitride" means a substance which contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, the term "nitride oxide" means a substance which has a larger number of nitrogen atoms than that of oxygen atoms. For example, the term "silicon nitride oxide" means a substance which contains oxygen, nitrogen, silicon, and hydrogen at concentrations ranging from 5 at. % to 30 at. %, 20 at. % to 55 at. %, 25 at. % to 35 at. %, and 10 at. % to 25 at. %, respectively. Note that percentages of oxygen, nitrogen, silicon, and hydrogen fall within the above-described ranges in the case where measurements are performed by rutherford backscattering spectrometry (RBS) and hydrogen forward scattering (HFS). Furthermore, the total of the percentages of the constituent elements does not exceed 100 at. %.

Figure 2:
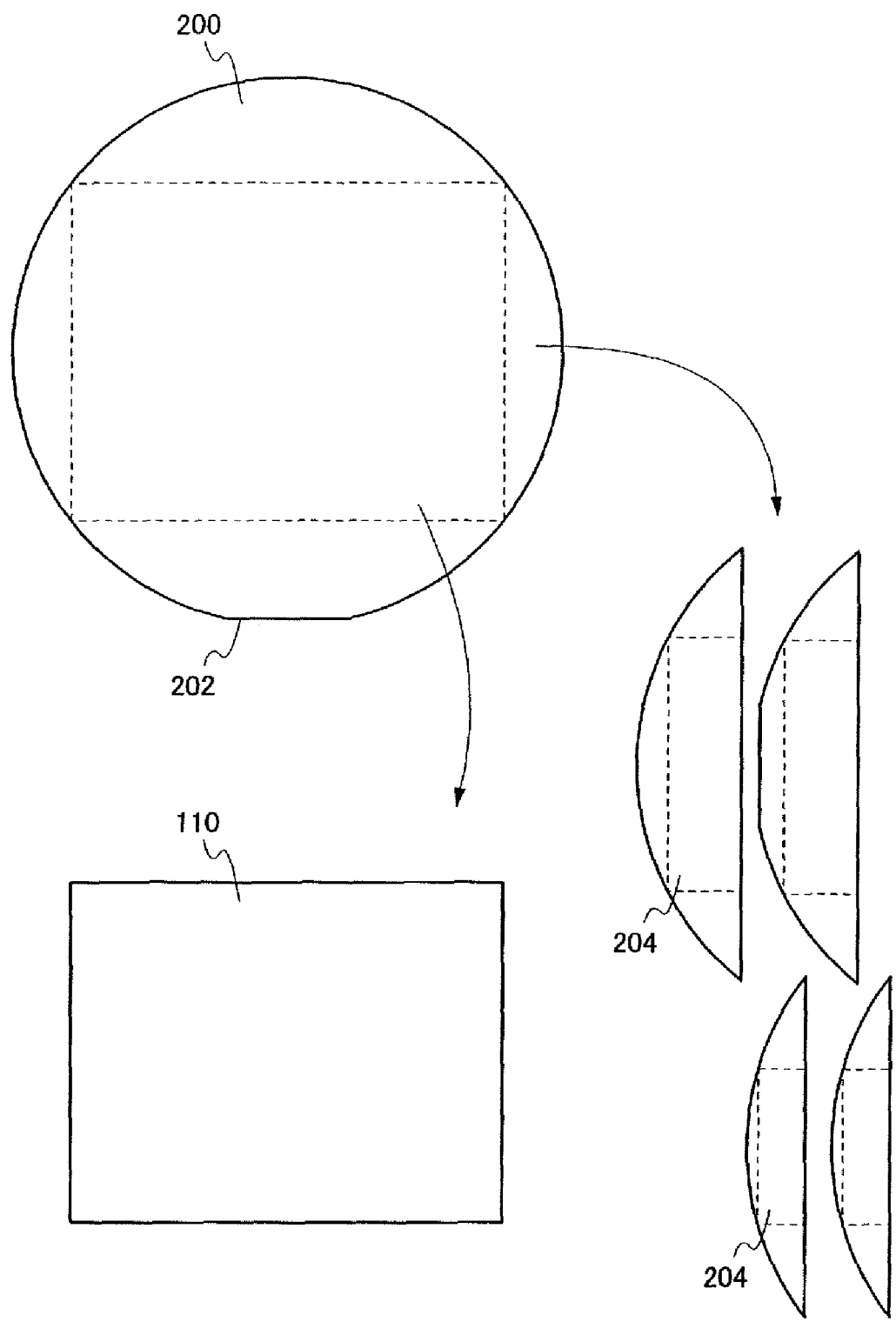
FIG. 2 illustrates processing of a semiconductor substrate.

Next, a semiconductor substrate 110 is prepared (see FIG. 1B). Here, FIG. 1B is a cross-sectional view of the semiconductor substrate 110. A semiconductor substrate is manufactured by bonding a semiconductor layer, which is obtained by thinning the semiconductor substrate 110, to the base substrate 100. As the semiconductor substrate 110, a single crystal semiconductor substrate is preferably used, and a polycrystalline semiconductor substrate can also be used. In addition, a semiconductor substrate formed of an element belonging to Group 14 of the periodic table such as silicon, germanium, silicon-germanium, or silicon carbide can also be used. A semiconductor substrate formed of a compound semiconductor such as gallium arsenide or indium phosphide can also be used. In this embodiment mode, a single crystal silicon substrate is used as the semiconductor substrate 110. Although there is not a limitation to the size of the semiconductor substrate 110, a circular semiconductor substrate with 8 inches (200 mm) or longer (e.g., 12 inches (300 mm), 18 inches (450 mm), or the like) is preferably processed into a rectangular shape. FIG. 2 illustrates that a circular semiconductor substrate 200 is processed into the rectangular semiconductor substrate 110. Here, although the circular semiconductor substrate 200 has a flat 202, there is not a specific limitation to a plane orientation and a direction of a crystal axis of a semiconductor layer in the present invention.

In the case where the circular semiconductor substrate 200 is processed into a rectangular shape, the semiconductor substrate 110 is preferably cut out such that the length of a diagonal line of the rectangular semiconductor substrate 110 is the same as or substantially the same as a diameter of the circular semiconductor substrate 200. This manner makes it possible to maximize the use of the circular semiconductor substrate 200. For example, from a circular semiconductor substrate with a diameter of 8 inches (200 mm), a rectangular semiconductor substrate with a diagonal length of longer than or equal to 6 inches (150 mm) and shorter than or equal to 8 inches can be manufactured. In addition, from a circular semiconductor substrate with a diameter of 12 inches (300 mm), a rectangular semiconductor substrate with a diagonal length of longer than or equal to 10 inches (250 mm) and shorter than or equal to 12 inches can be manufactured. When the larger size of the circular semiconductor substrate 200 is used, the larger region cannot be used as the semiconductor substrate 110. Since disposal of the region, which cannot be used as the semiconductor substrate 110, is not preferable in light of the cost, the region, which cannot be used as the semiconductor substrate 110, is preferably reused by processing the region into a semiconductor substrate 204 or the like.

In a subsequent process, the base substrate 100 and a plurality of semiconductor substrates 110 are bonded to each other. Thus, the following process may be performed multiple times or a plurality of following processes may be performed at the same time, so that the plurality of semiconductor substrates 110 is prepared. Although this embodiment mode describes a structure in which the semiconductor substrate 110 is processed after the base substrate 100 is prepared for convenience, the present invention should not be construed as being limited to the order.

Figure 1C:
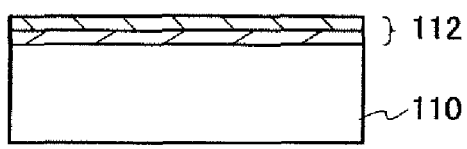

An insulating layer 112 is formed over a surface of the semiconductor substrate 110 after the semiconductor substrate 110 is cleaned (see FIG. 1C). The insulating layer 112 can have a single-layer structure or a multilayer structure including two or more layers. The thickness of the insulating layer 112 is preferably greater than or equal to 10 nm and less than or equal to 400 nm.

As a material contained in the insulating layer 112, an insulating material containing silicon or germanium as its composition such as silicon oxide, silicon nitride, silicon oxynitride, silicon nitride oxide, germanium oxide, germanium nitride, germanium oxynitride, or germanium nitride oxide can be used. In addition, a metal oxide such as aluminum oxide, tantalum oxide, or hafnium oxide; a metal nitride such as aluminum nitride; a metal oxynitride such as aluminum oxynitride; or a metal nitride oxide such as aluminum nitride oxide can also be used.

As an example of a method for forming the insulating layer 112, a CVD method, a sputtering method, a method using oxidation (or nitridation) of the semiconductor substrate 110, or the like can be given.

In the case of using a substrate containing an impurity which may reduce the reliability of a semiconductor device such as an alkali metal or an alkaline earth metal as the base substrate 100, at least one layer or more layers which can prevent such an impurity from diffusing from the base substrate 100 into a semiconductor layer are preferably provided. As a material of such a layer, silicon nitride, silicon nitride oxide, aluminum nitride, aluminum nitride oxide, or the like can be used. By using such a material, the insulating layer 112 can serve as a barrier layer.

For example, in the case where the insulating layer 112 is formed as a barrier layer having a single-layer structure, an insulating layer containing silicon nitride, silicon nitride oxide, aluminum nitride, or aluminum nitride oxide may be formed to have a thickness of greater than or equal to 10 nm and less than or equal to 200 nm.

Further, in the case where the insulating layer 112 serving as a barrier layer has a two-layer structure, for example, a stacked-layer structure which includes silicon oxide and silicon nitride, a stacked-layer structure which includes silicon oxynitride and silicon nitride, a stacked-layer structure which includes silicon oxide and silicon nitride oxide, a stacked-layer structure which includes silicon oxynitride and silicon nitride oxide, or the like can be employed. In this case, a layer containing silicon oxide or silicon oxynitride is provided so as to be in contact with the semiconductor substrate 110. By doing so, an internal stress of a layer containing materials having a high blocking effect (silicon nitride or silicon nitride oxide) can be prevented from affecting a semiconductor layer. Here, each layer can have a thickness of greater than or equal to 10 nm and less than or equal to 200 nm.

In this embodiment mode, a two-layer structure including a layer containing silicon oxynitride which is formed by a plasma CVD method using $SiH_4$ and $N_2O$ as a process gas as a layer which is in contact with the semiconductor substrate 110 and a layer containing silicon nitride oxide which is formed by a plasma CVD method using $SiH_4$ and $NH_3$ as a process gas as a layer having a high blocking effect.

Figure 1D:
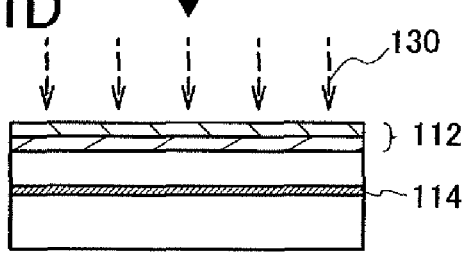

Next, the semiconductor substrate 110 is irradiated with an ion beam 130 including ions accelerated by an electric field through the insulating layer 112, thereby forming a damaged region 114 in a region at a predetermined depth from the surface of the semiconductor substrate 110 (see FIG. 1D). The insulating layer 112 is formed before the ion beam irradiation so that the semiconductor substrate 110 can be prevented from being contaminated during the ion irradiation and can also be prevented from being damaged by impact of ions used for the irradiation. The depth of the region where the damaged region 114 is formed can be controlled by the accelerating energy of the ion beam 130 and the incidence angle thereof. That is, the damaged region 114 is formed in a region at a depth, which is the same as or substantially the same as the average penetration depth of ions.

The thickness of the semiconductor layer which is separated from the semiconductor substrate 110 is determined in accordance with the depth where the damaged region 114 is formed. The depth where the damaged region 114 is formed is greater than or equal to 50 nm and less than or equal to 500 nm from the surface of the semiconductor substrate 110, and is preferably greater than or equal to 50 nm and less than or equal to 200 nm.

When the semiconductor substrate 110 is irradiated with ions, an ion implantation apparatus or an ion doping apparatus can be used. In an ion implantation apparatus, a source gas is excited to produce ion species, the produced ion species are mass-separated, and the ion species having a predetermined mass are implanted into the object. In an ion doping apparatus, a process gas is excited to produce ion species and the object is irradiated with the produced ion species which are not mass-separated. In an ion doping apparatus provided with a mass separator, ion irradiation with mass separation can be performed similarly to the ion implantation apparatus.

In the case of using an ion doping apparatus, an ion irradiation step can be performed, for example, under the following conditions:

Accelerating Voltage: greater than or equal to 10 kV and less than or equal to 100 kV (preferably, greater than or equal to 30 kV and less than or equal to 80 kV);

Dosage: greater than or equal to $1\times10^{16}$ ions/cm$^2$ and less than or equal to $4\times10^{16}$ ions/cm$^2$; and Beam Current Density: greater than or equal to 2 µA/cm$^2$ (preferably, greater than or equal to 5 µA/cm$^2$, and more preferably, greater than or equal to 10 µA/cm$^2$).

In the case of using an ion doping apparatus, a gas containing hydrogen can be used as a source gas for an ion irradiation step. With the gas containing hydrogen, H$^+$, H$_2^+$, and H$_3^+$ can be produced as ion species. In the case where the gas containing hydrogen is used as a source gas, it is preferable that a large amount of H$_3^+$ be implanted. By implanting a large amount of H$_3^+$ ions, efficiency of the ion irradiation can be improved compared to the ion implantation of H$^+$ and H$_2^+$. That is, the time needed for the ion irradiation can be reduced. Further, separation can be more easily performed at the damaged region 114. In addition, by using H$_3^+$, the average penetration depth of ions can be shallower. Thus, the damaged region 114 can be formed in a shallower region.

In the case of using an ion implantation apparatus, it is preferable that mass separation be performed so as to implant H$_3^+$ ions. Of course, H$_2^+$ ions may be implanted. Note that, in the case of using an ion implantation apparatus, efficiency of the ion irradiation may be reduced compared to the case of using an ion doping apparatus. This is because ion species are selectively implanted.

In the case of using an ion doping apparatus, the proportion of H$_3^+$ ions which are included in the ion beam 130 is preferably 70% or higher with respect to the total amount of H$^+$, H$_2^+$, and H$_3^+$; more preferably, the proportion of H$_3^+$ ions is 80% or higher. By increasing the proportion of H$_3^+$ included in the ion beam 130, the damaged region 114 can contain hydrogen at a concentration of greater than or equal to $1\times10^{20}$ atoms/cm$^3$. When the damaged region 114 contains hydrogen at a concentration of greater than or equal to $5\times10^{20}$ atoms/cm$^3$, the semiconductor layer is easily separated.

As a source gas for the ion irradiation step, as well as a gas containing hydrogen, one or more kinds of gases selected from a rare gas such as helium or argon; a halogen gas typified by a fluorine gas or a chlorine gas; and a halogen compound gas such as a fluorine compound gas (e.g., BF$_3$) can be used. In the case where helium is used as a source gas, the ion beam 130 with a high proportion of He$^+$ ions can be formed even without mass separation. By using the ion beam 130, the damaged region 114 can be efficiently formed.

Further, the damaged region 114 may be formed by performing ion irradiation steps multiple times. In this case, different source gases may be used in each of the steps, or the same source gas may be used in all of the steps. For example, ion irradiation can be performed using a gas containing hydrogen as a source gas after ion irradiation is performed using a rare gas as a source gas. Alternatively, first, ion irradiation can be performed using a halogen gas or a halogen compound gas, and then, ion irradiation can be performed using a gas containing hydrogen.

An ion irradiation method, which is one aspect of the present invention, is considered below.

In the present invention, a single crystal semiconductor substrate is irradiated with ions which are derived from hydrogen (H) (hereafter referred to as "hydrogen ion species"). More specifically, a hydrogen gas or a gas containing hydrogen as its composition is used as a source material, a hydrogen plasma is generated, and a single crystal semiconductor substrate is irradiated with hydrogen ion species in the hydrogen plasma.

(Ions in Hydrogen Plasma)

In the above-described hydrogen plasma, hydrogen ion species such as H$^+$, H$_2^+$, and H$_3^+$ are included. Here, reaction equations for reaction processes (formation processes and destruction processes) of each of hydrogen ion species are listed below.

$$e+H \rightarrow e+H^++e \quad (1)$$

$$e+H_2 \rightarrow e+H_2^++e \quad (2)$$

$$e+H_2 \rightarrow e+(H_2)^* \rightarrow e+H+H \quad (3)$$

$$e+H_2^+ \rightarrow e+(H_2^+)^* \rightarrow e+H^++H \quad (4)$$

$$H_2^++H_2 \rightarrow H_3^++H \quad (5)$$

$$H_2^++H_2 \rightarrow H^++H+H_2 \quad (6)$$

$$e+H_3^+ \rightarrow e+H^++H+H \quad (7)$$

$$e+H_3^+ \rightarrow H_2+H \quad (8)$$

$$e+H_3^+ \rightarrow H+H+H \quad (9)$$

Figure 10:
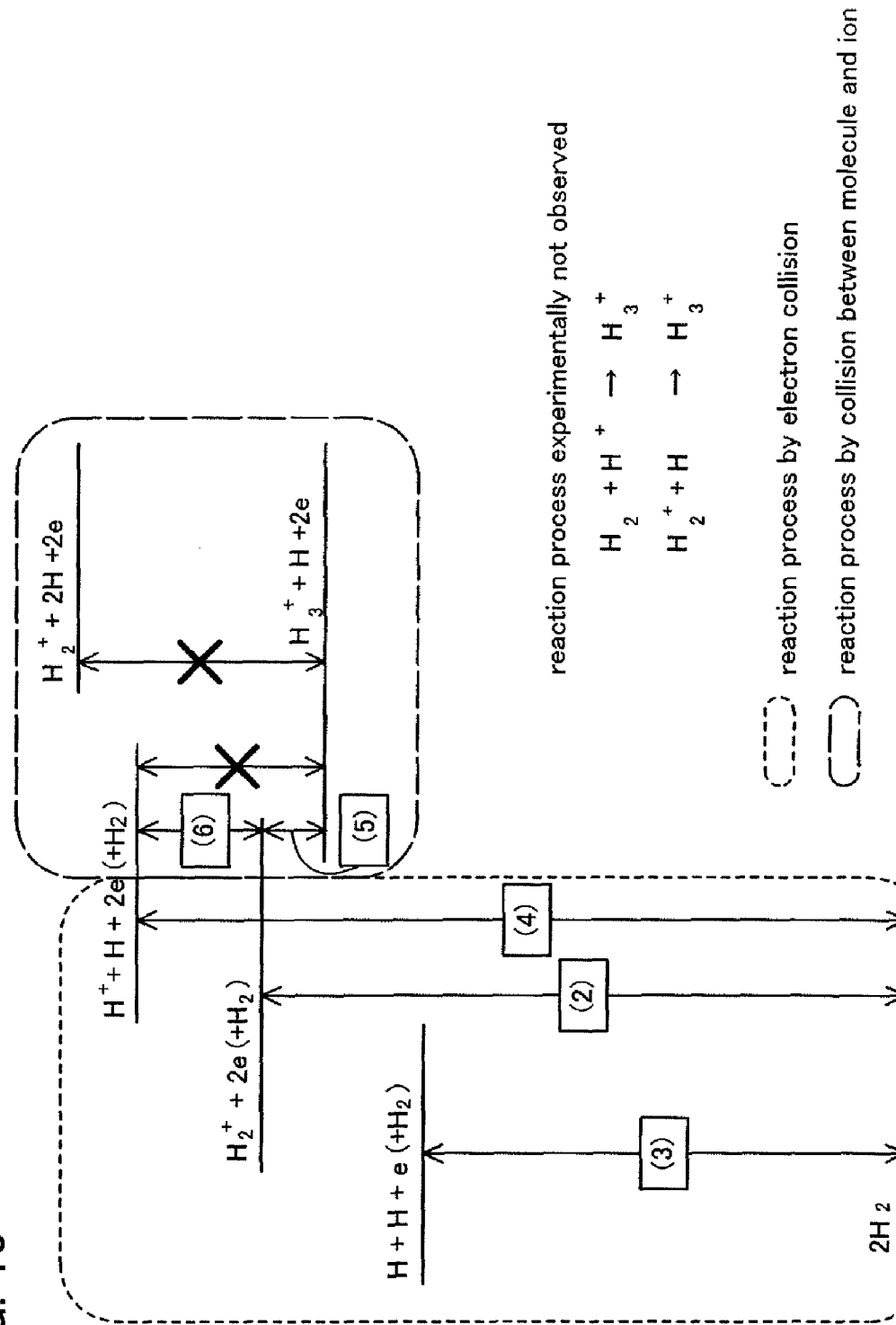
FIG. 10 illustrates an energy diagram of hydrogen ion species.

FIG. 10 is an energy diagram which schematically illustrates some of the above-described reactions. Note that the energy diagram illustrated in FIG. 10 is merely a schematic diagram and does not depict the relationships of energies of the reactions exactly.

(Formation Process of H$_3^+$)

As described above, H$_3^+$ is produced by the reaction process represented by the reaction equation (5). On the other hand, as a reaction which competes with the reaction equation (5), there is the reaction process represented by the reaction equation (6). In order to increase the amount of H$_3^+$, at least, it is necessary that the reaction of the reaction equation (5) occur more often than the reaction of the reaction equation (6) (note that, since there are also other reactions (7), (8), and (9), through which the amount of H$_3^+$ is decreased, the amount of H$_3^+$ is not necessarily increased even if the reaction of the reaction equation (5) occurs more often than the reaction of the reaction equation (6)). In contrast, in the case where the reaction of the reaction equation (5) occurs less often than the reaction of the reaction equation (6), the proportion of H$_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, in the case where the kinetic energy of H$_2^+$ is lower than approximately 11 eV, the reaction of the reaction equation (5) is the main reaction (that is, the rate coefficient of the reaction equation (5) is sufficiently higher than the rate coefficient of the reaction equation (6)) and that in the case where the kinetic energy of H$_2^+$ is higher than approximately 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to a potential energy lost by transfer of the charged particle. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, since the reaction of the reaction equation (6) is the main reaction in the situation where the pressure inside the chamber is low, the amount of $H_3^+$ tends to be decreased, and since the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, since the reaction of the reaction equation (6) is the main reaction in the situation in which the electric field is high, the amount of $H_3^+$ tends to be decreased, and since the reaction of the reaction equation (5) is the main reaction in a situation in which the electric field is low, the amount of $H_3^+$ tends to be increased.

(Differences Depending on Ion Source)

Figure 21:
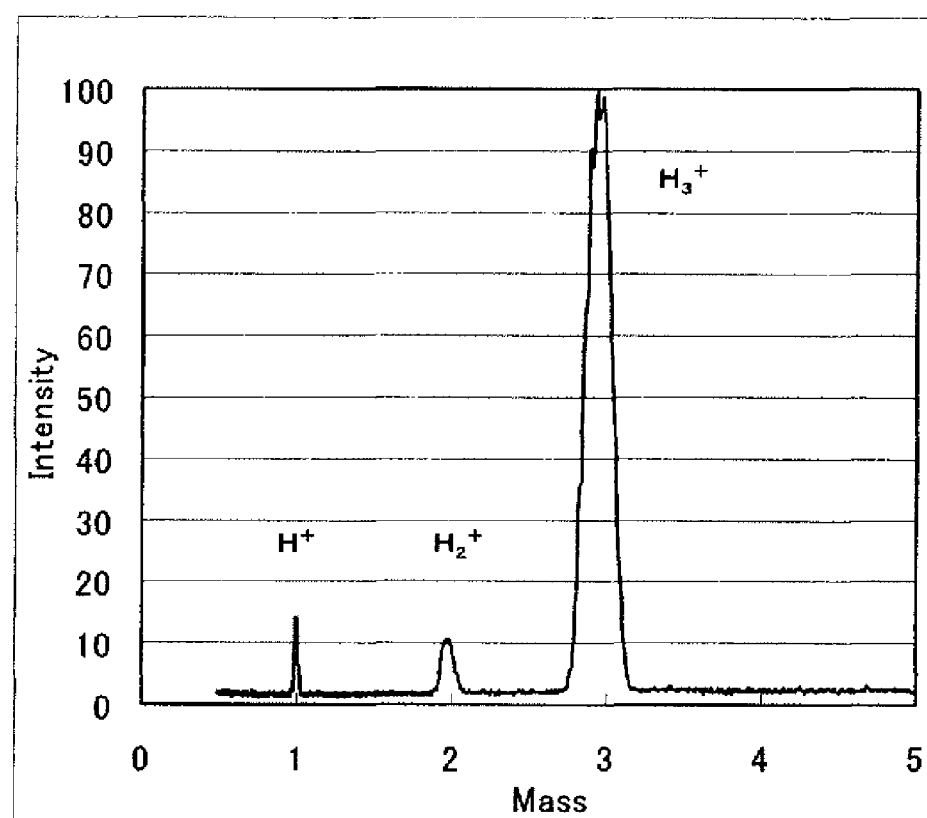
FIG. 21 illustrates a result of an ion mass spectrometry.

Here, an example in which the proportions of ion species (particularly, the proportion of $H_3^+$) are different is described. FIG. 21 is a graph illustrating results for ion mass spectrometry of ions which are generated from a 100% hydrogen gas (the pressure of an ion source: $4.7 \times 10^{-2}$ Pa). Note that the above-described mass spectrometry was performed by measurement of ions which were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of a spectrum corresponding to the number of ions. FIG. 21 is a graph illustrating a relative proportion of the number of ions with different masses when the number of ions with the mass 3 is defined as 100. It can be seen from FIG. 21 that the ratio of ion species which are generated from the above-described ion source is approximately $H^+:H_2^+:H_3^+=1:1:8$. Note that ions at such a ratio can also be generated by an ion doping apparatus including a plasma source portion (ion source) which generates a plasma, an extraction electrode which extracts an ion beam from the plasma, and the like.

Figure 22:
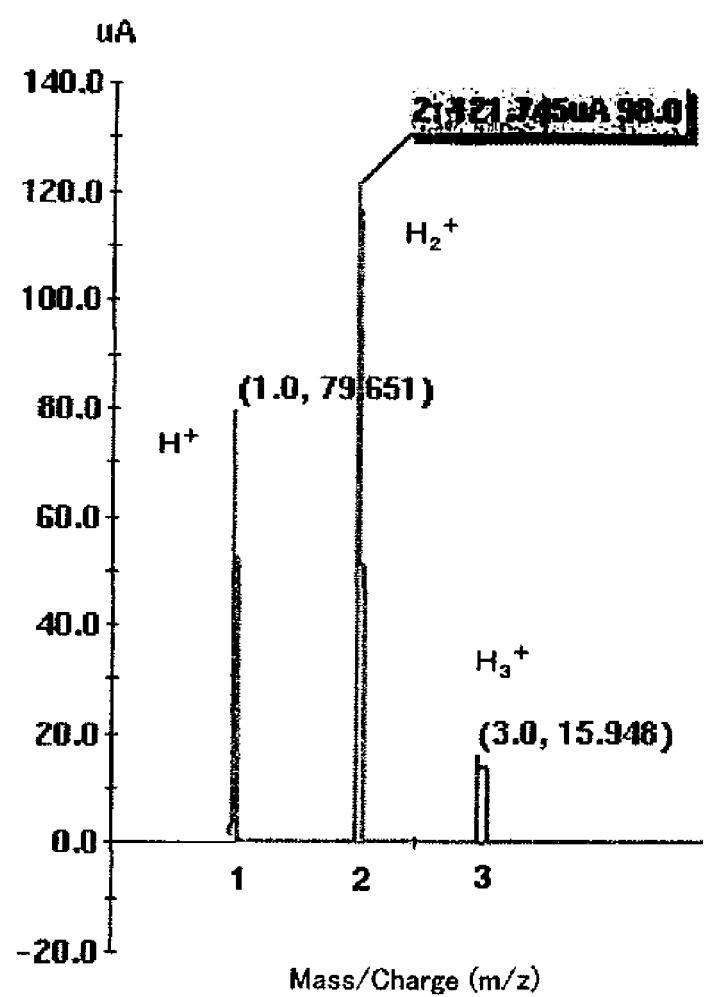
FIG. 22 illustrates a result of an ion mass spectrometry.

FIG. 22 is a graph illustrating results for ion mass spectrometry of ions which are generated from $PH_3$ in the case where an ion source which is different from that for the case of FIG. 21 is used and the pressure of the ion source is approximately $3 \times 10^{-3}$ Pa. The above-described results of the mass spectrometry focus on hydrogen ion species. In addition, the mass spectrometry was performed by measurement of ions which were extracted from the ion source. As in FIG. 21, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 22 that the ratio of ion species in a plasma is approximately $H^+:H_2^+:H_3^+=37:56:7$. Note that, although FIG. 22 illustrates a data obtained when the source gas is $PH_3$, the ratio of hydrogen ion species when a 100% hydrogen gas is used as a source gas is the same as or substantially the same as the ratio of hydrogen ion species illustrated in FIG. 22.

In the case of the ion source from which the data illustrated in FIG. 22 is obtained, $H_3^+$, of $H^+$, $H_2^+$, and $H_3^+$, is generated at a proportion of only approximately 7%. On the other hand, in the case of the ion source from which the data illustrated in FIG. 21 is obtained, the proportion of $H_3^+$ can be 50% or higher (approximately 80% under the above-described conditions). This is thought to result from the pressure and electric field inside a chamber, which is clearly shown in the above-described consideration.

($H_3^+$ Irradiation Mechanism)

In the case where a plasma which contains a plurality of ion species as illustrated in FIG. 21 is generated and a single crystal semiconductor substrate is irradiated with the generated ion species without mass separation, the surface of the single crystal semiconductor substrate is irradiated with each of $H^+$ ions, $H_2^+$ ions, and $H_3^+$ ions. In order to reproduce the mechanism, from the ion irradiation to the formation of an ion-introduced region, the following five types of models are considered.

Model 1: where the ion species used for irradiation is $H^+$, which is still $H^+$ (H) after the irradiation.

Model 2: where the ion species used for irradiation is $H_2^+$, which is still $H_2^+$ ($H_2$) after the irradiation.

Model 3: where the ion species used for irradiation is $H_2^+$, which splits into two H atoms ($H^+$ ions) after the irradiation.

Model 4: where the ion species used for irradiation is $H_3^+$, which is still $H_3^+$ ($H_3$) after the irradiation.

Model 5: where the ion species used for irradiation is $H_3^+$, which splits into three H atoms ($H^+$ ions) after the irradiation.

(Comparison of Simulation Results with Measured Values)

Based on the above-described models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5 with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 23:
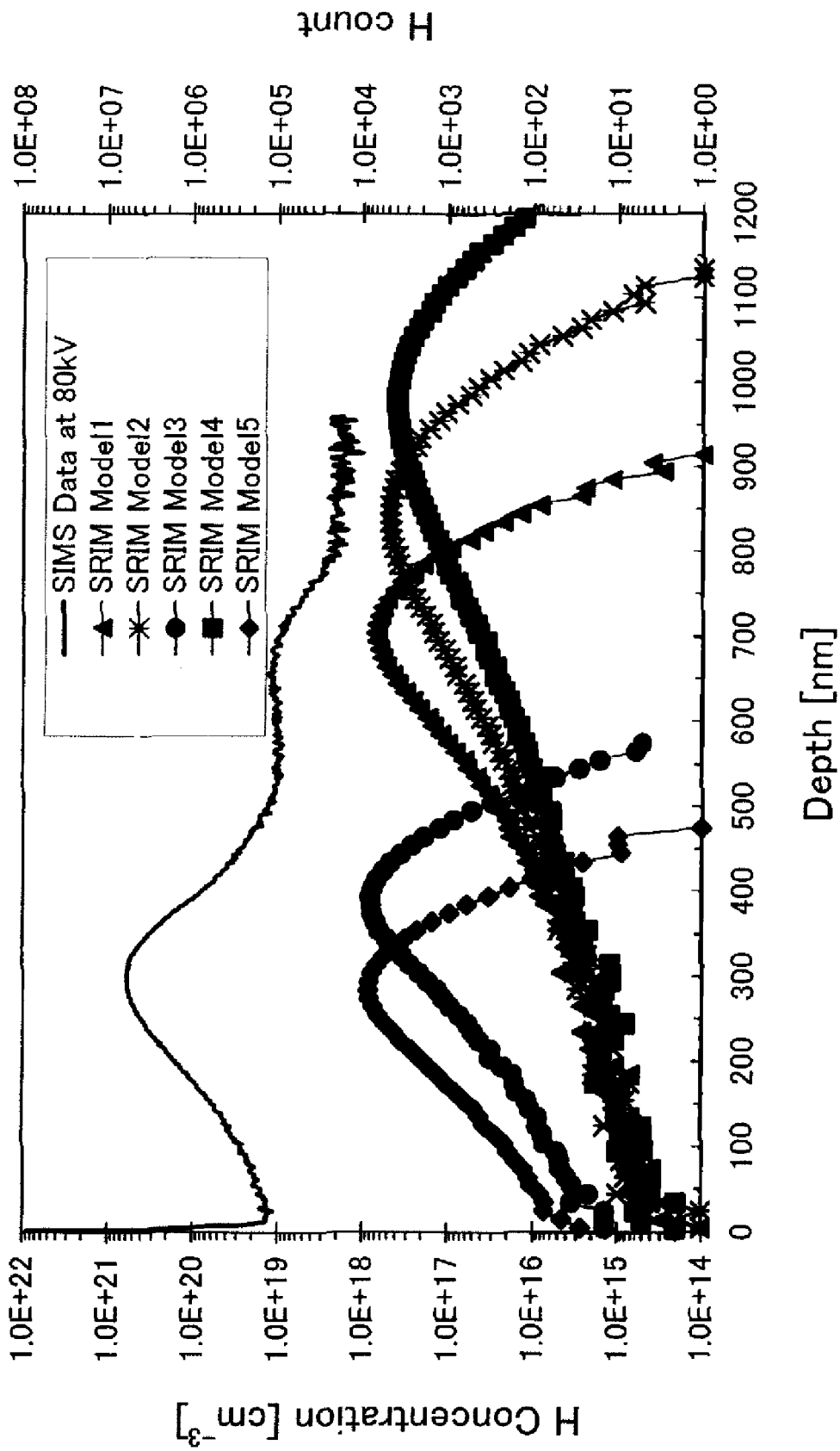
FIG. 23 illustrates a profile (measured values and calculated values) of a hydrogen element in the depth direction in the case where the accelerating voltage is 80 kV.

FIG. 23 illustrates the calculation results obtained when irradiation with the hydrogen ion species (irradiation with 100,000 atoms for H) is performed using Models 1 to 5. FIG. 23 also illustrates the hydrogen concentration (secondary ion mass spectrometry (SIMS) data) in an Si substrate irradiated with the hydrogen ion species of FIG. 21. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only about several electron volts, it is thought that the contribution of each of Models 2 and 4 is small since $H_2^+$ and $H_3^+$ mostly split into $H^+$ or H by colliding with Si atoms.

Figure 24:
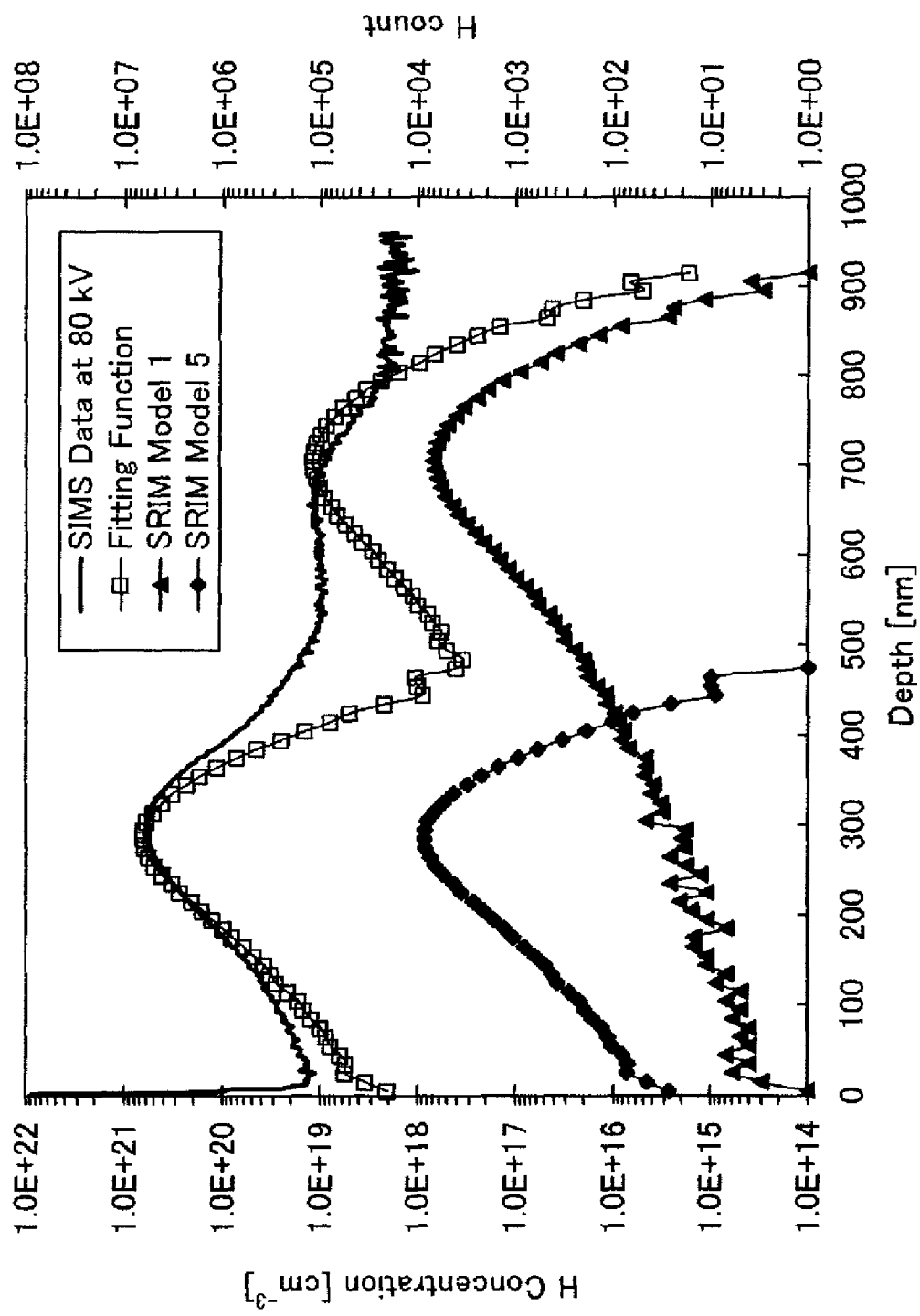
FIG. 24 illustrates a profile (measured values, calculated values, and fitting functions) of a hydrogen element in the depth direction in the case where the accelerating voltage is 80 kV.
Figure 25:
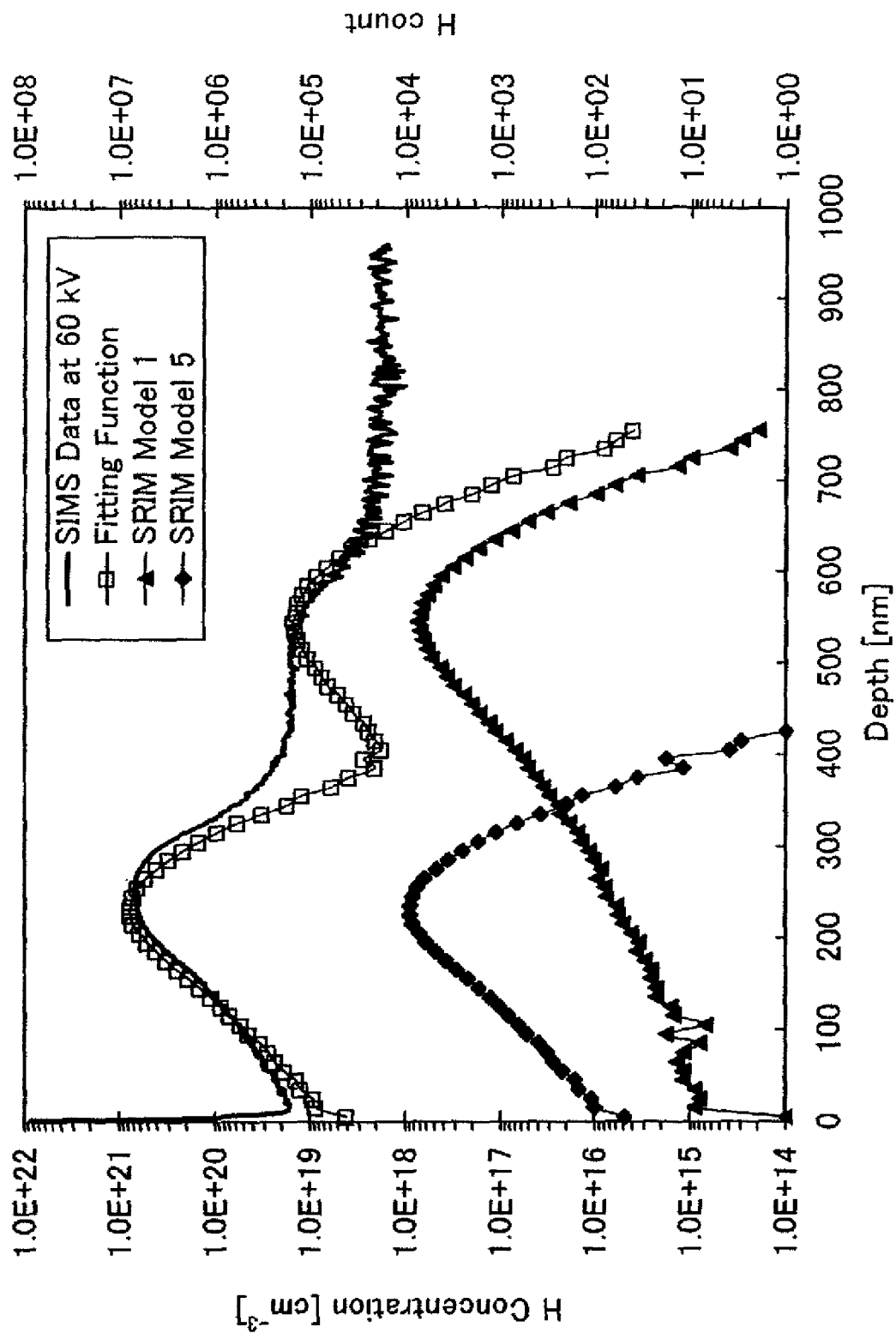
FIG. 25 illustrates a profile (measured values, calculated values, and fitting functions) of a hydrogen element in the depth direction in the case where the accelerating voltage is 60 kV.
Figure 26:
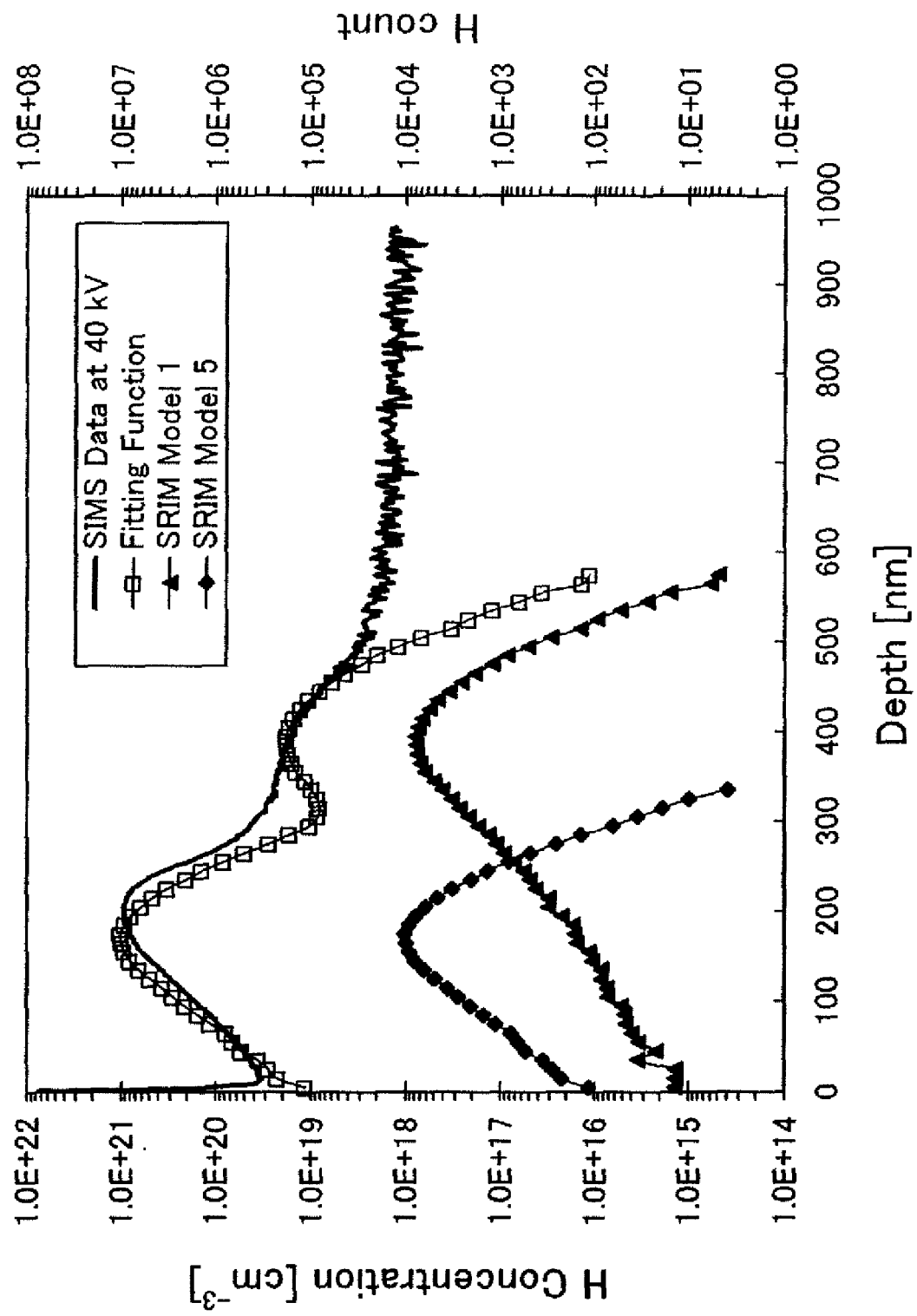
FIG. 26 illustrates a profile (measured values, calculated values, and fitting functions) of a hydrogen element in the depth direction in the case where the accelerating voltage is 40 kV.

Accordingly, Models 2 to 4 are not considered hereinafter. FIG. 24, FIG. 25, and FIG. 26 each illustrate the calculation results obtained when irradiation with the hydrogen ion species (irradiation with 100,000 atoms for H) is performed using Models 1 and 5. FIG. 21 also each illustrates the hydrogen concentration (SIMS data) in an Si substrate irradiated with the hydrogen ion species of FIG. 21, and the simulation results fitted to the SIMS data (hereinafter referred to as a "fitting function"). Here, FIG. 24 illustrates the case where the accelerating voltage is 80 kV; FIG. 25 illustrates the case where the accelerating voltage is 60 kV; and FIG. 26 illustrates the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. Note that, in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+:H_2^+:H_3^+$ is approximately 1:1:8), the contribution of $H_2^+$ (i.e., Model 3) should also be considered; however, Model 3 is excluded from the consideration given here for the following reasons.

Since the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) which occurs in Model 5. That is, it is difficult to estimate fitting parameters for Model 3. This is because this simulation assumes amorphous Si and the influence due to crystallinity is not considered.

FIG. 27 lists the above-described fitting parameters. At any of the accelerating voltages, the ratio of the amount of H introduced according to Model 1 to that introduced according to Model 5 is approximately 1:42 to 1:45 (the amount of H in Model 5, when the amount of H in Model 1 is defined as 1, is approximately 42 to 45), and the ratio of the number of ions used for irradiation of $H^+$ (Model 1) to that of $H_3^+$ (Model 5) is approximately 1:14 to 1:15 (the amount of $H_3^+$ in Model 5, when the amount of $H^+$ in Model 1 is defined as 1, is approximately 14 to 15). Considering that Model 3 is not taken into consideration and the calculation assumes amorphous Si, it can be said that values close to that of the ratio between ion species used for actual irradiation ($H^+:H_2^+:H_3^+$ is approximately 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$, as illustrated in FIG. 21. For example, since $H_3^+$ splits into $H^+$, H, or the like to be introduced into a substrate, ion introduction efficiency can be improved compared with the case of irradiation mainly with $H^+$ or $H_2^+$. This leads to an improvement in semiconductor substrate production efficiency. In addition, since the kinetic energy of $H^+$ or H after $H_3^+$ splits similarly tends to be low, $H_3^+$ is suitable for manufacture of thin semiconductor layers.

Note that, in this specification, a method is described in which an ion doping apparatus which is capable of irradiation with the hydrogen ion species as illustrated in FIG. 21 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency for semiconductor substrates can be obtained. On the other hand, if first priority is given to irradiation with $H_3^+$, there is no need to construe the present invention as being limited to the use of an ion doping apparatus.

Figure 1E:
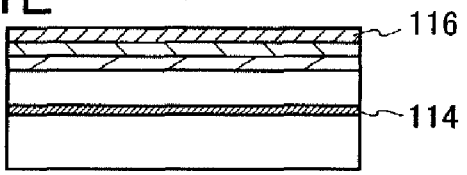

A bonding layer 116 is formed over the insulating layer 112 after the damaged region 114 is formed by ion irradiation (see FIG. 1E). The bonding layer 116 has a smooth hydrophilic surface. As the bonding layer 116, an insulating layer formed by chemical reaction is preferably used. In particular, an insulating layer containing silicon oxide is preferably used. The thickness of the bonding layer 116 can be greater than or equal to 10 nm and less than or equal to 200 nm. The preferable thickness is greater than or equal to 10 nm and less than or equal to 100 nm, and the more preferable thickness is greater than or equal to 20 nm and less than or equal to 50 nm. Note that, in the step where the bonding layer 116 is formed, the heating temperature for the semiconductor substrate 110 needs to be set at a temperature at which an element or a molecule introduced into the damaged region 114 is not removed. Specifically, the heating temperature is preferably lower than or equal to 400° C.

In the case where an insulating layer containing silicon oxide is formed by a plasma CVD method as the bonding layer 116, an organosilane gas is preferably used as a silicon source gas. An oxygen ($O_2$) gas can be used as an oxygen source gas. Examples of the organosilane gas include tetraethyl orthosilicate (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$) and the like. Further, as the silicon source gas, as well as the organosilane gas, silane ($SiH_4$), disilane ($Si_2H_6$), or the like can be used.

In addition to a plasma CVD method, a thermal CVD method can be used to form a silicon oxide film. In this case, silane (SiH$_4$), disilane (Si$_2$H$_6$), or the like can be used as the silicon source gas, and oxygen (O$_2$), dinitrogen monoxide (N$_2$O), or the like can be used as the oxygen source gas. The heating temperature is preferably higher than or equal to 200° C. and lower than or equal to 500° C.

Figure 1F:
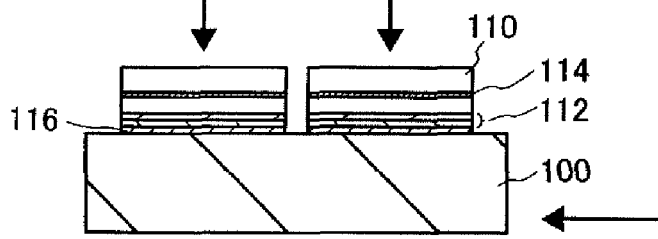

According to the above-described method, the plurality of semiconductor substrates 110 each of which is provided with the insulating layer 112, the damaged region 114, and the bonding layer 116 is prepared, and then the plurality of semiconductor substrates 110 is bonded to the base substrate 100 (see FIG. 1F). Specifically, the base substrate 100 and the semiconductor substrates 110 over which the bonding layers 116 are formed are cleaned by ultrasonic cleaning or the like. After that, the base substrate 100 and the bonding layers 116 are disposed in close contact with each other. As a result, bonds are formed between the base substrate 100 and the bonding layers 116. As a mechanism of the bond, a mechanism involving van der Waals forces, a mechanism involving hydrogen bonding, or the like are considered.

As described above, a layer containing silicon oxide which is formed by a plasma CVD method using organosilane, a layer containing silicon oxide which is formed by a thermal CVD method, or the like is used as the bonding layer 116 so that the base substrate 100 and the bonding layer 116 can be bonded to each other at room temperature. In this manner, as the base substrate 100, a substrate having low heat resistance such as a glass substrate can be used.

In order to form a strong bond between the base substrate 100 and the bonding layer 116, oxygen plasma treatment or ozone treatment may be performed on a surface of the base substrate 100 so that the base substrate 100 may have a hydrophilic surface. In this treatment, a hydroxyl group is added to the surface of the base substrate 100. Therefore, a hydrogen bond is formed at the bonding interface between the base substrate 100 and the bonding layer 116. Note that, in the case where an insulating layer is formed over the base substrate 100, a treatment may be performed in order for the insulating layer to have a hydrophilic surface.

After the base substrate 100 and the semiconductor substrate 110 are disposed in close contact with each other, heat treatment or pressure treatment may be performed. By performing heat treatment or pressure treatment, bonding strength between the base substrate 100 and the bonding layer 116 can be improved. In the case of performing the heat treatment, the heat treatment is preferably performed at a temperature at which influences of expansion and shrink due to heating of the base substrate do not notably appear. In the case of performing the pressure treatment, the pressure treatment may be performed such that pressure is applied to the bonding interface in a perpendicular direction. The applied pressure can be determined in consideration of the strength of the base substrate 100 and the semiconductor substrate 110.

Note that, although this embodiment mode describes a structure in which the plurality of semiconductor substrates 110 is prepared, and then the semiconductor substrates 110 and the base substrate 100 are bonded to each other, the present invention is not limited thereto. For example, if the semiconductor substrate 110 is sufficiently large (e.g., the semiconductor substrate 110 and the base substrate 100 have the same size or substantially the same size), a structure in which only one piece of the semiconductor substrate 110 is bonded to the base substrate 100 may be employed.

Figure 1G:
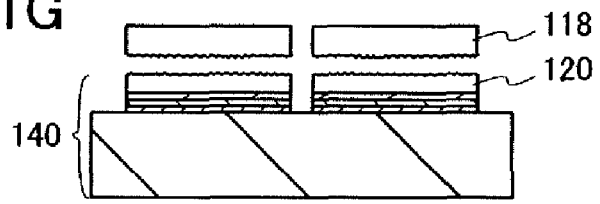

Next, the semiconductor substrate 110 is separated into a semiconductor substrate 118 and a semiconductor layer 120 (see FIG. 1G). The semiconductor substrate 110 is heated after the base substrate 100 and the semiconductor substrate 110 are bonded to each other, whereby the semiconductor substrate 110 is separated. Also in this case, the heat treatment is preferably performed at a temperature at which influences of expansion and shrink due to heating of the base substrate do not notably appear. For example, in the case where a glass substrate is used as the base substrate 100, the heating temperature is preferably higher than or equal to 400° C. and lower than or equal to 650° C.

By performing the above-described heat treatment, the volume of the microvoids formed in the damaged region 114 is changed, and a crack is generated in the damaged region 114. As a result, separation is caused along the damaged region 114. Since the bonding layer 116 is bonded to the base substrate 100, the semiconductor layer 120 separated from the semiconductor substrate 110 is left over the base substrate 100. In addition, since the bonding interface between the base substrate 100 and the bonding layer 116 is heated by this heat treatment, a covalent bond is formed at the bonding interface. Thus, the bonding force between the base substrate 100 and the bonding layer 116 is improved.

Accordingly, a semiconductor substrate 140 in which a plurality of semiconductor layers 120 is provided over the base substrate 100 is manufactured. The semiconductor substrate 140 has a multilayer structure in which the bonding layer 116, the insulating layer 112, and the semiconductor layer 120 are stacked in this order over the base substrate 100. The semiconductor substrate 140 has a bond formed at the bonding interface between the base substrate 100 and the bonding layer 116. Further, the plurality of semiconductor layers 120 is provided over the base substrate 100.

Figure 3A:
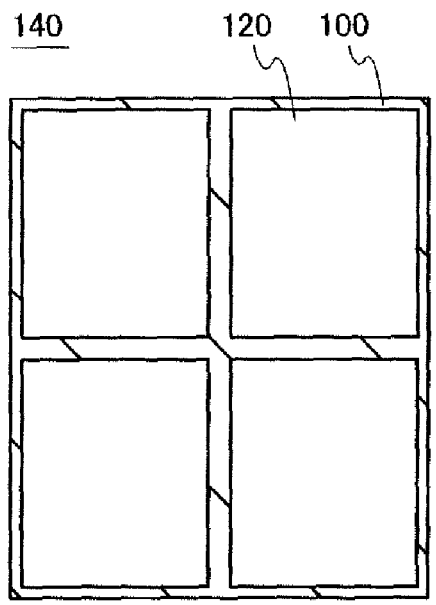
FIGS. 3A to 3C are plan views of semiconductor substrates.
Figure 3B:
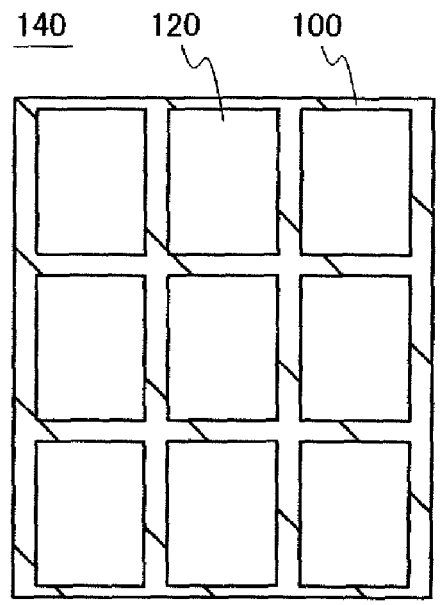
Figure 3C:
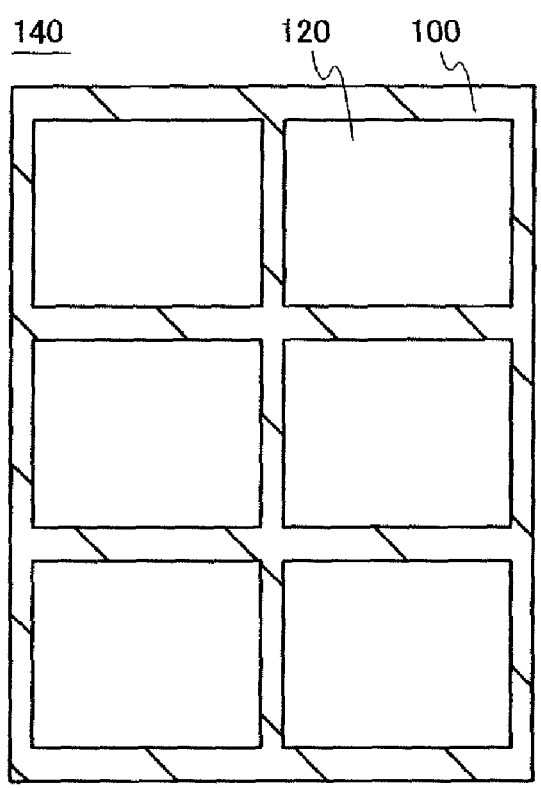

FIGS. 3A to 3C are plan views illustrating structural examples of the semiconductor substrates 140 manufactured according to the above-described process. FIGS. 3A and 3B illustrate structural examples of the semiconductor substrates 140 in which a mother glass with a size of 600 mm×720 mm is used as the base substrate 100. FIG. 3C illustrates a structural example of the semiconductor substrates 140 in which the fourth-generation mother glass with a size of 730 mm×920 mm is used as the base substrate 100. Instead of a mother glass with a size of 600 mm×720 mm, a mother glass with a size of 620 mm×750 mm may be used. In addition, a large-sized substrate such as the fourth generation (680 mm×880 mm), the fifth generation (1100 mm×1300 mm), the sixth generation (1500 mm×1850 mm), the seventh generation (1870 mm×2200 mm), or the eighth generation (2200 mm×2400 mm) can be used as the base substrate 100.

In FIG. 3A, the semiconductor layers 120 are arranged in two rows and two columns over the base substrate 100. The size of the semiconductor layer 120 is 280 mm×350 mm, and the length of a diagonal line is approximately 18 inches. A distance between the semiconductor layers 120 is 10 mm both in x direction (in a horizontal direction in the drawing) and in y direction (in a vertical direction in the drawing). A distance from an edge of the base substrate 100 to the semiconductor layer 120 is 5 mm both in x direction and in y direction. The semiconductor layers 120 illustrated in FIG. 3A are formed using rectangular semiconductor substrates which are processed from a semiconductor substrate with a diameter of 18 inches.

In FIG. 3B, the semiconductor layers 120 are arranged in three rows and three columns over the base substrate 100. The size of the semiconductor layer 120 is 184 mm×230 mm, and the length of a diagonal line is approximately 12 inches. A distance between the semiconductor layers 120 is 10 mm both in x direction and in y direction. A distance from an edge of the base substrate 100 to the semiconductor layer 120 is 5 mm both in x direction and in y direction. The semiconductor layers 120 illustrated in FIG. 3B are formed using rectangular semiconductor substrates which are processed from a semiconductor substrate with a diameter of 12 inches.

In FIG. 3C, the semiconductor layers 120 are arranged in three rows and two columns over the base substrate 100. The size of the semiconductor layer 120 is 280 mm×350 mm (350 mm×280 mm), and the length of a diagonal line is approximately 18 inches. A distance between the semiconductor layers 120 is 10 mm in x direction and 20 mm in y direction. A distance from an edge of the base substrate 100 to the semiconductor layer 120 is 10 mm in x direction and 20 mm in y direction. The semiconductor layers 120 illustrated in FIG. 3C are formed using rectangular semiconductor substrates which are processed from a semiconductor substrate with a diameter of 18 inches.

Note that the above-described structures of the semiconductor substrate 140 are given as examples, and the present invention should not be construed as being limited to the structures. For example, by narrowing a distance between the semiconductor layers 120, the semiconductor layers 120 are successively arranged. Further, the larger base substrate 100 may be used, and the larger semiconductor layer 120 may be formed.

Next, a subsequent treatment process of the semiconductor substrate 140 is described with reference to FIGS. 4A to 4D and FIG. 5.

Figure 4A:
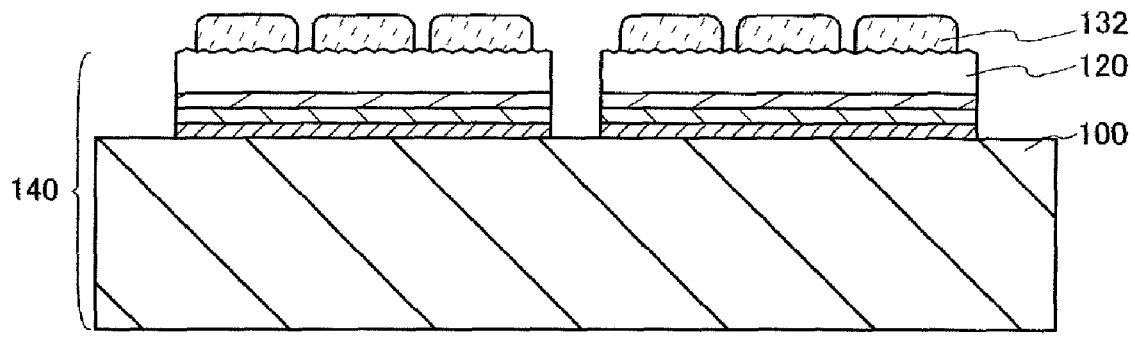
FIGS. 4A to 4D illustrate a subsequent treatment process of a semiconductor substrate.

First, the semiconductor substrate 140 illustrated in FIG. 1G is prepared, and then a mask 132 for patterning the semiconductor layer 120 is formed over the semiconductor layer 120 (see FIG. 4A). Note that the mask 132 can be formed by a photolithography method or an inkjet method. Here, the mask 132 has a given shape, a given area, and the like, and the mask 132 is formed so that the semiconductor layer 120 can be processed into a desired shape, a desired area, and the like.

Figure 4B:
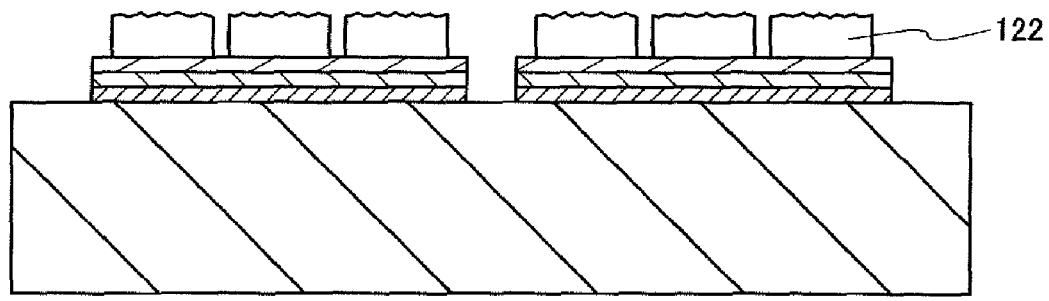

Next, the semiconductor layer 120 is patterned to form a plurality of semiconductor regions 122 (see FIG. 4B). As the patterning, dry etching or wet etching can be performed. A feature of dry etching is strong anisotropy, and a feature of wet etching is strong isotropy. Here, the semiconductor region 122 is preferably large enough to manufacture approximately 1 to $10^4$ pieces of semiconductor elements (e.g., a transistor) therein. Specifically, for example, the semiconductor region 122 can be formed to have an area of approximately larger than or equal to 1 mm$^2$ and smaller than or equal to 10000 mm$^2$ (preferably, larger than or equal to 25 mm$^2$ and smaller than or equal to 2500 mm$^2$; and more preferably, larger than or equal to 100 mm$^2$ and smaller than or equal to 150 mm$^2$). This is because, in the case where the semiconductor region 122 is too large, problems caused by thermal stress are not sufficiently solved, and in the case where the semiconductor region 122 is too small, there is a difficulty in manufacturing the semiconductor element. Here, since a peripheral portion of the semiconductor region 122 is removed in a later step, the size of the semiconductor region 122 needs to be determined in consideration of the removed region. Note that a distance between the semiconductor regions 122 can be optionally determined.

When the semiconductor layer 120 is patterned, the insulating layer 112 is preferably left without being patterned. When the insulating layer 112 is not patterned, the insulating layer 112 serving as a barrier layer exists below the semiconductor region 122. Thus, impurity elements (e.g., an alkali metal such as sodium or potassium; an alkaline earth metal such as magnesium or calcium; or a transition metal such as iron, copper, or nickel) included in the base substrate 100 can be prevented from penetrating the semiconductor layer.

As described above, a plurality of semiconductor regions 122 is formed, whereby influences of thermal stress caused by laser light irradiation treatment or heat treatment in a later step are reduced, and thus, generation of defects and film peeling can be suppressed. Note that, after the patterning is completed, the mask 132 is removed.

The plurality of semiconductor regions 122, which is formed according to the above-described process, has defects resulting from the separation step and the ion irradiation step. In addition, the plurality of semiconductor regions 122 does not have a planar surface. It is difficult to form a thin gate insulating layer having high withstand voltage over such uneven surfaces of the semiconductor regions 122. Further, since there are defects in the semiconductor regions 122, the performance and the reliability of the semiconductor element are reduced; for example, the local level density at an interface between the semiconductor region 122 and the gate insulating layer is increased. Thus, next, treatment for planarizing the surfaces of the semiconductor regions 122 and reducing the defects is performed.

Figure 4C:
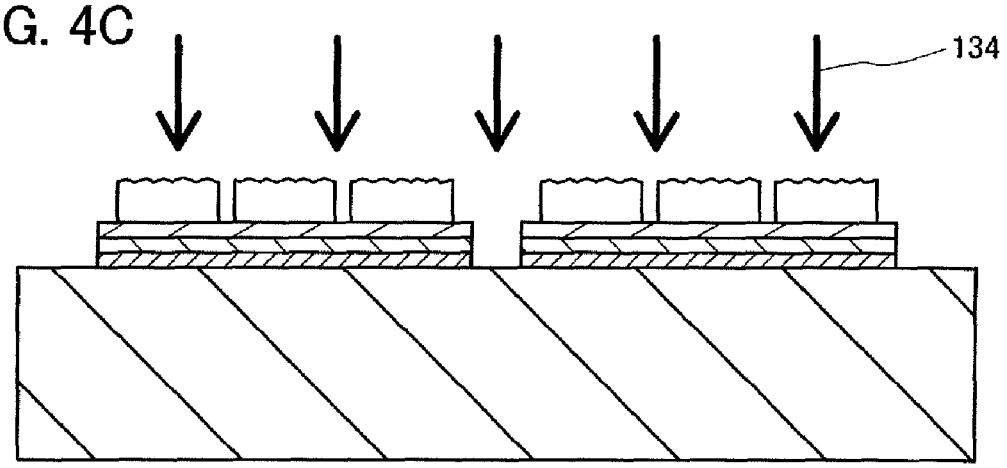

In this embodiment mode, the semiconductor regions 122 are irradiated with laser light 134 so that the surfaces of the semiconductor regions 122 are planarized and the defects are reduced (see FIG. 4C). Upper surfaces of the semiconductor regions 122 are irradiated with the laser light 134 in order to melt the upper surfaces of the semiconductor regions 122. After melting the upper surfaces of the semiconductor regions 122, the semiconductor regions 122 are cooled down and solidified, whereby semiconductor regions 124 having more planar upper surfaces and less defects can be obtained (see FIG. 4D). In this embodiment mode, the laser light 134 is used. Thus, it is not necessary to heat the base substrate, and temperature rise of the base substrate 100 can be suppressed. Thus, a substrate having low heat resistance such as a glass substrate can be used as the base substrate 100. Sufficient planarity of the semiconductor regions 122 can also be secured without polishing treatment. A structure in which heating is performed at a temperature lower than or equal to the upper temperature limit of the base substrate may be employed. By heating the base substrate, defects can be effectively reduced even if laser light having relatively low energy density is used.

Note that partial melting is necessarily performed as melting of the semiconductor regions 122 by irradiation with the laser light 134. In the case where the semiconductor regions 122 are melted completely, the recrystallization (microcrystallization) of the semiconductor regions 122 is caused by disordered nucleation of the semiconductor regions 122 in a liquid phase and crystallinity of the semiconductor regions 124 is lowered. By partial melting, crystal growth proceeds from a solid phase part, which is not melted. Accordingly, the defects of the semiconductor regions 122 are reduced. Note that, the term "complete melting" means that the semiconductor region 122 is melted to an interface between the semiconductor region 122 and the insulating layer 112 and is in a liquid state. On the other hand, the term "partial melting" means that the upper part is melted and is in a liquid state while the lower part is not melted and is still in a solid phase.

A pulsed laser is preferably used for laser light irradiation. This is because high-energy pulsed laser light can be emitted instantaneously and the partial melting state can be easily obtained. The repetition rate is preferably approximately greater than or equal to 1 Hz and less than or equal to 10 MHz; and more preferably greater than or equal to 10 Hz and less than or equal to 1 MHz. As examples of the above-described pulsed laser, an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like can be given. Note that the pulsed laser is preferably used in order to partially melt the semiconductor regions 122; however, the present invention should not be construed as being limited thereto. That is, the use of continuous wave lasers is not excluded. Note that, as examples of continuous wave lasers, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like can be given.

The wavelength of the laser light 134 needs to be a wavelength which is absorbed by the semiconductor region 122. The wavelength may be determined in consideration of the skin depth of the laser light, and the like. For example, the wavelength can be in the range of longer than or equal to 250 nm and shorter than or equal to 700 nm. In addition, the energy density of the laser light 134 can be determined in consideration of the wavelength of the laser light 134, the skin depth of the laser light 134, the thickness of the semiconductor region 122, and the like. The energy density of the laser light 134 can be set, for example, in the range of greater than or equal to 300 $mJ/cm^2$ and less than or equal to 800 $mJ/cm^2$. Note that the above-described energy density range is an example in the case where a XeCl excimer laser (wavelength: 308 nm) is used as a pulsed laser.

When the thickness of the semiconductor region 122 is increased to greater than 50 nm by adjusting the penetration depth of ions in ion irradiation step, adjustment of the energy density of the laser light 134 is easily carried out. Accordingly, by the irradiation with the laser light 134, improvement in planarity of the surface of the semiconductor region 122 and in crystallinity of the semiconductor region 122 can be achieved with a high yield. Note that, when the semiconductor region 122 is formed to be thick, the energy density of the laser light 134 needs to be increased. Thus, the thickness of the semiconductor region 122 is preferably less than or equal to 200 nm.

The irradiation with the laser light 134 can be performed in an atmosphere containing oxygen such as an air atmosphere or an inert atmosphere such as a nitrogen atmosphere. In order to perform the irradiation with the laser light 134 in an inert atmosphere, irradiation with the laser light 134 may be performed in an airtight chamber while the atmosphere in the chamber is controlled. In the case where the chamber is not used, by blowing an inert gas such as a nitrogen gas to the surface which is irradiated with the laser light 134, a nitrogen atmosphere can be formed.

Note that the irradiation with the laser light 134 in an inert atmosphere such as a nitrogen atmosphere is more effective in improving planarity of the semiconductor region 122 than the irradiation with the laser light 134 in an air atmosphere. In addition, an inert atmosphere is more effective in suppressing generation of cracks and ridges than an air atmosphere, and the applicable energy density range for the laser light 134 is widened. The irradiation with the laser light 134 may be performed in vacuum. In the case where the irradiation with the laser light 134 is performed in vacuum, the same effect can be obtained as that produced in the case where the irradiation with the laser light 134 is performed in an inert atmosphere.

After the irradiation with the laser light 134 is performed as described above, the thinning step in which the film thickness of the semiconductor region 124 is reduced may be performed. In order to thin the semiconductor region 124, one of dry etching and wet etching or a combination of both of the etchings, or etch back treatment may be employed. For example, in the case where the semiconductor substrate 110 is a silicon substrate, the semiconductor region 124 can be thinned by dry etching treatment using $SF_6$ and $O_2$ as a process gas. Treatment in which the film thickness of the semiconductor region is reduced may be performed before the irradiation with the laser light. A combination of the laser light irradiation and the etching treatment or the etch back treatment is employed, whereby unevenness of the surface of the semiconductor layer, defects, and the like can be remarkably reduced.

Further, heat treatment may be performed at a temperature lower than or equal to the upper temperature limit of the base substrate 100 either before or after, or both before and after the irradiation with the laser light 134. As a result, fine defects that cannot be repaired by the irradiation with the laser light 134 can be repaired. The heat treatment can be performed with the use of, for example, an RTA method such as a GRTA (gas rapid thermal annealing) method or an LRTA (lamp rapid thermal annealing) method. In the case where there is no big problem in planarity of the surface or the like, a structure in which only the above-described heat treatment is performed, instead of the laser light irradiation, may be employed. There is no necessity to always employ the above-described heat treatment, or etching treatment or etch back treatment.

In the present invention, the laser light irradiation treatment or the heat treatment is performed after the semiconductor layer having a large area is separated into the semiconductor regions. Accordingly, influences of thermal stress caused by difference in the thermal expansion coefficient between the semiconductor layer and the base substrate (or the insulating layer or the like) can be reduced compared to the case where the laser light irradiation treatment or the heat treatment is performed before the semiconductor layer is separated into the semiconductor regions. That is, as a contact area between materials having different thermal expansion coefficients is increased, the influences of thermal stress are increased; however, by patterning the semiconductor layer, the contact area is reduced, whereby thermal stress is reduced. Further, in the case where the semiconductor layer has a large area, stress is concentrated on the end portions, which leads to defects and film peeling. However, by separating the semiconductor layer into the semiconductor regions (i.e., by reducing the area), stress can be dispersed to each of the semiconductor regions, and thus problems resulting from the semiconductor layer having a large area can be solved.

Figure 4D:
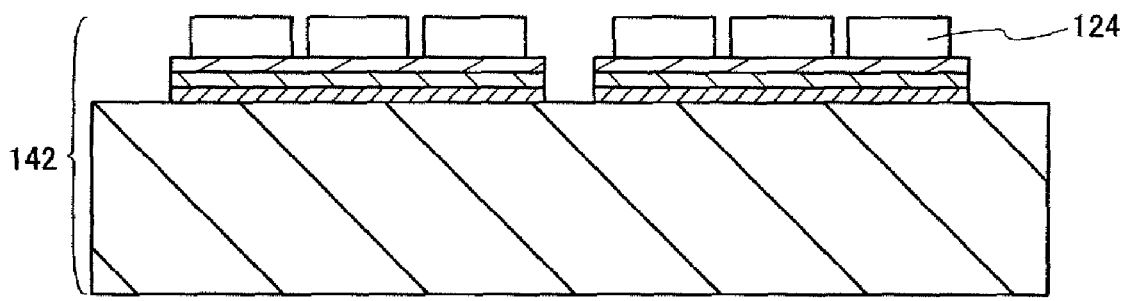
Figure 5:
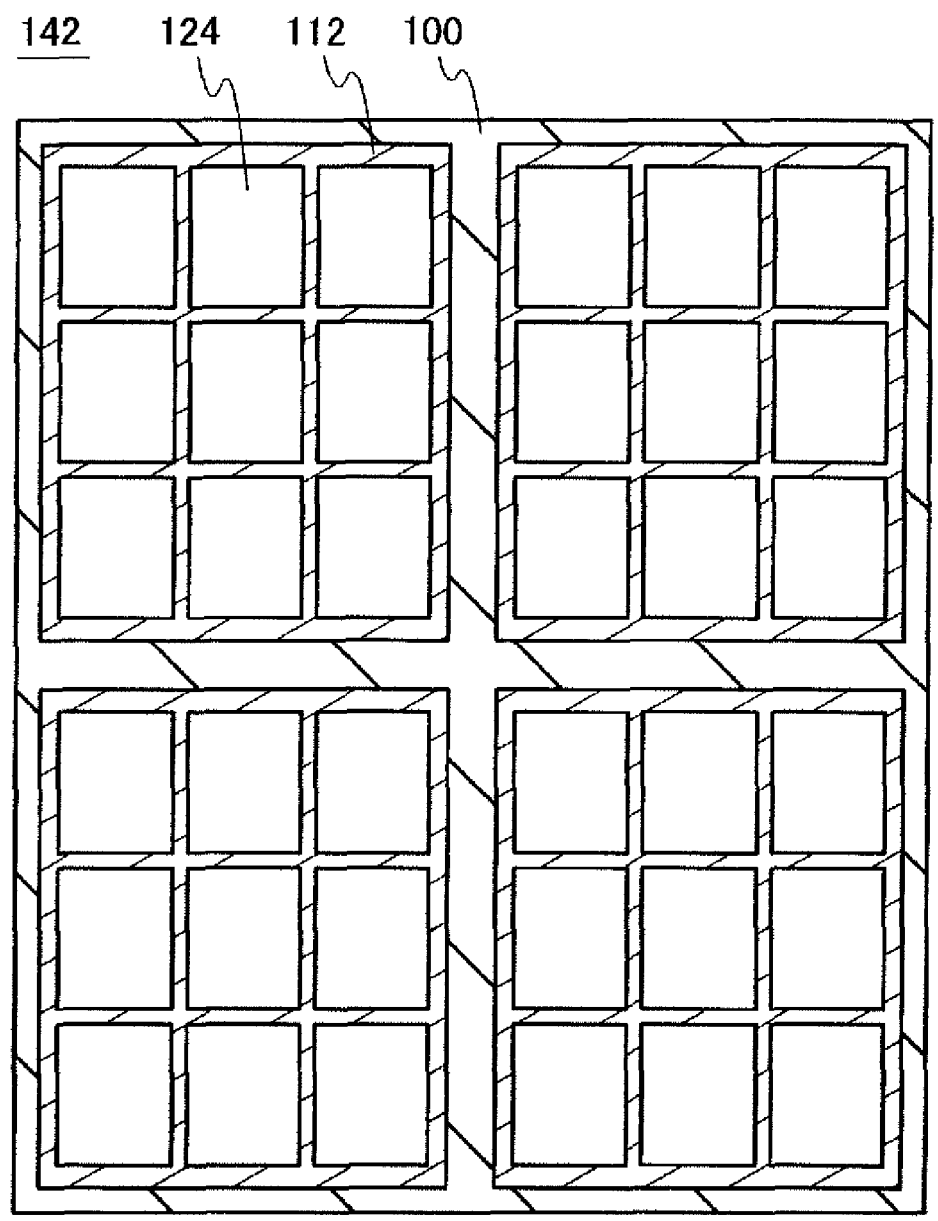
FIG. 5 is a plan view of a semiconductor substrate after subsequent treatment.

Through the above process, a semiconductor substrate 142 having the semiconductor regions 124 can be obtained (see FIG. 4D). FIG. 5 is a plan view of the semiconductor substrate 142 having a structure in which the semiconductor regions 124 are formed in an array of three rows and three columns from one piece of the semiconductor layer 120. The semiconductor substrate 142 illustrated in FIG. 5 corresponds to a substrate obtained by processing the semiconductor substrate 140 illustrated in FIG. 3A. Note that, although FIG. 5 only illustrates one example of the semiconductor substrate 142, the semiconductor substrate 142 of the present invention should not be construed as being limited to the structure. In particular, a method for forming the semiconductor region 124 (area, arrangement, and the like) can be changed as appropriate.

Next, a method for manufacturing a semiconductor device using the semiconductor substrate 142 is described with reference to FIGS. 6A to 6D, FIGS. 7A to 7D, FIGS. 8A to 8C, and FIGS. 9A and 9B. Here, as an example of the semiconductor device, a method for manufacturing a semiconductor device having a plurality of transistors is described. Note that, by combining transistors described below, various semiconductor devices can be formed.

Figure 6A:
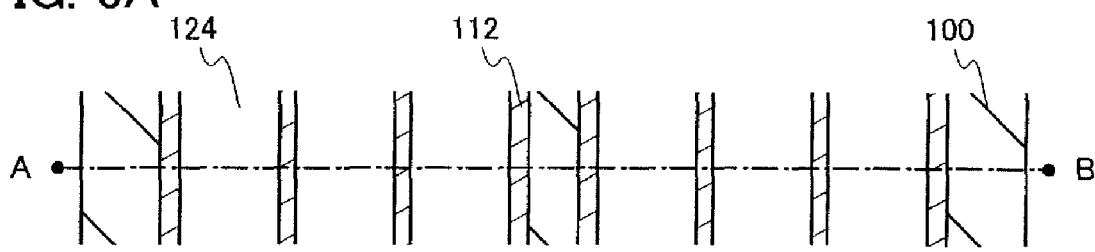
FIGS. 6A to 6D illustrate a manufacturing process of a semiconductor device.
Figure 6B:
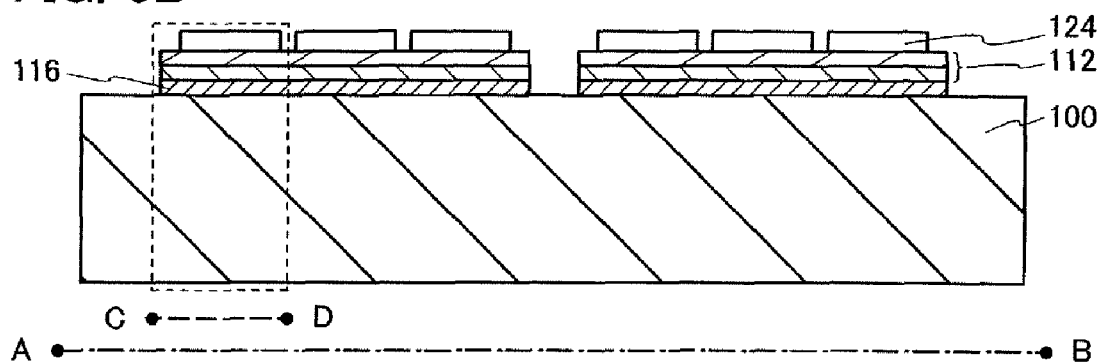
Figure 6C:
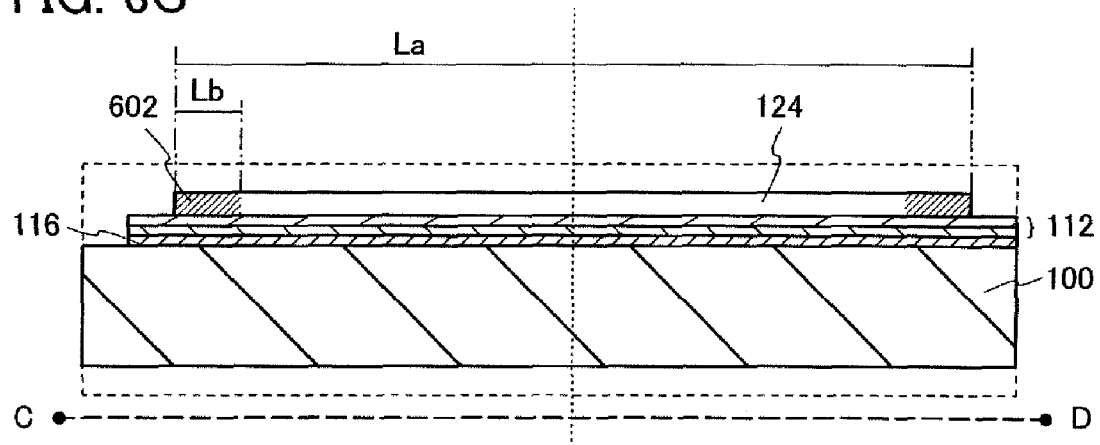

FIG. 6A is a plan view illustrating a part of the semiconductor substrate 142 illustrated in FIG. 5. FIG. 6B is a cross-sectional view taken along a line A-B in FIG. 6A. FIG. 6C is an enlarged cross-sectional view taken along a line C-D in FIG. 6B (a region surrounded by a dashed line in FIG. 6B). Note that a part of a central portion of the semiconductor region 124 is omitted in FIG. 6C.

In FIG. 6C, there is a region 602 where semiconductor characteristics are reduced at end portions of the semiconductor region 124. The region 602 where semiconductor characteristics are reduced is thought to result from stress left at the end portions of the semiconductor region, which is caused by melting and recrystallizing the semiconductor region 124 due to the laser light irradiation, the heat treatment, or the like. In the present invention, a transistor is manufactured without using the region 602 where semiconductor characteristics are reduced. Specifically, with respect to a side length La of the semiconductor region 124, regions corresponding to both end portions each having a length Lb are removed, and a transistor is manufactured using a region that is left. Here, it is preferable that Lb be greater than or equal to 10% and less than or equal to 20% of La.

Figure 6D:
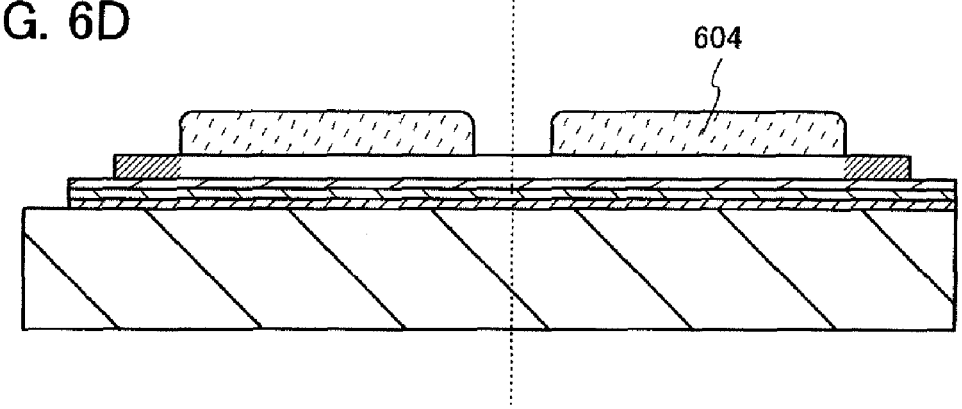

In order to remove the region 602 where semiconductor characteristics are reduced and to manufacture an active layer of the transistor, a mask 604 is formed over the semiconductor region 124 (see FIG. 6D). Note that the mask 604 can be formed by a photolithography method or an inkjet method. Here, a shape of the mask, an area of the mask, and the like may be determined in accordance with the active layer of the transistor; however, there is a necessity to manufacture the mask so that the region 602 where semiconductor characteristics are reduced can be removed.

After that, the semiconductor region 124 is patterned by using the mask 604 so that a plurality of island-shaped semiconductor layers is formed. Here, typically, a semiconductor layer 606 and a semiconductor layer 608 are illustrated (see FIG. 7A). As the etching, dry etching or wet etching can be performed. Here, a feature of dry etching is strong anisotropy, and a feature of wet etching is strong isotropy. By applying these features, the island-shaped semiconductor layers having a tapered shape may be formed, or end portions of the island-shaped semiconductor layers may be processed so that end portions thereof have rounded edges. For example, by using the strong isotropic etching, the end portions of the island-shaped semiconductor layers can have rounded edges. Further, etching can be performed to form the island-shaped semiconductor layers having a desired tapered shape by a so-called ICP (inductively coupled plasma) etching method with appropriate control of the etching conditions (e.g., the amount of electric energy applied to a coiled electrode layer, the amount of electric energy applied to an electrode layer on the substrate side, the electrode temperature on the substrate side, and the like). A tapered shape can be controlled by a shape of the mask as well. When the island-shaped semiconductor layers have a tapered shape, they are favorably covered with an insulating layer and a conductive layer in a later step. Thus, generation of break, which is caused by a step, of the insulating layer and the conductive layer can be prevented. Furthermore, when the island-shaped semiconductor layers have rounded edges, concentration of electric field can be reduced. Thus, generation of malfunction of semiconductor elements can be prevented.

In order to control the threshold voltage of the transistor, a p-type impurity element such as boron, aluminum, or gallium; or an n-type impurity element such as phosphorus or arsenic may be added to the semiconductor layer 606 and the semiconductor layer 608. A region where an impurity element is added and a kind of the impurity element to be added can be changed as appropriate. For example, a p-type impurity element can be added to a region where an n-channel transistor is formed, and an n-type impurity element can be added to a region where a p-channel transistor is formed. In adding the above-described impurity element, the dosage may be, approximately, greater than or equal to $1 \times 10^{15}$ atoms/cm$^2$ and less than or equal to $1 \times 10^{17}$ atoms/cm$^2$.

Figure 7A:
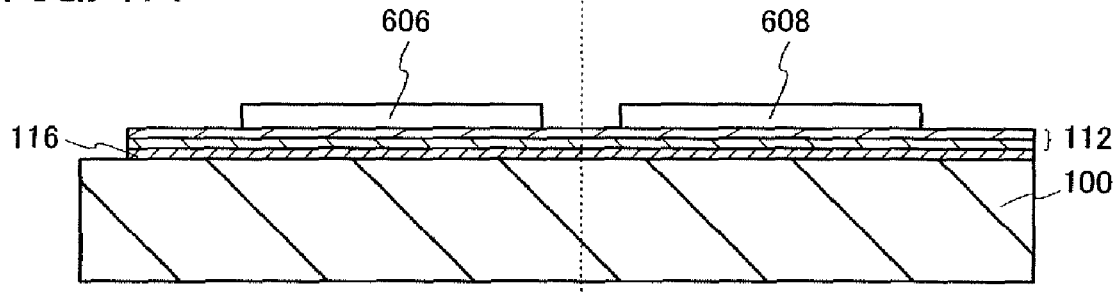
FIGS. 7A to 7D are cross-sectional views illustrating a manufacturing process of a semiconductor device.
Figure 7B:
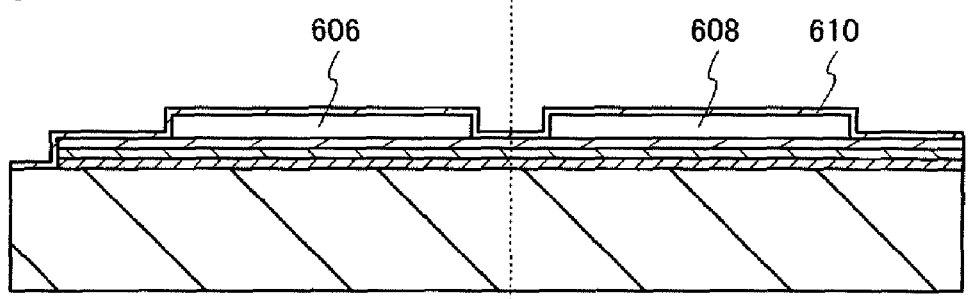

Next, a gate insulating layer 610 is formed so as to cover the semiconductor layer 606 and the semiconductor layer 608 (see FIG. 7B). Here, a single layer of a silicon oxide film is formed by a plasma CVD method. Alternatively, the gate insulating layer 610 may be formed to have a single-layer structure or a stacked-layer structure formed of a film containing any of silicon oxynitride, silicon nitride oxide, silicon nitride, hafnium oxide, aluminum oxide, tantalum oxide, or the like.

As well as a plasma CVD method, as examples of manufacturing methods, a sputtering method, an oxidizing method by a high-density plasma treatment, and a nitriding method by a high-density plasma treatment can be given. A high-density plasma treatment is performed, for example, using a mixed gas of a rare gas such as helium, argon, krypton, or xenon; an oxygen gas; a nitrogen oxide gas; an ammonia gas; a nitrogen gas; a hydrogen gas; or the like. In this case, plasma excitation is performed by introduction of microwaves, whereby plasma with a low electron temperature and high density can be generated. A surface of a semiconductor layer is oxidized or nitrided with oxygen radicals (OH radicals may be included) or nitrogen radicals (NH radicals may be included) which are generated by such a high-density plasma, whereby an insulating layer is formed to have a thickness of greater than or equal to 1 nm and less than or equal to 20 nm, preferably greater than or equal to 2 nm and less than or equal to 10 nm so as to be in contact with the semiconductor layer.

Since the oxidation or nitridation of the semiconductor layer by the above-described high-density plasma treatment is a solid-phase reaction, the interface state density between the gate insulating layer 610 and the semiconductor layer 606 or the semiconductor layer 608 can be extremely reduced. Further, by directly oxidizing or nitriding the semiconductor layer by high-density plasma treatment, variations in thickness of the insulating layer to be formed can be suppressed. Even when the high-density plasma treatment is used to oxidize the surface of the semiconductor layer by a solid-phase reaction, since the semiconductor layer has crystallinity, it is possible to suppress uneven oxidation at grain boundaries; thus, a gate insulating layer with good uniformity and low interface state density can be formed. A transistor including the insulating layer formed by high-density plasma treatment in this manner in part of the gate insulating layer of the transistor or as the whole gate insulating layer of the transistor can have little variation in the characteristics.

A more specific example of a method for manufacturing an insulating layer by a plasma treatment is described. Nitrous oxide ($N_2O$) is diluted one- to three-fold (flow rate) with argon (Ar), and a microwave (2.45 GHz) power of greater than or equal to 3 kW and less than or equal to 5 kW is applied under a pressure of greater than or equal to 10 Pa and less than or equal to 30 Pa, whereby surfaces of the semiconductor layer 606 and the semiconductor layer 608 are oxidized or nitrided. By this treatment, a lower layer of the gate insulating layer 610 is formed to have a thickness of greater than or equal to 1 nm and less than or equal to 10 nm (preferably, greater than or equal to 2 nm and less than or equal to 6 nm). Further, nitrous oxide ($N_2O$) and silane ($SiH_4$) are introduced, and a microwave (2.45 GHz) power of greater than or equal to 3 kW and less than or equal to 5 kW is applied under a pressure of greater than or equal to 10 Pa and less than or equal to 30 Pa, whereby a silicon oxynitride film is formed by a vapor deposition method as an upper layer of the gate insulating layer 610. As described above, the gate insulating layer 610 is formed by combining a solid-phase reaction and a vapor deposition method, whereby the gate insulating layer 610 with low interface state density and excellent withstand voltage can be formed. Note that, in this case, the gate insulating layer 610 has a two-layer structure.

Alternatively, the gate insulating layer 610 may be formed by thermally oxidizing the semiconductor layer 606 and the semiconductor layer 608. In the case of using such a thermal oxidization, a base substrate having relatively high heat resistance is preferably used.

Note that after the gate insulating layer 610 containing hydrogen is formed, heat treatment may be performed at a temperature of higher than or equal to 350° C. and lower than or equal to 450° C., whereby hydrogen contained in the gate insulating layer 610 may be diffused into the semiconductor layer 606 and the semiconductor layer 608. In this case, the gate insulating layer 610 may be formed using silicon nitride or silicon nitride oxide by a plasma CVD method. Note that the gate insulating layer may be formed at a temperature of lower than or equal to 350° C. As described above, by supplying hydrogen to the semiconductor layer 606 and the semiconductor layer 608, defects in the semiconductor layer 606, in the semiconductor layer 608, at an interface between the gate insulating layer 610 and the semiconductor layer 606, and at an interface between the gate insulating layer 610 and the semiconductor layer 608 may be effectively reduced.

Figure 7C:
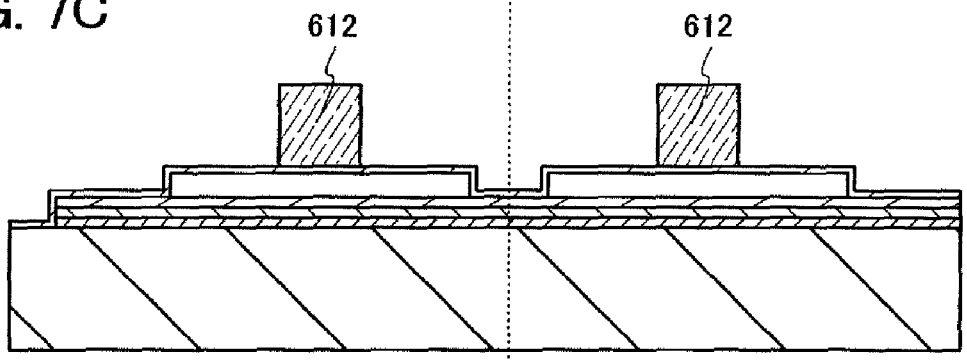

Next, after a conductive layer is formed over the gate insulating layer 610, the conductive layer is processed into a desired shape (patterning), whereby an electrode 612 is formed over each of the semiconductor layer 606 and the semiconductor layer 608 (see FIG. 7C). The conductive layer can be formed by a CVD method, a sputtering method, or the like. For the conductive layer, materials such as tantalum (Ta), tungsten (W), titanium (Ti), molybdenum (Mo), aluminum (Al), copper (Cu), chromium (Cr), and niobium (Nb) can be used. Alternatively, an alloy containing the above-described metal as its main component or a compound containing the above-described metal may be used. Alternatively, a semiconductor material such as polycrystalline silicon doped with an impurity element which imparts conductivity may be used.

Although, in this embodiment mode, the electrode 612 is formed of a single layer of the conductive layer, the semiconductor device of the present invention should not be construed as being limited to the structure. The electrode 612 may be formed of a plurality of stacked conductive layers. In the case of a two-layer structure, for example, a molybdenum film, a titanium film, a titanium nitride film, or the like may be used as a lower layer, and an aluminum film or the like may be used as an upper layer. In the case of a three-layer structure, a stacked-layer structure including a molybdenum film, an aluminum film, and a molybdenum film; a stacked-layer structure including a titanium film, an aluminum film, and a titanium film; or the like may be employed.

Note that a mask used for forming the electrode 612 can be formed of materials such as silicon oxide or silicon nitride oxide. In this case, a step in which a silicon oxide film, a silicon nitride oxide film, or the like is patterned to form a mask is added. However, since the decrease in film thickness of the mask by etching is less than that of a mask formed of a resist material, the electrode 612 having a more precise shape can be formed. Alternatively, the electrode 612 may be formed selectively by a droplet discharging method instead of using a mask. Here, a droplet discharging method means a method by which droplets containing a predetermined composition are discharged or ejected to form a predetermined pattern, and includes an ink-jet method and the like in its category.

Further, the electrode 612 may also be formed by etching the conductive layer into a desired tapered shape by an ICP (inductively coupled plasma) etching method with appropriate control of the etching conditions (e.g., the amount of electric energy applied to a coiled electrode layer, the amount of electric energy applied to an electrode layer on the substrate side, and the electrode temperature on the substrate side). Furthermore, a tapered shape can also be controlled by a shape of the mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate.

Figure 7D:
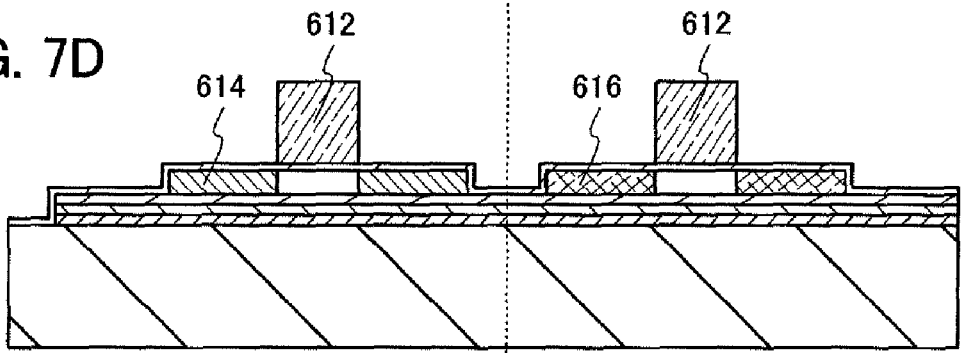

Next, as illustrated in FIG. 7D, an impurity element imparting one conductivity type is added to each of the semiconductor layer 606 and the semiconductor layer 608 with the electrode 612 used as a mask. In this embodiment mode, an impurity element imparting n-type conductivity (e.g., phosphorus or arsenic) is added to the semiconductor layer 606, and an impurity element imparting p-type conductivity (e.g., boron) is added to the semiconductor layer 608. Note that when the impurity element imparting n-type conductivity is added to the semiconductor layer 606, the semiconductor layer 608 to which the p-type impurity is added is covered with a mask or the like so that the addition of the impurity element imparting n-type conductivity can be performed selectively. Alternatively, when the impurity element imparting p-type conductivity is added to the semiconductor layer 608, the semiconductor layer 606 to which the n-type impurity is added is covered with a mask or the like so that the addition of the impurity element imparting p-type conductivity can be performed selectively. Further, after one of the impurity element imparting p-type conductivity and the impurity element imparting n-type conductivity is added to the semiconductor layer 606 and the semiconductor layer 608, the other of the impurity element imparting p-type conductivity and the impurity element imparting n-type conductivity may be added to one of the semiconductor layer 606 and the semiconductor layer 608 at higher concentration. By the above-described impurity addition, impurity regions 614 are formed in the semiconductor layer 606 and impurity regions 616 are formed in the semiconductor layer 608.

Figure 8A:
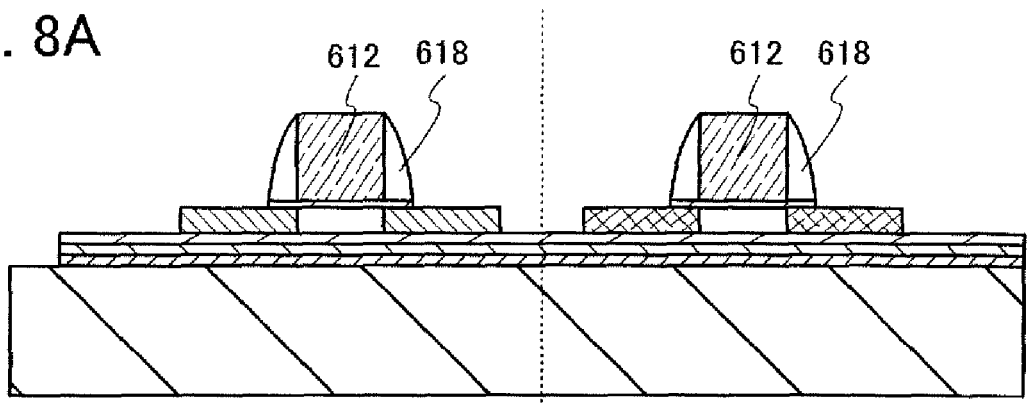
FIGS. 8A to 8C are cross-sectional views illustrating a manufacturing process of a semiconductor device.

Next, as illustrated in FIG. 8A, a sidewall 618 is formed on side surfaces of the electrodes 612. The sidewall 618 can be formed by, for example, newly forming an insulating layer so as to cover the gate insulating layer 610 and the electrode 612 and partially etching the newly formed insulating layer by an anisotropic etching mainly in a perpendicular direction. Note that the gate insulating layer 610 may also be etched partially by the above-described anisotropic etching. In this embodiment mode, a structure in which a part of the gate insulating layer 610 other than a part of the gate insulating layer 610 under the electrode 612 and the sidewall 618 is removed is described. An insulating layer for forming the sidewall 618 may be formed by a plasma CVD method, a sputtering method, or the like, to have a single-layer structure or a stacked-layer structure of any of films containing silicon, silicon oxide, silicon nitride, silicon oxynitride, silicon nitride oxide, organic materials, or the like. In this embodiment mode, a silicon oxide film is formed to have a thickness of 100 nm by a plasma CVD method. In addition, as an etching gas, a mixed gas of $CHF_3$ and helium can be used.

Note that the steps for formation of the sidewall 618 are not limited to these steps given here.

Figure 8B:
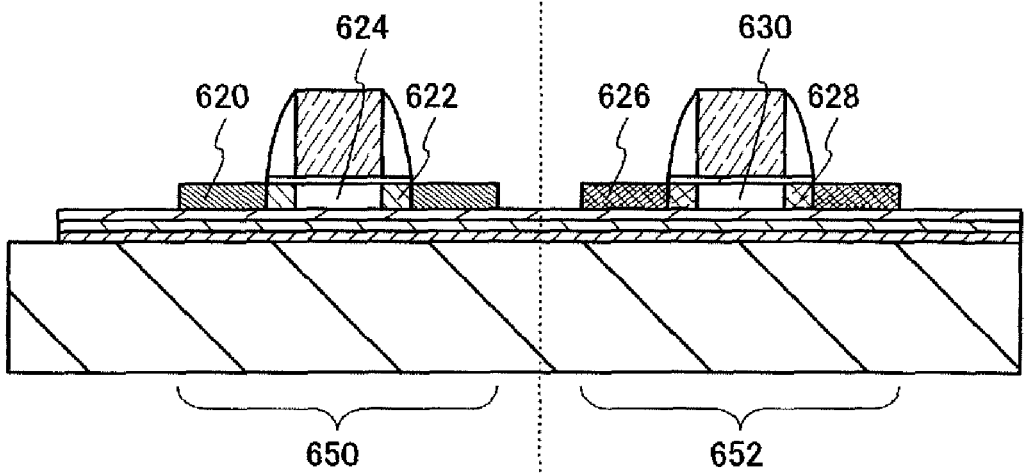

Next, as illustrated in FIG. 8B, an impurity element imparting one conductivity type is added to each of the semiconductor layer 606 and the semiconductor layer 608 with the gate insulating layer 610, the electrode 612, and the sidewall 618 used as masks. Note that the impurity element imparting the same conductivity type as the impurity element added in the previous step is added to the semiconductor layer 606 and the semiconductor layer 608 at higher concentration. Note that when the impurity element imparting n-type conductivity is added to the semiconductor layer 606, the semiconductor layer 608 to which the p-type impurity is added is covered with a mask or the like so that the addition of the impurity element imparting n-type conductivity can be performed selectively. Alternatively, when the impurity element imparting p-type conductivity is added to the semiconductor layer 608, the semiconductor layer 606 to which the n-type impurity is added is covered with a mask or the like so that the addition of the impurity element imparting p-type conductivity can be performed selectively.

By the above-described addition of the impurity element, a pair of high concentration impurity regions 620, a pair of low concentration impurity regions 622, and a channel formation region 624 are formed in the semiconductor layer 606. In addition, by the above-described addition of the impurity element, a pair of high concentration impurity regions 626, a pair of low concentration impurity regions 628, and a channel formation region 630 are formed in the semiconductor layer 608. The high concentration impurity regions 620 and the high concentration impurity regions 626 each serve as a source or a drain, and the low concentration impurity regions 622 and the low concentration impurity regions 628 serve as LDD (lightly doped drain) regions.

Note that the sidewall 618 formed over the semiconductor layer 606 and the sidewall 618 formed over the semiconductor layer 608 may have the same width in a carrier moving direction (a direction parallel to a so-called channel length) or may have different widths in the carrier moving direction. The width of the sidewall 618 over the semiconductor layer 608 which forms a p-channel transistor is preferably larger than that of the sidewall 618 over the semiconductor layer 606 which forms an n-channel transistor. This is because boron which is implanted for forming a source and a drain in the p-channel transistor is easily diffused and a short channel effect is easily induced. By making the width of the sidewall 618 in the p-channel transistor larger than that of the sidewall 618 in the n-channel transistor, boron can be added to the source and the drain at high concentration, and thus the resistance of the source and the drain can be reduced.

In order to further reduce the resistance of the source and the drain, a silicide layer may be formed by silicification of parts of the semiconductor layer 606 and the semiconductor layer 608. The siliciding is performed by placing a metal in contact with the semiconductor layers and causing reaction between the metal and silicon in the semiconductor layers through heat treatment (e.g., such as a GRTA method or an LRTA method). Cobalt silicide or nickel silicide may be used for the silicide layer. In the case where the semiconductor layer 606 and the semiconductor layer 608 are thin, silicide reaction may be made to proceed to the bottom part of the semiconductor layer 606 and the semiconductor layer 608. As examples of a metal material used for the silicification, titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like are given. Further, the silicide layer can also be formed by laser light irradiation or the like.

Through the above process, an n-channel transistor 650 and a p-channel transistor 652 are formed. Note that, although a conductive layer serving as a source electrode or a drain electrode is not formed at the step illustrated in FIG. 8A, a transistor may include the conductive layer serving as a source electrode or a drain electrode.

Figure 8C:
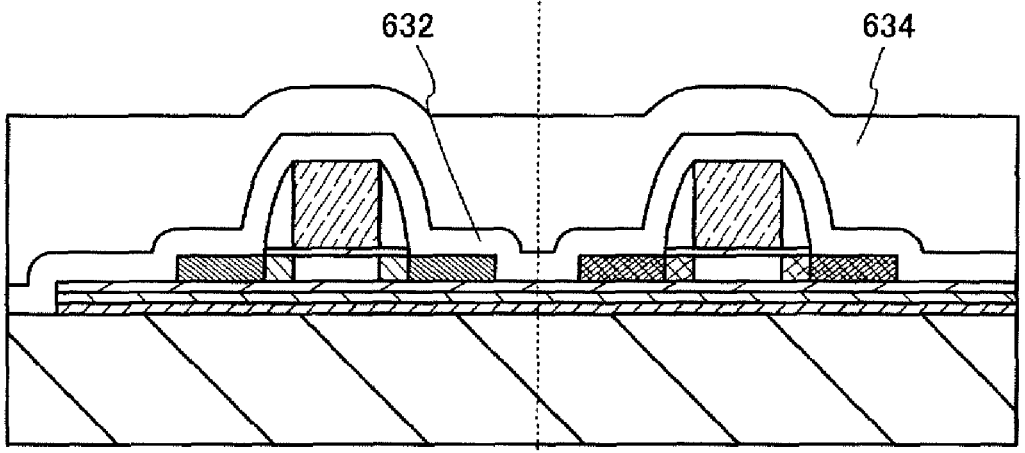

Next, as illustrated in FIG. 8C, an insulating layer 632 is formed so as to cover the n-channel transistor 650 and the p-channel transistor 652. Although the insulating layer 632 is not necessarily provided, the insulating layer 632 can prevent impurities such as an alkali metal and an alkaline earth metal from penetrating the n-channel transistor 650 and the p-channel transistor 652. Specifically, it is preferable that a material such as silicon oxide, silicon nitride, silicon oxynitride, silicon nitride oxide, aluminum nitride, or aluminum oxide be used for forming the insulating layer 632. In this embodiment mode, a silicon nitride oxide film with a thickness of approximately 600 nm is used as the insulating layer 632. In this case, the above-described hydrogenation step may be performed after the formation of the silicon nitride oxide film. Note that, although the insulating layer 632 has a single-layer structure in this embodiment mode, it is obvious that the insulating layer 632 can have a stacked-layer structure. For example, in the case where the insulating layer 632 has a two-layer structure, a stacked-layer structure including a silicon oxynitride film and a silicon nitride oxide film can be employed.

Next, an insulating layer 634 is formed over the insulating layer 632 so as to cover the n-channel transistor 650 and the p-channel transistor 652. The insulating layer 634 may be formed of an organic material having heat resistance such as polyimide, acrylic, benzocyclobutene, polyamide, or epoxy. As well as the above-described organic materials, a low dielectric constant material (a low-k material), a siloxane-based resin, silicon oxide, silicon nitride, silicon oxynitride, silicon nitride oxide, PSG (phosphosilicate glass), BPSG (borophosphosilicate glass), alumina, or the like can be used. Here, the siloxane-based resin corresponds to a resin including a Si—O—Si bond, which is formed using a siloxane-based material as a starting material. The siloxane-based resin may include, as well as hydrogen, at least one of fluorine, an alkyl group, or aromatic hydrocarbon as a substituent. Note that the insulating layer 634 may be formed by stacking a plurality of insulating layers formed of these materials. Further, a surface of the insulating layer 634 may be planarized by a CMP method or the like.

In order to form the insulating layer 634, a CVD method, a sputtering method, a SOG method, spin coating, dipping, spray coating, a droplet discharging method (e.g., an inkjet method, screen printing, offset printing, or the like), a doctor knife, a roll coater, a curtain coater, a knife coater, or the like can be used as appropriate, in accordance with a material used.

Figure 9A:
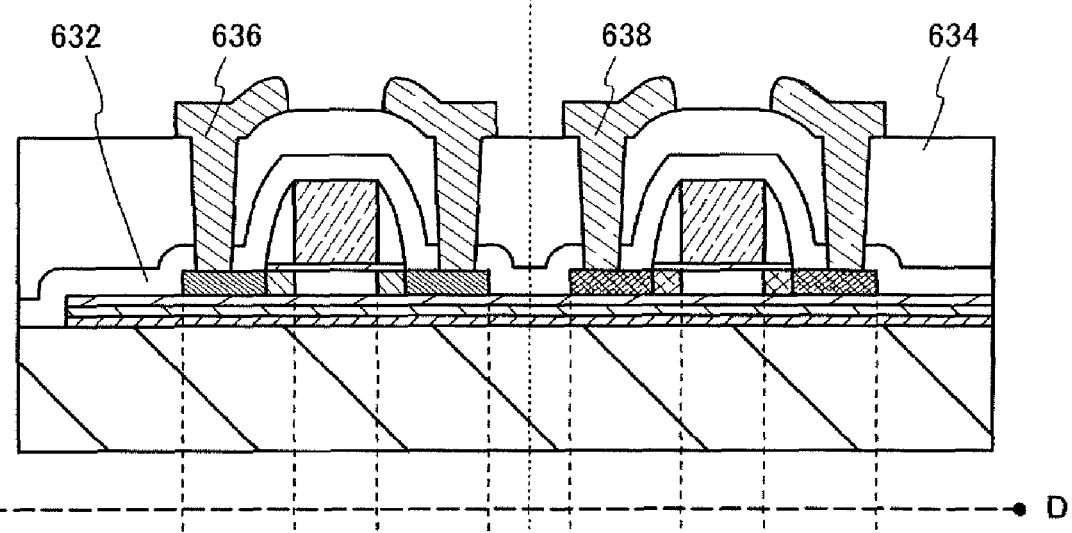
FIGS. 9A and 9B are a plan view and a cross-sectional view of a semiconductor device, respectively.

Next, contact holes are formed in the insulating layer 632 and the insulating layer 634 so as to expose a part of the semiconductor layer 606 and a part of the semiconductor layer 608. And then, conductive layers 636 which are in contact with the semiconductor layer 606 through the contact holes and conductive layers 638 which are in contact with the semiconductor layer 608 through the contact holes are formed as illustrated in FIG. 9A. The conductive layers 636 and the conductive layers 638 each serve as a source electrode or a drain electrode of a transistor. Note that, although a mixed gas of $CHF_3$ and He is used as an etching gas for forming the contact holes in this embodiment mode, the present invention is not limited thereto.

The conductive layers 636 and the conductive layers 638 can be formed by a CVD method, a sputtering method, or the like. Specifically, as the conductive layer 636 and the conductive layer 638, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, an alloy containing the above-described material as its main component or a compound containing the above-described material may be used. Further, the conductive layers 636 and the conductive layers 638 may have a single-layer structure or a stacked-layer structure.

As an example of an alloy containing aluminum as its main component, an alloy containing aluminum as its main component and containing nickel can be given. In addition, an alloy containing aluminum as its main component and containing nickel, and carbon or/and silicon may be given as an example. Since aluminum or aluminum silicon (Al—Si) has a low resistance value and is inexpensive, aluminum or aluminum silicon is suitable for the material for forming the conductive layer 636 and the conductive layer 638. In particular, aluminum silicon is preferable since aluminum silicon can suppress generation of a hillock due to the resist baking when patterning is performed. A material containing aluminum and containing approximately 0.5% Cu, instead of silicon, may be used.

In the case where the conductive layer 636 and the conductive layer 638 have a stacked-layer structure, for example, a stacked-layer structure of a barrier film, an aluminum silicon film, and a barrier film, a stacked-layer structure of a barrier film, an aluminum silicon film, a titanium nitride film, and a barrier film, or the like can be employed. Note that a barrier film is a film formed of titanium, a nitride of titanium, molybdenum, a nitride of molybdenum, or the like. When a conductive layer is formed by interposing an aluminum silicon film between barrier films, generation of a hillock of aluminum or aluminum silicon can be further prevented. In addition, in the case where the barrier film is formed of titanium which is a highly reducible element, even if a thin oxide film is formed over the semiconductor layer 606 and the semiconductor layer 608, the oxide film can be reduced by titanium contained in the barrier film and favorable contact between the conductive layer 636 and the semiconductor layer 606 and between the conductive layer 638 and the semiconductor layer 608 can be obtained. Further, a plurality of barrier films can be stacked. In this case, for example, each of the conductive layer 636 and the conductive layer 638 can be formed to have a stacked-layer structure of five or more layers in which titanium, titanium nitride, aluminum silicon, titanium, and titanium nitride are sequentially stacked from a lower layer side.

Further, as the conductive layer 636 and the conductive layer 638, tungsten silicide, which is formed by a chemical vapor deposition method using a $WF_6$ gas and a $SiH_4$ gas, can be used. In addition, as the conductive layer 636 and the conductive layer 638, tungsten formed by hydrogen reduction of $WF_6$ can be used.

Note that the conductive layer 636 is connected to the high concentration impurity region 620 of the n-channel transistor 650. The conductive layer 638 is connected to the high concentration impurity region 626 of the p-channel transistor 652.

Figure 9B:
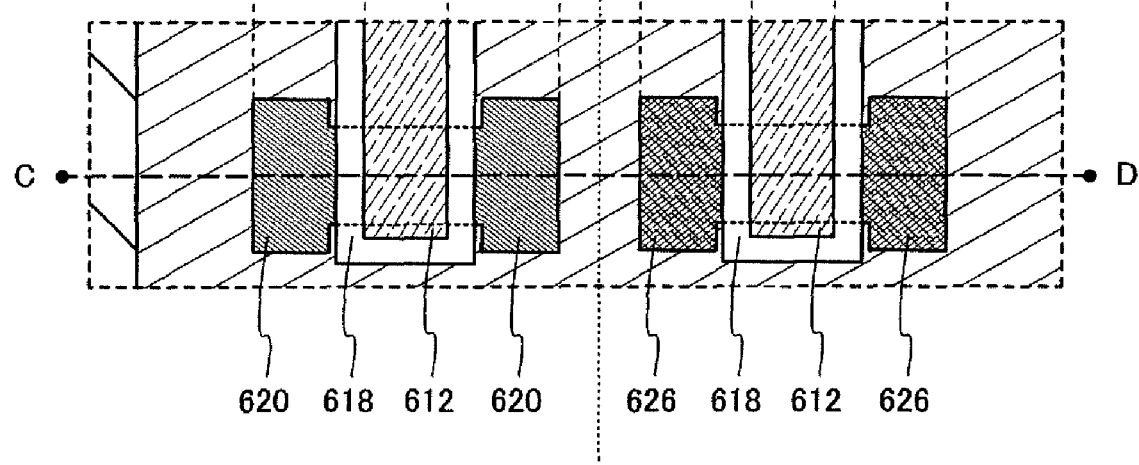

FIG. 9B is a plan view of the n-channel transistor 650 and the p-channel transistor 652, which are illustrated in FIG. 9A.

Here, a cross-sectional taken along a line C-D in FIG. 9B corresponds to FIG. 9A. Note that the conductive layer 636, the conductive layer 638, the insulating layer 632, the insulating layer 634, and the like are omitted in FIG. 9B for simplification.

Note that, although the case where each of the n-channel transistor 650 and the p-channel transistor 652 includes one piece of the electrode 612 serving as a gate electrode is described as an example in this embodiment mode, the present invention is not limited to the structure. The transistor manufactured in the present invention may have a multi-gate structure in which a plurality of electrodes serving as gate electrodes is included and electrically connected to one another.

Through the above process, a semiconductor device having a plurality of transistors can be manufactured.

In the present invention, by employing a large-sized substrate such as a glass substrate as a base substrate, a semiconductor device can have a larger area. Further, by using a large-sized single crystal semiconductor substrate, which is bonded to the base substrate, manufacturing efficiency of the semiconductor substrate is improved and the semiconductor substrate can have a larger area easily. Further, the size of the semiconductor substrate is increased, and thus the productivity of the semiconductor device is improved and the large-sized semiconductor device can be manufactured. In addition, a single crystal semiconductor layer is irradiated with laser light so that the planarity of the single crystal semiconductor layer is improved, and thus defects can be reduced. Furthermore, heat treatment is preformed so that fine defects that cannot be repaired by laser light irradiation can be repaired. Accordingly, characteristics of a semiconductor element can be improved, and an excellent semiconductor device can be provided.

Further, the single crystal semiconductor layer is patterned before laser light irradiation or before heat treatment so that problems of the increase in defects due to thermal stress and the film peeling due to thermal stress can be solved. Thus, the performance and the reliability of the semiconductor element are improved. Further, in the patterning, an insulating layer, which is formed as a base layer of the single crystal semiconductor layer, is left, and thus contaminants (impurity elements and the like) can be prevented from penetrating the semiconductor layer, and whereby the reliability of the semiconductor device can be improved. A region where semiconductor characteristics are deteriorated by heat treatment and laser light irradiation treatment is not used as a semiconductor element, whereby characteristics of the semiconductor element can be improved and an excellent semiconductor device can be provided.

Embodiment Mode 2

This embodiment mode describes an example of a method for manufacturing a semiconductor device of the present invention with reference to FIGS. 11A to 11D, FIGS. 12A to 12C, FIGS. 13A to 13C, and FIGS. 14A and 14B. Note that a liquid crystal display device is given as an example of a semiconductor device in this embodiment mode; however, a semiconductor device of the present invention is not limited to the liquid crystal display device.

First, a semiconductor substrate having a single crystal semiconductor layer, which is manufactured according to the method described in Embodiment Mode 1, is prepared (see FIG. 11A). Here, although a structure in which an insulating layer 1102 including a bonding layer, an insulating layer 1104, and a single crystal semiconductor layer 1106 are provided in this order over a substrate 1100 having an insulating surface (a base substrate) is described, the present invention is not limited thereto. Here, the insulating layer 1104 can be formed using a material such as silicon oxide, silicon nitride, silicon oxynitride, or silicon nitride oxide. Further, the insulating layer 1104 may have a stacked-layer structure. Embodiment Mode 1 can be referred to for the details. Note that the semiconductor substrate corresponds to the semiconductor substrate 142 in Embodiment Mode 1, and the insulating layer 1104 corresponds to the insulating layer 112 in Embodiment Mode 1.

Next, the single crystal semiconductor layer 1106 is patterned into a desired shape to form island-shaped single crystal semiconductor layers. As with Embodiment Mode 1, also in this embodiment mode, the single crystal semiconductor layer 1106 is patterned so as to remove a region of which semiconductor characteristics are deteriorated. Since Embodiment Mode 1 can be referred to for the details, the description is omitted here. As an etching process in patterning, one of dry etching (such as plasma etching) and wet etching can be employed, and in the case where a large-area substrate is processed, plasma etching is suitable. As an etching gas, a fluorine-based gas or a chlorine-based gas such as $CF_4$, $NF_3$, $Cl_2$, or $BCl_3$ is used, and an inert gas such as He or Ar may be appropriately added thereto. Further, in the case of applying an etching process by atmospheric pressure discharge, a local discharge process can be realized, whereby etching can be performed without forming a mask layer over an entire surface of the substrate.

Further, as described in Embodiment Mode 1, the island-shaped single crystal semiconductor layers may be formed so as to have a tapered shape, or end portions of the island-shaped single crystal semiconductor layers may be processed so that end portions thereof have rounded edges. When the island-shaped single crystal semiconductor layers have a tapered shape, they are favorably covered with an insulating layer and a conductive layer in a later step. Thus, generation of break, which is caused by a step, of the insulating layer and the conductive layer can be prevented. Furthermore, when the island-shaped single crystal semiconductor layers have rounded edges, concentration of electric field can be reduced. Thus, generation of malfunction of semiconductor elements can be prevented.

Note that a structure in which the insulating layer 1104 is left without being etched is preferable. The insulating layer 1104 is left so that impurity elements (e.g., an alkali metal such as sodium or potassium; an alkaline earth metal such as magnesium or calcium; or a transition metal such as iron, copper, or nickel) included in the substrate 1100 having an insulating surface can be prevented from penetrating the single crystal semiconductor layer.

After patterning the single crystal semiconductor layer 1106, a p-type impurity such as boron, aluminum, or gallium is preferably added thereto in order to control the threshold voltage. For example, as a p-type impurity, boron can be added at a concentration of greater than or equal to $5 \times 10^{16}$ atoms/cm$^3$ and less than or equal to $1 \times 10^{18}$ atoms/cm$^3$.

It is preferable that the insulating layer 1104 has a barrier layer against impurity elements. The above-described barrier layer may be formed using a material, for example, such as silicon nitride or silicon nitride oxide. In the case where the barrier layer is provided, for example, the barrier layer can have a stacked-layer structure of silicon nitride oxide and silicon oxynitride. Instead of silicon nitride oxide, silicon nitride can be used. Further, instead of silicon oxynitride, silicon oxide can be used.

Next, a gate insulating layer 1108 covering the island-shaped single crystal semiconductor layers is formed (see FIG. 11B). Note that, for convenience, the island-shaped single crystal semiconductor layers which are formed by patterning are referred to as a single crystal semiconductor layer 1110, a single crystal semiconductor layer 1112, and a single crystal semiconductor layer 1114. The gate insulating layer 1108 is formed of an insulating film containing silicon at a thickness of greater than or equal to 10 nm and less than or equal to 150 nm by a plasma CVD method, a sputtering method, or the like. Specifically, the gate insulating layer 1108 may be formed by using a material such as an oxide material of silicon or a nitride material of silicon, typified by silicon nitride, silicon oxide, silicon oxynitride, and silicon nitride oxide. Note that the gate insulating layer 1108 may have a single-layer structure or a stacked-layer structure. Further, a thin silicon oxide film with a thickness of greater than or equal to 1 nm and less than or equal to 100 nm, preferably greater than or equal to 1 nm and less than or equal to 10 nm, or more preferably greater than or equal to 2 nm and less than or equal to 5 nm may be formed between the single crystal semiconductor layers and the gate insulating layer. In order to form a gate insulating film with low leakage current at a low temperature, a rare gas element such as argon may be contained in a reaction gas.

Next, a first conductive film and a second conductive film, which are used as gate electrode layers, are stacked over the gate insulating layer 1108. The first conductive film may be formed with a thickness of approximately greater than or equal to 20 nm and less than or equal to 100 nm, and the second conductive film may be formed with a thickness of approximately greater than or equal to 100 nm and less than or equal to 400 nm. Further, the first conductive film and the second conductive film can be formed by a sputtering method, an evaporation method, a CVD method, or the like. The first conductive film and the second conductive film may be formed of an element selected from tantalum, tungsten, titanium, molybdenum, aluminum, copper, chromium, or neodymium; an alloy material or a compound material including any of these elements as its main component; or the like. Further, as the first conductive film and the second conductive film, a semiconductor film typified by a polycrystalline silicon film doped with an impurity element such as phosphorus; an AgPdCu alloy; or the like may be used. Note that, although the conductive layer having a two-layer structure is described in this embodiment mode, the present invention is not limited thereto. Alternatively, a stacked-layer structure of three or more layers or a single-layer structure may be employed.

And then, a photolithography method is used to form a mask 1116a, a mask 1116b, a mask 1116c, a mask 1116d, and a mask 1116e, which are formed of a resist material. The first conductive film and the second conductive film are processed into desired shapes with the use of the above-described masks, thereby forming a first gate electrode layer 1118a, a first gate electrode layer 1118b, a first gate electrode layer 1118c, a first gate electrode layer 1118d, a first conductive layer 1118e, a conductive layer 1120a, a conductive layer 1120b, a conductive layer 1120c, a conductive layer 1120d, and a conductive layer 1120e (see FIG. 11C).

Here, etching can be performed to form the conductive layers having a desired tapered shape by using an ICP (inductively coupled plasma) etching method with appropriate control of the etching conditions (e.g., the amount of electric energy applied to a coiled electrode layer, the amount of electric energy applied to an electrode layer on the substrate side, the electrode temperature on the substrate side, and the like). A taper angle or the like may also be controlled by the shape of the masks. Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used as an etching gas. In this embodiment mode, the second conductive film is etched using an etching gas containing $CF_4$, $Cl_2$, and $O_2$, and then, the first conductive film is successively etched using an etching gas containing $CF_4$ and $Cl_2$.

Subsequently, the conductive layer 1120a, the conductive layer 1120b, the conductive layer 1120c, the conductive layer 1120d, and the conductive layer 1120e are processed into desired shapes with the use of the mask 1116a, the mask 1116b, the mask 1116c, the mask 1116d, and the mask 1116e. At this time, etching is performed under an etching condition in which the selectivity between the second conductive film, which forms the conductive layers, and the first conductive film, which forms the first gate electrode layers and the first conductive layer, is high. By this etching, a second gate electrode layer 1122a, a second gate electrode layer 1122b, a second gate electrode layer 1122c, a second gate electrode layer 1122d, and a second conductive layer 1122e are formed. In this embodiment mode, the second gate electrode layers and the second conductive layer have tapered shapes, and the taper angles of the second gate electrode layers and the second conductive layer are larger than that of the first gate electrode layers and the first conductive layer. Here, the term "taper angle" means an angle between a bottom surface and a side surface of an object. Thus, in the case where the taper angle is 90 degrees, the conductive layer has a perpendicular side surface to the bottom surface of the conductive layer. Each taper angle has a degree of less than 90 degrees so that coverage with stacked films is improved, and thus defects can be reduced. Note that, in this embodiment mode, $Cl_2$, $SF_6$, and $O_2$ are used as an etching gas for forming the second gate electrode layers and the second conductive layer.

Through the above process, a gate electrode layer 1124a and a gate electrode layer 1124b can be formed in a peripheral driver circuit region 1180, and a gate electrode layer 1124c, a gate electrode layer 1124d, and a conductive layer 1124e can be formed in a pixel region 1182 (see FIG. 11D). Note that the mask 1116a, the mask 1116b, the mask 1116c, the mask 1116d, and the mask 1116e are removed after the above-described steps.

And then, an impurity element imparting n-type conductivity is added with the gate electrode layer 1124a, the gate electrode layer 1124b, the gate electrode layer 1124c, and the gate electrode layer 1124d used as masks in order to form a first n-type impurity region 1126a, a first n-type impurity region 1126b, a first n-type impurity region 1128a, a first n-type impurity region 1128b, a first n-type impurity region 1130a, a first n-type impurity region 1130b, and a first n-type impurity region 1130c (see FIG. 12A). In this embodiment mode, doping is performed using phosphine ($PH_3$) as a doping gas containing an impurity element. Here, phosphorus (P) that is an impurity element imparting n-type conductivity is added to the first n-type impurity regions at a concentration of approximately greater than or equal to $1 \times 10^{16}$ atoms/$cm^3$ and less than or equal to $5 \times 10^{19}$ atoms/$cm^3$.

Next, a mask 1132a, a mask 1132b, and a mask 1132c, which cover the single crystal semiconductor layer 1110 and parts of the single crystal semiconductor layer 1114, are formed. And then, an impurity element imparting n-type conductivity is added with the mask 1132a, the mask 1132b, the mask 1132c, and the second gate electrode layer 1122b used as masks. As a result, a second n-type impurity region 1134a, a second n-type impurity region 1134b, a third n-type impurity region 1136a, a third n-type impurity region 1136b, a second n-type impurity region 1140a, a second n-type impurity region 1140b, a second n-type impurity region 1140c, a third n-type impurity region 1142a, a third n-type impurity region 1142b, a third n-type impurity region 1142c, and a third n-type impurity region 1142d are formed. In this embodiment mode, doping is performed using phosphine ($PH_3$) as a doping gas containing an impurity element. Here, phosphorus (P) that is an impurity element imparting n-type conductivity is added to the second n-type impurity regions at a concentration of approximately greater than or equal to $1 \times 10^{17}$ atoms/$cm^3$ and less than or equal to $1 \times 10^{21}$ atoms/$cm^3$. An impurity element imparting n-type conductivity is added to the third n-type impurity region 1136a and the third n-type impurity region 1136b at the same or substantially the same concentration as or at a slightly higher concentration than that of the third n-type impurity region 1142a, the third n-type impurity region 1142b, the third n-type impurity region 1142c, and the third n-type impurity region 1142d. In addition, a channel formation region 1138, a channel formation region 1144a, and a channel formation region 1144b are formed (see FIG. 12B).

The second n-type impurity regions are high-concentration impurity regions and serve as sources or drains. On the other hand, the third n-type impurity regions are low-concentration impurity regions and serve as so-called LDD (lightly doped drain) regions. The third n-type impurity region 1136a and the third n-type impurity region 1136b are formed so as to be overlapped with the first gate electrode layer 1118b. Accordingly, an electric field in the vicinity of a source or a drain can be relieved, and deterioration of on-state current due to hot carriers can be prevented. On the other hand, the third n-type impurity region 1142a, the third n-type impurity region 1142b, the third n-type impurity region 1142c, and the third n-type impurity region 1142d are not overlapped with the gate electrode layer 1124c and the gate electrode layer 1124d. Thus, an effect of reducing off-state current can be obtained.

Next, the mask 1132a, the mask 1132b, and the mask 1132c are removed, and a mask 1146a and a mask 1146b, which respectively cover the single crystal semiconductor layer 1112 and the single crystal semiconductor layer 1114, are formed. An impurity element imparting p-type conductivity is added with the mask 1146a, the mask 1146b, and the gate electrode layer 1124a used as masks. Accordingly, a first p-type impurity region 1148a, a first p-type impurity region 1148b, a second p-type impurity region 1150a, and a second p-type impurity region 1150b are formed. In this embodiment mode, doping is performed using diborane ($B_2H_6$) as a doping gas containing an impurity element. Here, boron (B) which is an impurity element imparting p-type conductivity is added to the first p-type impurity regions and the second p-type impurity regions at a concentration of approximately greater than or equal to $1 \times 10^{18}$ atoms/$cm^3$ and less than or equal to $5 \times 10^{21}$ atoms/$cm^3$. In addition, a channel formation region 1152 is formed (see FIG. 12C).

The first p-type impurity regions are high-concentration impurity regions and serve as sources or drains. On the other hand, the second p-type impurity regions are low-concentration impurity regions and serve as so-called LDD (lightly doped drain) regions.

After that, the mask 1146a and the mask 1146b are removed. After the masks are removed, an insulating film may be formed so as to cover the side surfaces of the gate electrode layers. The insulating film can be formed by a plasma CVD method or a low-pressure CVD (LPCVD) method. Heat treatment, intense light irradiation, laser light irradiation, or the like may be performed to activate the impurity elements.

Subsequently, an interlayer insulating layer which covers the gate electrode layers and the gate insulating layer is formed. In this embodiment mode, an insulating film 1154 and an insulating film 1156 are stacked to form a stacked-layer structure (see FIG. 13A). A silicon nitride oxide film is formed as the insulating film 1154 with a thickness of 100 nm and a silicon oxynitride film is formed as the insulating film 1156 with a thickness of 900 nm. Although a two-layer structure is employed in this embodiment mode, a single-layer structure or a stacked-layer structure of three or more layers may be employed. In this embodiment mode, the insulating film 1154 and the insulating film 1156 are successively formed by a plasma CVD method without being exposed to the atmosphere. Note that the materials of the insulating film 1154 and the insulating film 1156 are not limited to the above-described materials.

The insulating film 1154 and the insulating film 1156 can be formed of a material selected from silicon oxide, silicon nitride, aluminum oxide, aluminum nitride, aluminum oxynitride, aluminum nitride oxide containing more nitrogen than oxygen, diamond-like carbon (DLC), carbon-containing nitrogen, and other substances containing inorganic insulating materials. Further, a siloxane resin may be used as well. Note that a siloxane resin is a resin including a Si—O—Si bond. Siloxane has a skeleton structure formed by a bond of silicon (Si) and oxygen (O). As a substituent of siloxane, an organic group containing at least hydrogen (e.g., an alkyl group or an aryl group) is used. A fluoro group may be included in the organic group. Further, an organic group containing at least hydrogen and a fluoro group may also be used as substituents. Alternatively, an organic insulating material such as polyimide, acrylic polymer, polyamide, polyimide amide, benzocyclobutene-based material, or polysilazane can be used.

Next, contact holes (openings) which reach the single crystal semiconductor layers and the gate electrode layers are formed in the insulating film 1154, the insulating film 1156, and the gate insulating layer 1108 with the use of a mask formed of a resist material. Etching may be performed once or multiple times depending on the selectivity between materials to be used. In this embodiment mode, first etching is performed to remove the insulating film 1156 under a condition in which the selectivity between the insulating film 1156, which is a silicon oxynitride film, and the insulating film 1154, which is a silicon nitride oxide film, and the gate insulating layer 1108. Then, second etching is performed to remove the insulating film 1154 and the gate insulating layer 1108, and the openings which reach sources and drains are formed.

After that, a conductive film is formed so as to cover the openings, and the conductive film is etched. Accordingly, a source electrode layer or a drain electrode layer 1158a, a source electrode layer or a drain electrode layer 1158b, a source electrode layer or a drain electrode layer 1160a, a source electrode layer or a drain electrode layer 1160b, a source electrode layer or a drain electrode layer 1162a, and a source electrode layer or a drain electrode layer 1162b, each of which is electrically connected to a part of a source region or a drain region are formed. For each source electrode layer or drain electrode layer, one or a plurality of elements selected from aluminum, tantalum, titanium, molybdenum, tungsten, neodymium, chromium, nickel, platinum, gold, silver, copper, magnesium, scandium, cobalt, zinc, niobium, silicon, phosphorus, boron, arsenic, gallium, indium, tin, and the like; a compound or alloy material which contains one of the above-described elements as its main component (e.g., indium tin oxide (ITO), indium zinc oxide (IZO), indium tin oxide which contains silicon oxide (ITSO), zinc oxide (ZnO), aluminum-neodymium (Al—Nd), magnesium-silver (Mg—Ag), or the like); a substance which is a combination of any of these compounds; or the like can be used. In addition, silicide (e.g., aluminum-silicon, molybdenum-silicon, or nickel silicide), a compound which contains nitrogen (e.g., titanium nitride, tantalum nitride, or molybdenum nitride), silicon (Si) doped with an impurity element such as phosphorus (P), or the like may be used.

Figure 13A:
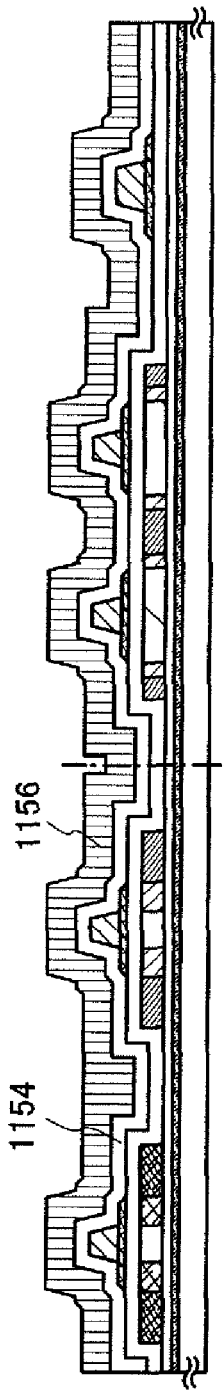
FIGS. 13A to 13C illustrate a manufacturing process of a semiconductor device.
Figure 13B:
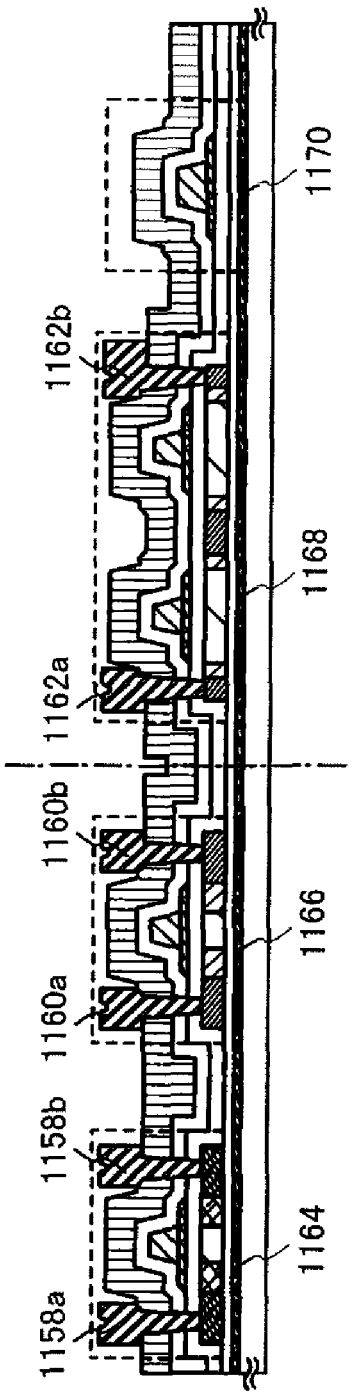

Through the above process, a p-channel thin film transistor 1164 and an n-channel thin film transistor 1166 are formed in the peripheral driver circuit region 1180, and an n-channel thin film transistor 1168 and a capacitor wiring 1170 are formed in the pixel region 1182 (see FIG. 13B).

Next, an insulating film 1172 is formed as a second interlayer insulating layer. The insulating film 1172 can be formed of a material selected from silicon oxide, silicon nitride, silicon oxynitride, silicon nitride oxide, aluminum oxide, aluminum nitride, aluminum oxynitride, aluminum nitride oxide containing more nitrogen than oxygen, diamond-like carbon (DLC), carbon-containing nitrogen, phosphosilicate glass (PSG), borophosphosilicate glass (BPSG), polysilazane, and other substances containing inorganic insulating materials. Further, a siloxane resin may be used as well. An organic insulating material such as polyimide, acrylic polymer, polyamide, polyimide amide, or benzocyclobutene-based material can be used.

Figure 13C:
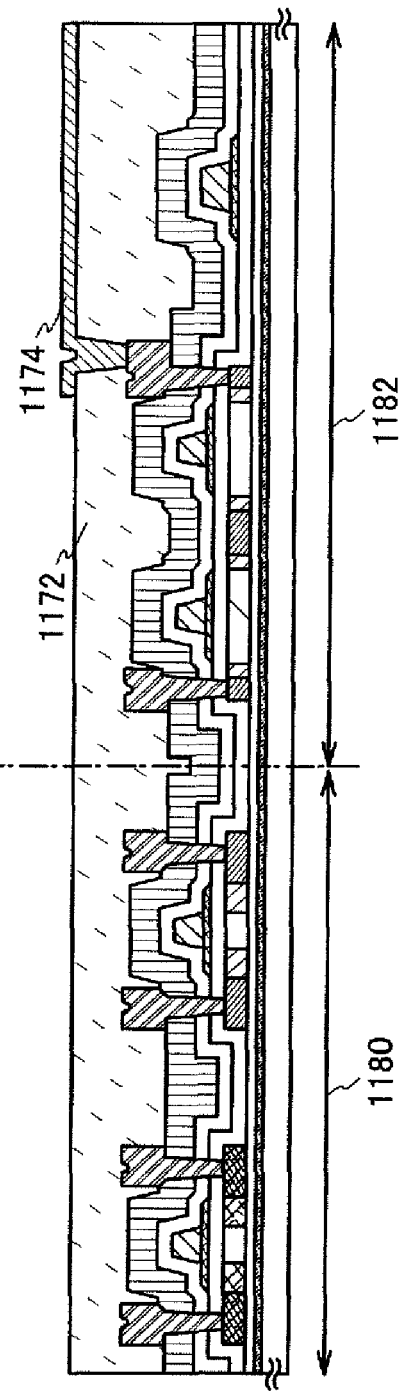

Next, a contact hole is formed in the insulating film 1172 of the pixel region 1182 to form a pixel electrode layer 1174 (see FIG. 13C). The pixel electrode layer 1174 can be formed of indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, or metal such as tungsten, molybdenum, zirconium, hafnium, vanadium, niobium, tantalum, chromium, cobalt, nickel, titanium, platinum, aluminum, copper, or silver, or an alloy or a metal nitride of these metals.

A conductive composition containing a conductive high molecular compound (also referred to as a "conductive polymer") can also be used for the pixel electrode layer 1174. A thin film of the conductive composition preferably has a sheet resistance of less than or equal to 10000 Ω/square. In the case where a thin film of the conductive composition is formed as a pixel electrode layer having a light-transmitting property, light transmittance is preferably greater than or equal to 70% at a wavelength of 550 nm. In addition, the resistance of the conductive high molecular compound which is contained in the conductive composition is preferably less than or equal to 0.1 Ω·cm.

As the above-described conductive high molecular compound, a so-called π electron conjugated conductive high molecular compound can be used. For example, polyaniline and a derivative thereof, polypyrrole and a derivative thereof, polythiophene and a derivative thereof, a copolymer of these materials, and the like can be given.

Specific examples of the conjugated conductive high molecular compound are given as follows: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxythiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The above-described conductive high molecular compounds may be used alone, or an organic resin may be added thereto in order to adjust the characteristic of the films.

Further, in order to adjust the electrical conductivity of the conductive composition, the conductive composition may be doped with an acceptor dopant or a donor dopant to change the oxidation-reduction potential of the conjugated conductive high molecular compound.

The above-described conductive composition can be dissolved in water or an organic solvent (e.g., an alcohol-based solvent, a ketone-based solvent, an ester-based solvent, a hydrocarbon-based solvent, an aromatic-based solvent, or the like) and a thin film which serves as the pixel electrode layer 1174 can be formed by a coating method, a droplet discharging method (also referred to as an "ink-jet method"), a printing method, or the like.

Next, an insulating layer 1402 referred to as an orientation film is formed to cover the pixel electrode layer 1174 and the insulating film 1172 (see FIG. 14B). The insulating layer 1402 can be formed by a screen printing method or an offset printing method. Note that FIGS. 14A and 14B illustrate a plan view and a cross-sectional view of a semiconductor device, respectively, and FIG. 14A is a plan view of a semiconductor device and FIG. 14B is a cross-sectional view taken along a line E-F in FIG. 14A. In the semiconductor device, an external terminal connection region 1176, a sealing region 1178, the peripheral driver circuit region 1180, and the pixel region 1182 are provided.

After the insulating layer 1402 is formed, rubbing treatment is performed. An insulating layer 1406 serving as an orientation film can also be formed in a manner similar to that of the insulating layer 1402.

After that, a counter substrate 1400 and the substrate 1100 having an insulating surface are attached to each other with a sealant 1414 and a spacer 1416 interposed therebetween, and the space is provided with a liquid crystal layer 1404. The counter substrate 1400 is provided with the insulating layer 1406 serving as an orientation film, a conductive layer 1408 serving as a counter electrode, a coloring layer 1414 serving as a color filter layer 1410, a polarizer 1412 (also referred to as a "polarizing plate"), and the like. Note that the substrate 1100 having an insulating surface is also provided with a polarizer 1418 (a polarizing plate); however, the present invention is not limited thereto. For example, a polarizer may be provided on one side in a reflective liquid crystal display device.

Subsequently, an FPC 1424 is connected to a terminal electrode layer 1420 which is electrically connected to the pixel region, through an anisotropic conductive layer 1422. The FPC 1424 has a function of transmitting a signal from the outside. Through the above process, the liquid crystal display device can be manufactured.

In this embodiment mode, a liquid crystal display device using a semiconductor substrate, which is manufactured according to the method described in Embodiment Mode 1, is manufactured. Thus, characteristics of a semiconductor element (e.g., a transistor in a pixel region) which controls switching of liquid crystal can be improved. Further, the operating speed of a semiconductor element in a driver circuit region can be improved. Thus, the present invention greatly improves display characteristics of a liquid crystal display device. In addition, since the reliability of the semiconductor element is improved, the reliability of a liquid crystal display device is also improved.

Note that, although a method for manufacturing a liquid crystal display device is described in this embodiment mode, the present invention is not limited thereto. This embodiment mode can be implemented in combination with Embodiment Mode 1, as appropriate.

Embodiment Mode 3

This embodiment mode describes a semiconductor device having a light-emitting element according to the present invention (an electroluminescence display device). Note that, since Embodiment Mode 2 can be referred to for the details, the description of a method for manufacturing transistors, which are used for a peripheral circuit region, a pixel region, and the like, is omitted here.

Note that, in a semiconductor device having a light-emitting element, any one of bottom emission, top emission, and dual emission can be employed. Although this embodiment mode describes a semiconductor device employing bottom emission with reference to FIGS. 15A and 15B, the present invention is not limited thereto.

The semiconductor device in FIGS. 15A and 15B emits light to the lower side (in the direction of an arrow illustrated in the drawing). Here, FIG. 15A is a plan view illustrating a semiconductor device, and FIG. 15B is a cross-sectional view taken along a line G-H in FIG. 15A. In FIGS. 15A and 15B, the semiconductor device includes an external terminal connection region 1530, a sealing region 1532, a driver circuit region 1534, and a pixel region 1536.

The semiconductor device illustrated in FIGS. 15A and 15B includes an element substrate 1500, a thin film transistor 1550, a thin film transistor 1552, a thin film transistor 1554, a thin film transistor 1556, a light-emitting element 1560, an insulating layer 1568, a filler 1570, a sealant 1572, a wiring layer 1574, a terminal electrode layer 1576, an anisotropic conductive layer 1578, an FPC 1580, a sealing substrate 1590, and the like. Note that the light-emitting element 1560 includes a first electrode layer 1562, a light-emitting layer 1564, and a second electrode layer 1566.

As the first electrode layer 1562, a light-transmitting conductive material is used so that light emitted from the light-emitting layer 1564 can be transmitted. On the other hand, as the second electrode layer 1566, a conductive material which can reflect light emitted from the light-emitting layer 1564 is used.

As the first electrode layer 1562, indium oxide containing tungsten oxide, indium zinc oxide containing tungsten oxide, indium oxide containing titanium oxide, indium tin oxide containing titanium oxide, or the like can be used. Of course, indium tin oxide (ITO), indium zinc oxide (IZO), indium tin oxide to which silicon oxide is added (ITSO), or the like can be used.

A conductive composition containing a conducive high molecular compound (also referred to as a "conductive polymer") can also be used as the first electrode layer 1562. Note that, since Embodiment Mode 2 can be referred to for the details, the description is omitted here.

As the second electrode layer 1566, a conductive film formed of titanium, tungsten, nickel, gold, platinum, silver, copper, tantalum, molybdenum, aluminum, magnesium, calcium, lithium, or an alloy thereof, or the like may be used. It is preferable that a substance having high reflectance in a visible light range be used, and an aluminum film is used in this embodiment mode.

In the case of applying each of top emission and dual emission, an electrode layer may be appropriately designed. Specifically, in the case of top emission, the first electrode layer 1562 is formed of a reflective material, and the second electrode layer 1566 is formed of a light-transmitting material. In the case of dual emission, the first electrode layer 1562 and the second electrode layer 1566 may be formed of a light-transmitting material. Note that, in the case of bottom emission and top emission, a structure may be employed in which one electrode layer is formed of a light-transmitting material and the other electrode layer is formed to have a stacked-layer structure of a light-transmitting material and a light-reflecting material. The material that can be used for the electrode layers is the same as the material in the case of bottom emission; thus, the description is omitted here.

Note that, in general, even a material, such as a metal, which is considered not to have a light-transmitting property can transmit light when formed to a small thickness (approximately greater than or equal to 5 nm and less than or equal to 30 nm). Accordingly, an electrode layer which transmits light can also be formed using the above-described light-reflecting material.

Further, a color filter (a coloring layer) may be formed over the sealing substrate 1590. The color filter (a coloring layer) can be formed by an evaporation method or a droplet discharging method. Furthermore, a color conversion layer may be used.

In this embodiment mode, an electroluminescence display device is manufactured according to the method described in Embodiment Mode 1 or the like. Thus, characteristics of a semiconductor element (e.g., a transistor in a pixel region) which controls light emission of an electroluminescence display device can be improved. Further, the operating speed of the semiconductor element in a driver circuit region can be improved. Thus, the present invention greatly improves display characteristics of an electroluminescence display device. In addition, since the reliability of the semiconductor element is improved, the reliability of an electroluminescence display device is also improved.

Note that, although this embodiment mode describes an electroluminescence display device, the present invention is not limited thereto. This embodiment mode can be implemented in combination with Embodiment Mode 1 or 2, as appropriate.

Embodiment Mode 4

Figure 16:
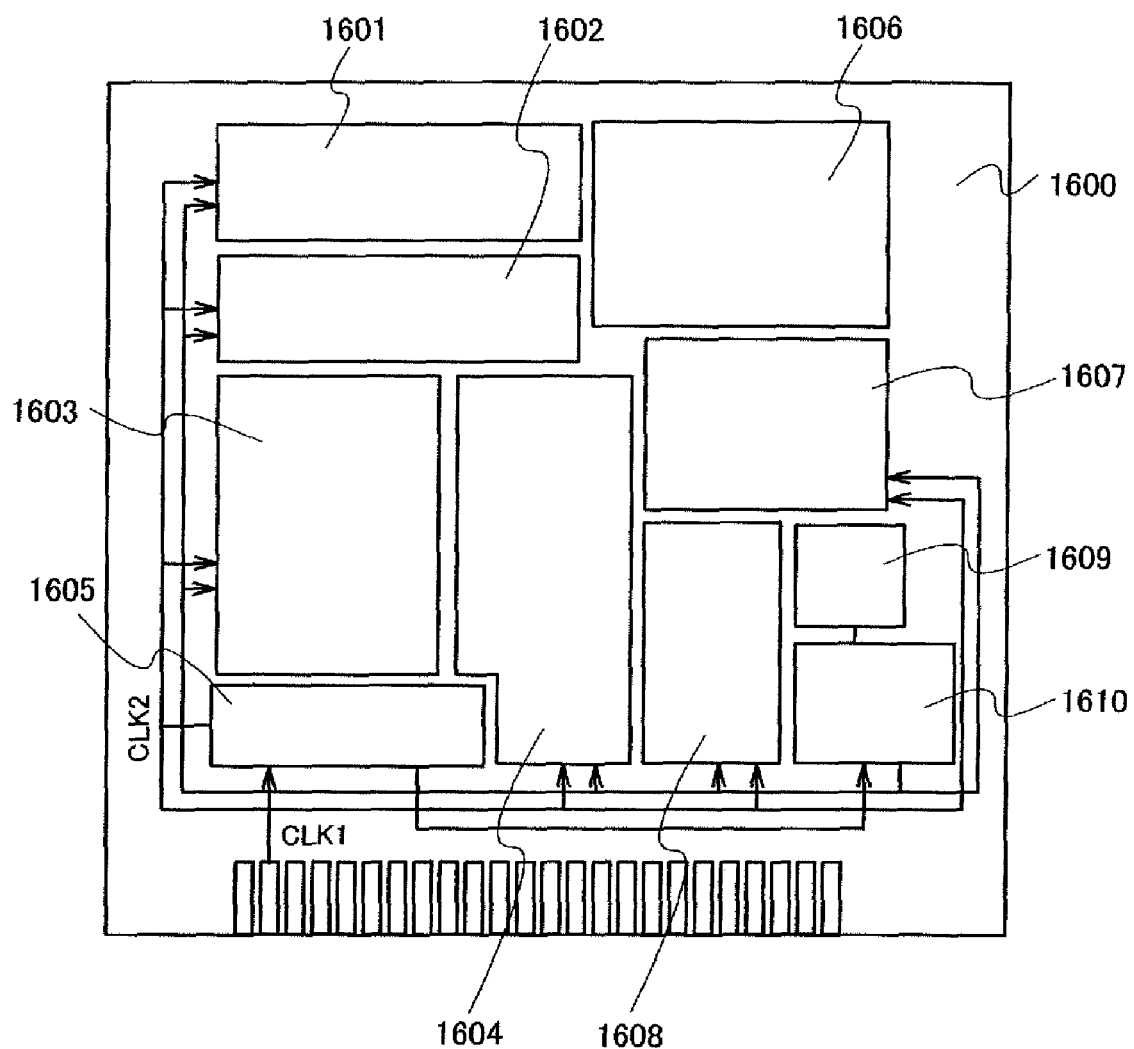
FIG. 16 illustrates a structure of a semiconductor device.
Figure 17:
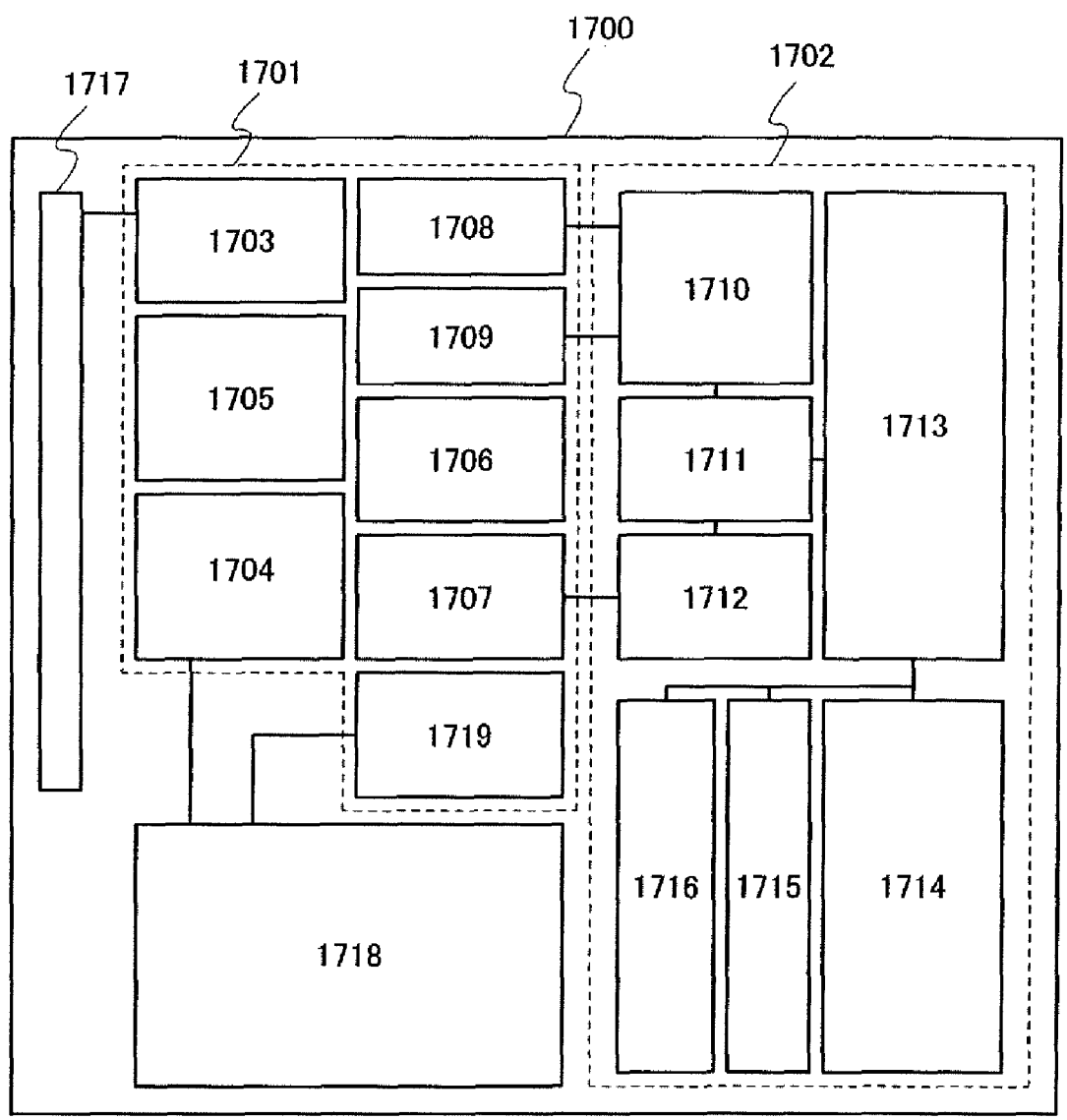
FIG. 17 illustrates a structure of a semiconductor device.

This embodiment mode describes another example of a semiconductor device according to the present invention with reference to FIG. 16 and FIG. 17. Note that, although a microprocessor and an electronic tag are given as examples in this embodiment mode, a semiconductor device of the present invention is not limited thereto.

FIG. 16 illustrates an example of a structure of a microprocessor of the present invention. A microprocessor 1600 in FIG. 16 is manufactured using a semiconductor substrate of the present invention. The microprocessor 1600 includes an arithmetic logic unit (ALU) 1601, an ALU controller 1602, an instruction decoder 1603, an interrupt controller 1604, a timing controller 1605, a register 1606, a register controller 1607, a bus interface (Bus I/F) 1608, a read only memory (ROM) 1609, and a ROM interface (ROM I/F) 1610.

An instruction input to the microprocessor 1600 via the bus interface 1608 is input to the instruction decoder 1603 and decoded therein, and then, input to the ALU controller 1602, the interrupt controller 1604, the register controller 1607, and the timing controller 1605. The ALU controller 1602, the interrupt controller 1604, the register controller 1607, and the timing controller 1605 perform various controls based on the decoded instruction. Specifically, the ALU controller 1602 generates signals for controlling the operation of the ALU 1601. The interrupt controller 1604 judges an interrupt request from an external input and output device or a peripheral circuit based on its priority or the like, and processes the request while a program of the microprocessor 1600 is executed. The register controller 1607 generates an address of the register 1606, and reads and writes data from and to the register 1606 in accordance with the state of the microprocessor 1600. The timing controller 1605 generates signals for controlling timing of operation of the ALU 1601, the ALU controller 1602, the instruction decoder 1603, the interrupt controller 1604, and the register controller 1607. For example, the timing controller 1605 is provided with an internal clock generator for generating an internal clock signal CLK2 based on a reference clock signal CLK1, and supplies the internal clock signal CLK2 to the above-described circuits. Note that a structure of the microprocessor 1600 illustrated in FIG. 16 is just an example, and the structure can be changed, as appropriate, depending on usage.

In this embodiment mode, a microprocessor is manufactured using the semiconductor substrate described in Embodiment Mode 1 or the like. Accordingly, the operating speed of a semiconductor element is improved, which contributes to the improvement in the performance of the microprocessor. In addition, since the reliability of the semiconductor element is improved, the reliability of the microprocessor is also improved.

Next, an example of a semiconductor device having an arithmetic function that is capable of contactless data transmission and reception is described with reference to FIG. 17. FIG. 17 illustrates an example of a wireless tag which transmits and receives signals to and from an external device by wireless communication. Note that the wireless tag of the present invention includes a central processing unit (CPU), so to speak, a miniaturized computer. A wireless tag 1700 has an analog circuit portion 1701 and a digital circuit portion 1702. The analog circuit portion 1701 includes a resonant circuit 1703 including a resonant capacitor, a rectifier circuit 1704, a constant voltage circuit 1705, a reset circuit 1706, an oscillation circuit 1707, a demodulation circuit 1708, a modulation circuit 1709, and a power management circuit 1719. The digital circuit portion 1702 includes an RF interface 1710, a control register 1711, a clock controller 1712, a CPU interface 1713, a CPU 1714, a RAM 1715, and a ROM 1716.

The operation of the wireless tag 1700 having such a structure is roughly described below. When an antenna 1717 receives a signal from the outside, the resonant circuit 1703 generates an induced electromotive force based on the signal. The induced electromotive force is stored in a capacitor portion 1718 through the rectifier circuit 1704. The capacitor portion 1718 is preferably formed using a capacitor such as a ceramic capacitor or an electric double layer capacitor. The capacitor portion 1718 may be formed over the same substrate as the wireless tag 1700 or may be attached, as another component, to a substrate having an insulating surface that partially constitutes the wireless tag 1700.

The reset circuit 1706 generates a signal for resetting and initializing the digital circuit portion 1702. For example, a signal which rises with a delay to a rise of the power source voltage is generated as a reset signal. The oscillator circuit 1707 changes the frequency and the duty ratio of a clock signal depending on a control signal generated by the constant voltage circuit 1705. The demodulator circuit 1708 formed using a low-pass filter binarizes the amplitude of, for example, a received amplitude-modulated (ASK) signal. The modulator circuit 1709 varies the amplitude of an amplitude-modulated (ASK) transmission signal and transmits the signal. The modulation circuit 1709 changes the resonance point of the resonant circuit 1703, thereby changing the amplitude of communication signals. The clock controller 1712 generates a control signal for changing the frequency and duty ratio of a clock signal in accordance with the power supply voltage or a consumption current of the CPU 1714. The power supply voltage is managed by the power management circuit 1719.

A signal that is inputted to the wireless tag 1700 from the antenna 1717 is demodulated by the demodulation circuit 1708, and then divided into a control command, data, and the like by the RF interface 1710. The control command is stored in the control register 1711. The control command includes reading instruction of data stored in the ROM 1716, writing instruction of data to the RAM 1715, an arithmetic instruction to the CPU 1714, and the like. The CPU 1714 accesses the ROM 1716, the RAM 1715, and the control register 1711 via the CPU interface 1713. The CPU interface 1713 has a function of generating an access signal for accessing one of the ROM 1716, the RAM 1715, and the control register 1711 in accordance with the address requested by the CPU 1714.

As an arithmetic method of the CPU 1714, a method may be employed in which the ROM 1716 stores an operating system (OS) and a program is read and executed at the time of starting operation. Alternatively, a method may be employed in which an arithmetic circuit is provided and an arithmetic process is conducted using hardware. In a method in which both hardware and software are used, a method can be employed in which part of process is conducted in an arithmetic circuit dedicated to arithmetic and the other part of the arithmetic process is conducted by the CPU 1714 using a program.

In this embodiment mode, a wireless tag is manufactured using the semiconductor substrate described in Embodiment Mode 1 or the like. Accordingly, the operating speed of a semiconductor element is improved, which contributes to the improvement in the performance of the wireless tag. In addition, since the reliability of the semiconductor element is improved, the reliability of the wireless tag is also improved.

Note that this embodiment mode can be implemented in combination with any of Embodiment Modes 1 to 3, as appropriate.

Embodiment Mode 5

This embodiment mode describes electronic devices each using a semiconductor device of the present invention, particularly a display device, with reference to FIGS. 18A to 18H and FIGS. 19A to 19C.

Examples of electronic devices each manufactured using a semiconductor device of the present invention (particularly, a display device) include: cameras such as video cameras and digital cameras, goggle type displays (head mounted displays), navigation systems, audio reproducing devices (car audio components and the like), computers, game machines, portable information terminals (mobile computers, cellular phones, portable game machines, electronic book readers, and the like), image reproducing devices each provided with a recording medium (specifically, devices each provided with a display device that can reproduce a recording medium such as a digital versatile disc (DVD) and can display the image), and the like.

Figure 18A:
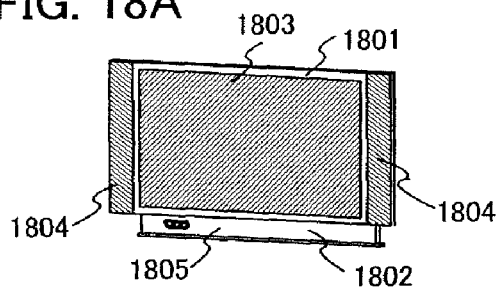
FIGS. 18A to 18H illustrate electronic devices using a semiconductor device.

FIG. 18A illustrates a television set or a monitor of a personal computer. The television set or monitor of a personal computer includes a housing 1801, a support 1802, a display portion 1803, speaker portions 1804, video input terminals 1805, and the like. A semiconductor device of the present invention is used in the display portion 1803. According to the present invention, a high-reliability, high-performance television set or monitor of a personal computer can be provided.

Figure 18B:
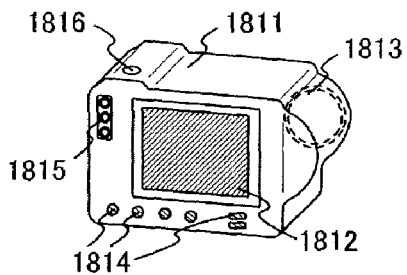

FIG. 18B illustrates a digital camera. An image receiving portion 1813 is provided on the front side of a main body 1811. A shutter button 1816 is provided on the upper side of the main body 1811. A display portion 1812, operation keys 1814, and an external connection port 1815 are provided on the back side of the main body 1811. A semiconductor device of the present invention is used in the display portion 1812. According the present invention, a high-reliability, high-performance digital camera can be provided.

Figure 18C:
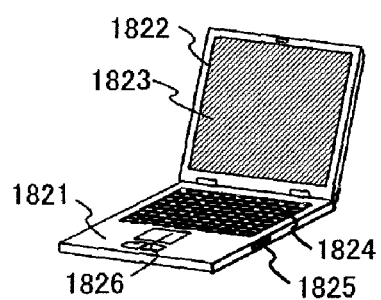

FIG. 18C illustrates a notebook personal computer. In a main body 1821, a keyboard 1824, an external connection port 1825, and a pointing device 1826 are provided. In addition, a housing 1822 including a display portion 1823 is attached to the main body 1821. A semiconductor device of the present invention is used in the display portion 1823. According to the present invention, a high-reliability, high-performance notebook personal computer can be provided.

Figure 18D:
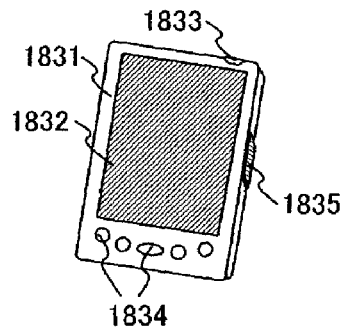

FIG. 18D illustrates a mobile computer, which includes a main body 1831, a display portion 1832, a switch 1833, operation keys 1834, an infrared port 1835, and the like. An active-matrix display device is provided in the display portion 1832. A semiconductor device of the present invention is used in the display portion 1832. According to the present invention, a high-reliability, high-performance mobile computer can be provided.

Figure 18E:
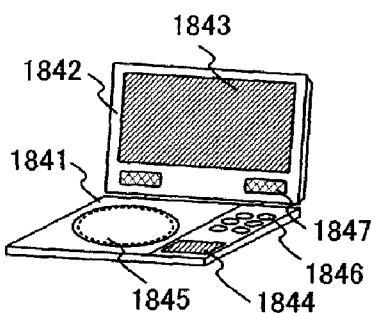

FIG. 18E illustrates an image reproducing device. In a main body 1841, a display portion 1844, a recording media reading portion 1845, and operation keys 1846 are provided. In addition, a housing 1842 including speaker portions 1847 and a display portion 1843 is attached to the main body 1841. A semiconductor device of the present invention is used in each of the display portions 1843 and 1844. According to the present invention, a high-reliability, high-performance image reproducing device can be provided.

Figure 18F:
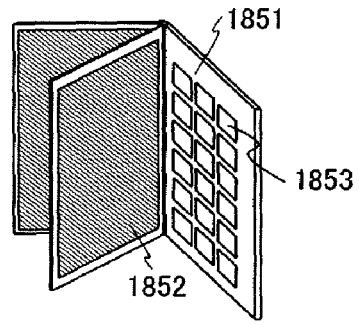

FIG. 18F illustrates an electronic book reader. A main body 1851 is provided with operation keys 1853. A plurality of display portions 1852 is attached to the main body 1851. A semiconductor device of the present invention is used in the display portions 1852. According to the present invention, a high-reliability, high-performance electronic book reader can be provided.

Figure 18G:
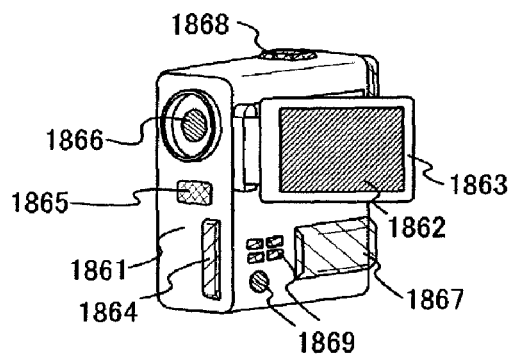

FIG. 18G illustrates a video camera. A main body 1861 is provided with an external connection port 1864, a remote control receiving portion 1865, an image receiving portion 1866, a battery 1867, an audio input portion 1868, and operation keys 1869. In addition, a housing 1863 including a display portion 1062 is attached to the main body 1861. A semiconductor device of the present invention is used in the display portion 1862. According to the present invention, a high-reliability, high-performance video camera can be provided.

Figure 18H:
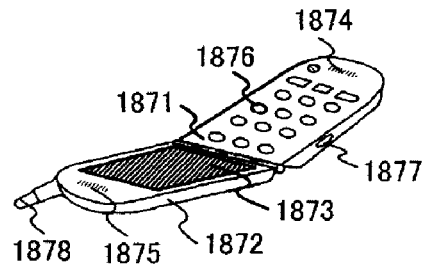

FIG. 18H illustrates a cellular phone, which includes a main body 1871, a housing 1872, a display portion 1873, an audio input portion 1874, an audio output portion 1875, operation keys 1876, an external connection port 1877, an antenna 1878, and the like. A semiconductor device of the present invention is used in the display portion 1873. According to the present invention, a high-reliability, high-performance cellular phone can be provided.

Figure 19A:
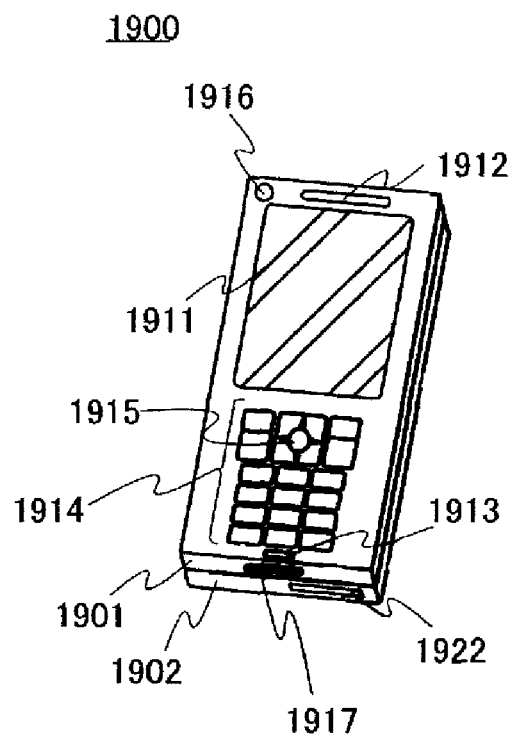
FIGS. 19A to 19C illustrate electronic devices using a semiconductor device.
Figure 19B:
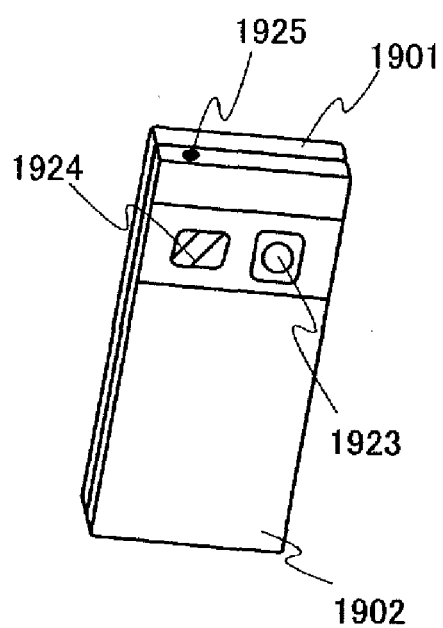
Figure 19C:
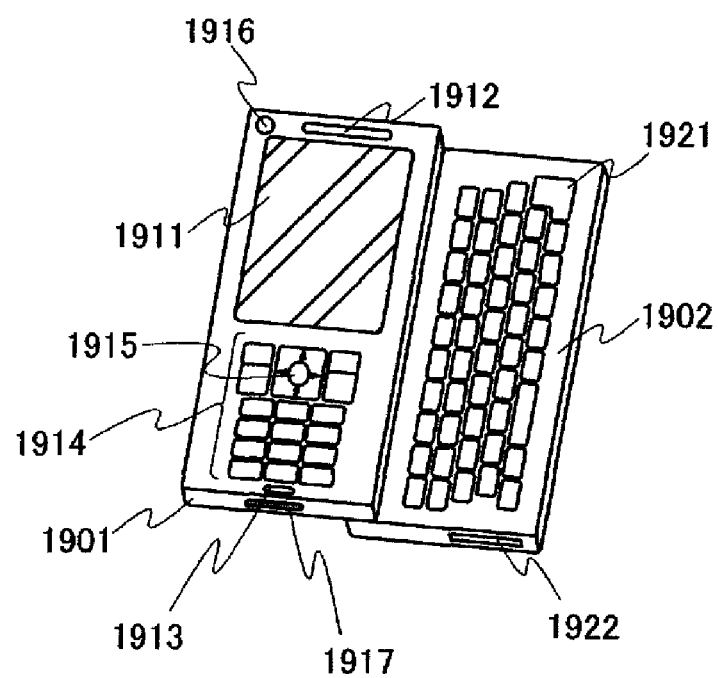
Figure 20A:
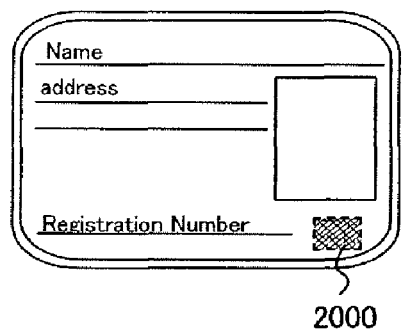
FIGS. 20A to 20F illustrate uses of a semiconductor device.
Figure 20B:
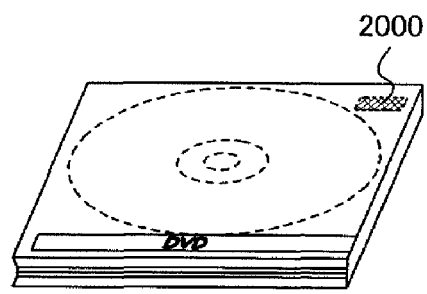
Figure 20C:
Figure 20D:
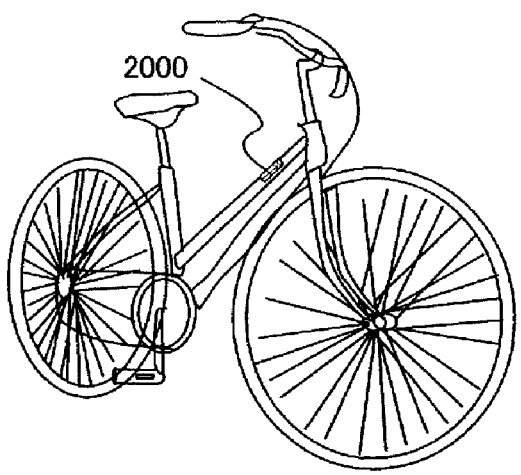
Figure 20E:
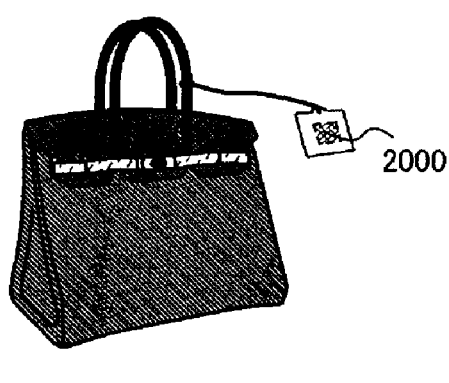
Figure 20F:
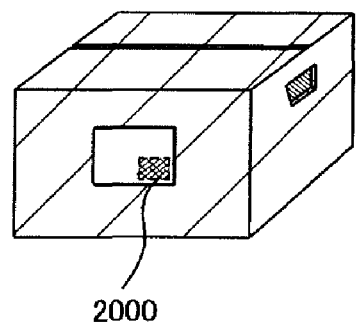

FIGS. 19A to 19C illustrate an example of a structure of a portable electronic device 1900 which has both a function as a phone and a function as an information terminal. Here, FIG. 19A illustrates a front view; FIG. 19B, a rear view; and FIG. 19C, a development view. The portable electronic device 1900 is an electronic device that is a so-called smartphone which functions as both a phone and an information terminal and is also capable of conducting a variety of data processing besides voice calls.

The portable electronic device 1900 has housings 1901 and 1902. The housing 1901 includes a display portion 1911, a speaker 1912, a microphone 1913, operation keys 1914, a pointing device 1915, a camera lens 1916, an external connection terminal 1917, and the like. The housing 1902 includes a keyboard 1921, an external memory slot 1922, a camera lens 1923, a light 924, an earphone terminal 1925, and the like. In addition, an antenna is incorporated in the housing 1901. In addition to the above components, the portable electronic device 1900 may incorporate a contactless IC chip, a small size memory device, or the like.

A semiconductor device of the present invention is incorporated in the display portion 1911. Note that images displayed in the display portion 1911 (and their display directions) are variously changed according to use modes of the portable electronic device 1900. In addition, because the camera lens 1916 is provided in the same plane as the display portion 1911; thus, voice calls together with visual images (so-called videophone calls) are possible. Note that the speaker 1912 and the microphone 1913 can be used for not only voice calls but also audio recording, playback, and the like. The display portion 1911 is used as a viewfinder when a still image and a moving image are taken using the camera lens 1923 (and the light 1924). The operation keys 1914 are used for operation of incoming and outgoing calls, simple information input for e-mail or the like, screen scrolling, cursor motion, and the like.

The housings 1901 and 1902 which are put together to be lapped with each other (FIG. 19A) are developed by sliding as illustrated in FIG. 19C. In the developed state, the portable electronic device 1900 can be used as an information terminal. In this state, smooth operation can be conducted by using the keyboard 1921 or the pointing device 1915. The external connection terminal 1917 can be connected to an AC adaptor and various types of cables such as a USB cable, which enables charging and data communication with a computer or the like. Furthermore, a recording medium can be inserted into the external memory slot 1922 so that a large amount of data can be stored and can be moved. In addition to the above-described functions, the portable electronic device may also have a wireless communication function using electromagnetic waves such as infrared waves, a television reception function, or the like. According to the present invention, a high-reliability, high-performance portable electronic device can be provided.

As described above, the present invention covers a very wide range of applications and can be used in electronic devices in various fields. Note that this embodiment mode can be implemented in combination with any of Embodiment Modes 1 to 4, as appropriate.

Embodiment Mode 6

This embodiment mode describes applications of a semiconductor device of the present invention, particularly a wireless tag, with reference to FIGS. 20A to 20F.

According to the present invention, a semiconductor device which functions as a wireless tag can be formed. Wireless tags can be used in a wide variety of applications and may be used by being mounted on objects such as bills, coins, securities, bearer bonds, certificates (driver's licenses, resident cards, and the like, see FIG. 20A), packaging containers (wrapping paper, bottles, and the like, see FIG. 20C), recording media (DVD software, video tapes, and the like, see FIG. 20B), vehicles (bicycles and the like, see FIG. 20D), personal belongings (bags, glasses, and the like), products such as foods, plants, clothes, lifestyle goods, and electronic devices, objects such as tags for luggage (see FIGS. 20E and 20F), and the like. Note that the wireless tags are denoted by reference numeral 2000 in FIGS. 20A to 20F.

Note that electronic devices refer to, for example, a liquid crystal display device, an EL display device, a television device (also simply referred to as a TV, a TV set, or a television receiver), a cellular phone, the objects shown in Embodiment Mode 5, and the like. The semiconductor device may also be used for animals, human bodies, and the like.

The wireless tag is fixed to an object by being attached to a surface of the object or by being embedded in the object. For example, the wireless tag may be embedded in paper of a book or embedded in an organic resin of a packaging container or the like. Counterfeits can be prevented by providing wireless tags on bills, coins, securities, bearer bonds, certificates, and the like. Furthermore, by providing wireless tags on packaging containers, recording media, personal belongings, foods, clothes, lifestyle goods, electronic devices, and the like, the efficiency of inspection systems, rental systems and the like can be improved. A wireless tag that can be formed according to the present invention has high reliability as well as being inexpensive and can thus be applied to various objects.

When a wireless tag that can be formed according to the present invention is applied to a management system or a distribution system of objects, the system can have higher functionality. For example, information which is stored in a wireless tag provided on a tag is read by a reader/writer provided near a conveyor belt, then information about a distribution process or a delivery destination is read out, and inspection of products or distribution of luggage can be easily carried out.

As described above, the present invention covers a very wide range of applications and can be used for various objects. Note that this embodiment mode can be implemented in combination with any of Embodiment Modes 1 to 5, as appropriate.

This application is based on Japanese Patent Application serial no. 2007-286977 filed with Japan Patent Office on Nov. 5, 2007, the entire contents of which are hereby incorporated by reference.

What is claimed is:

1. A method for manufacturing a semiconductor device, comprising the steps of:
    irradiating a surface of a single crystal semiconductor substrate with ions in order to form a damaged region in the single crystal semiconductor substrate;
    forming a first insulating layer over the surface of the single crystal semiconductor substrate;
    forming a second insulating layer over a surface of the first insulating layer;
    bonding the second insulating layer to a substrate having an insulating surface;
    separating the single crystal semiconductor substrate at the damaged region in order to form a single crystal semiconductor layer over the substrate having the insulating surface;

patterning the single crystal semiconductor layer to be separated into a plurality of single crystal semiconductor regions;

performing at least one of laser light irradiation treatment and heat treatment on the plurality of single crystal semiconductor regions; and patterning semiconductor layers in the plurality of single crystal semiconductor regions.

2. A method for manufacturing a semiconductor device, comprising the steps of:

irradiating surfaces of a plurality of single crystal semiconductor substrates with ions in order to form damaged regions in the plurality of single crystal semiconductor substrates;

forming first insulating layers over the surfaces of the plurality of single crystal semiconductor substrates;

forming second insulating layers over surfaces of the first insulating layers;

bonding the second insulating layers to a substrate having an insulating surface;

separating the plurality of single crystal semiconductor substrates at the damaged regions in order to form a plurality of single crystal semiconductor layers over the substrate having the insulating surface;

patterning each of the plurality of single crystal semiconductor layers to be separated into a plurality of single crystal semiconductor regions;

performing at least one of laser light irradiation treatment and heat treatment on the plurality of single crystal semiconductor regions; and patterning semiconductor layers in the plurality of single crystal semiconductor regions.

3. The method for manufacturing the semiconductor device according to claim 1, wherein the first insulating layer contains any one of silicon oxide, silicon nitride, silicon oxynitride, or silicon nitride oxide.

4. The method for manufacturing the semiconductor device according to claim 2, wherein the first insulating layers contain any one of silicon oxide, silicon nitride, silicon oxynitride, or silicon nitride oxide.

5. The method for manufacturing the semiconductor device according to claim 1, wherein the first insulating layer has a stacked-layer structure.

6. The method for manufacturing the semiconductor device according to claim 2, wherein the first insulating layers have a stacked-layer structure.

7. The method for manufacturing the semiconductor device according to claim 1, wherein the first insulating layer has a stacked-layer structure of silicon oxide or silicon oxynitride and silicon nitride or silicon nitride oxide, which are stacked in this order over the surface of the single crystal semiconductor substrate.

8. The method for manufacturing the semiconductor device according to claim 2, wherein the first insulating layers have a stacked-layer structure of silicon oxide or silicon oxynitride and silicon nitride or silicon nitride oxide, which are stacked in this order over the surfaces of the plurality of single crystal semiconductor substrates.

9. The method for manufacturing the semiconductor device according to claim 1, wherein the single crystal semiconductor layer is patterned so as to leave the first insulating layer.

10. The method for manufacturing the semiconductor device according to claim 2, wherein the plurality of single crystal semiconductor layers are patterned so as to leave the first insulating layers.

11. The method for manufacturing the semiconductor device according to claim 1, wherein the second insulating layer is formed using an organosilane gas by a chemical vapor deposition method.

12. The method for manufacturing the semiconductor device according to claim 2, wherein the second insulating layers are formed using an organosilane gas by a chemical vapor deposition method.

13. The method for manufacturing the semiconductor device according to claim 1, wherein the single crystal semiconductor layer has a rectangular shape, and length of a diagonal line of the single crystal semiconductor layer is 250 mm or longer.

14. The method for manufacturing the semiconductor device according to claim 2, wherein each of the plurality of single crystal semiconductor layers has a rectangular shape, and length of a diagonal line of each of the plurality of single crystal semiconductor layers is 250 mm or longer.

15. The method for manufacturing the semiconductor device according to claim 1, wherein a semiconductor element is formed using a central portion of the plurality of single crystal semiconductor regions.

16. The method for manufacturing the semiconductor device according to claim 2, wherein a semiconductor element is formed using a central portion of the plurality of single crystal semiconductor regions.

17. The method for manufacturing the semiconductor device according to claim 1, wherein both of the laser light irradiation treatment and the heat treatment are performed on the plurality of single crystal semiconductor regions.

18. The method for manufacturing the semiconductor device according to claim 2, wherein both of the laser light irradiation treatment and the heat treatment are performed on the plurality of single crystal semiconductor regions.

19. The method for manufacturing the semiconductor device according to claim 2, wherein the surfaces of the plurality of single crystal semiconductor substrates are irradiated with ions at the same time.

20. The method for manufacturing the semiconductor device according to claim 2, wherein the surfaces of the plurality of single crystal semiconductor substrates are irradiated with ions in series.

* * * * *